US011915961B2

(12) United States Patent
Ichinose et al.

(10) Patent No.: US 11,915,961 B2
(45) Date of Patent: Feb. 27, 2024

(54) MEASUREMENT SYSTEM, SUBSTRATE PROCESSING SYSTEM, AND DEVICE MANUFACTURING METHOD

(71) Applicant: NIKON CORPORATION, Tokyo (JP)

(72) Inventors: Go Ichinose, Fukaya (JP); Tomonori Dosho, Saitama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 17/869,912

(22) Filed: Jul. 21, 2022

(65) Prior Publication Data
US 2022/0367224 A1 Nov. 17, 2022

Related U.S. Application Data

(63) Continuation of application No. 17/323,180, filed on May 18, 2021, now Pat. No. 11,430,684, which is a
(Continued)

(30) Foreign Application Priority Data

Sep. 30, 2016 (JP) ................. 2016-192810

(51) Int. Cl.
*H01L 21/68* (2006.01)
*G01B 21/00* (2006.01)
(Continued)

(52) U.S. Cl.
CPC .......... *H01L 21/682* (2013.01); *G01B 11/272* (2013.01); *G01B 21/00* (2013.01);
(Continued)

(58) Field of Classification Search
CPC ..... H01L 21/682; H01L 21/68; G01B 11/272; G03F 1/42; G03F 7/20; G03F 7/26; G03F 7/70775; G03F 9/00; G03F 9/7084
See application file for complete search history.

(56) References Cited

U.S. PATENT DOCUMENTS 5,448,332 A 9/1995 Sakakibara et al.
5,532,091 A 7/1996 Mizutani
(Continued)

FOREIGN PATENT DOCUMENTS

EP 1420298 A2 5/2004
JP H04-002450 A 1/1992
(Continued)

OTHER PUBLICATIONS

Nov. 14, 2017 International Search Report issued in International Patent Application No. PCT/JP2017/033954.
(Continued)

*Primary Examiner* — Hung V Nguyen
(74) *Attorney, Agent, or Firm* — Oliff PLC

(57) ABSTRACT

A measurement system used in a manufacturing line for micro-devices includes: a plurality of measurement devices in which each device performs measurement processing on a substrate; and a carrying system to perform delivery of a substrate with the plurality of measurement devices. The plurality of measurement devices includes a first measurement device that acquires position information on a plurality of marks formed on a substrate, and a second measurement device that acquires position information on a plurality of marks formed on a substrate. Position information on a plurality of marks formed on a substrate can be acquired under a setting of a first predetermined condition in the first measurement device, and position information on a plurality of marks formed on another substrate can be acquired under a setting of a second predetermined condition different from the first predetermined condition in the second measurement device.

22 Claims, 15 Drawing Sheets

Related U.S. Application Data continuation of application No. 16/868,952, filed on May 7, 2020, now Pat. No. 11,107,718, which is a continuation of application No. 16/363,057, filed on Mar. 25, 2019, now Pat. No. 10,777,441, which is a continuation of application No. PCT/JP2017/033954, filed on Sep. 20, 2017.

(51) Int. Cl.

| | | |
|---|---|---|
| *G01B 11/27* | (2006.01) | |
| *G03F 1/42* | (2012.01) | |
| *G03F 7/20* | (2006.01) | |
| *G03F 7/26* | (2006.01) | |
| *G03F 7/00* | (2006.01) | |
| *G03F 9/00* | (2006.01) | |

(52) U.S. Cl.
CPC .................. *G03F 1/42* (2013.01); *G03F 7/20* (2013.01); *G03F 7/26* (2013.01); *G03F 7/70775* (2013.01); *G03F 9/00* (2013.01); *G03F 9/7084* (2013.01); *H01L 21/68* (2013.01)

(56) References Cited

U.S. PATENT DOCUMENTS

| | | | |
|---|---|---|---|
| 5,684,565 A | 11/1997 | Oshida et al. | |
| 5,969,441 A | 10/1999 | Loopstra et al. | |
| 6,208,407 B1 | 3/2001 | Loopstra | |
| 6,341,007 B1 | 1/2002 | Nishi et al. | |
| 6,590,634 B1 | 7/2003 | Nishi et al. | |
| 6,838,686 B2 * | 1/2005 | Kataoka | G03F 9/7088 250/548 |
| 6,952,253 B2 | 10/2005 | Lof et al. | |
| 7,256,869 B2 * | 8/2007 | Nishi | G03F 7/70216 430/22 |
| 9,158,212 B2 | 10/2015 | Ishigo | |
| 10,777,441 B2 * | 9/2020 | Ichinose | G03F 7/70775 |
| 2002/0034831 A1 | 3/2002 | Kataoka | |
| 2002/0042664 A1 | 4/2002 | Kikuchi | |
| 2002/0176074 A1 | 11/2002 | Hasan | |
| 2003/0025890 A1 | 2/2003 | Nishinaga | |
| 2004/0174510 A1 | 9/2004 | Kataoka | |
| 2005/0280791 A1 | 12/2005 | Nagasaka et al. | |
| 2006/0077388 A1 | 4/2006 | Koga | |
| 2006/0209414 A1 | 9/2006 | Van Santen et al. | |
| 2006/0231206 A1 | 10/2006 | Nagasaka et al. | |
| 2006/0261288 A1 | 11/2006 | Van Santen | |
| 2007/0142950 A1 | 6/2007 | Okita | |
| 2007/0159632 A1 | 7/2007 | Shibazaki | |
| 2007/0288121 A1 | 12/2007 | Shibazaki | |
| 2008/0013073 A1 | 1/2008 | Kobayashi et al. | |
| 2008/0286667 A1 | 11/2008 | Okita | |
| 2008/0286885 A1 | 11/2008 | Izikson et al. | |
| 2009/0009741 A1 | 1/2009 | Okita et al. | |
| 2009/0153825 A1 | 6/2009 | Edart et al. | |
| 2009/0225331 A1 | 9/2009 | Van Haren | |
| 2010/0073652 A1 | 3/2010 | Shibazaki | |
| 2010/0073653 A1 | 3/2010 | Shibazaki | |
| 2011/0290136 A1 * | 12/2011 | Koga | G03F 9/7003 101/481 |
| 2012/0208301 A1 | 8/2012 | Izikson et al. | |
| 2013/0044307 A1 | 2/2013 | Shibazaki | |
| 2013/0222777 A1 | 8/2013 | Ishigo | |
| 2014/0063480 A1 | 3/2014 | Wu et al. | |
| 2014/0132940 A1 | 5/2014 | Yoda | |
| 2016/0190020 A1 | 6/2016 | Kimura et al. | |
| 2017/0068171 A1 | 3/2017 | Moest et al. | |
| 2018/0039190 A1 | 2/2018 | Shibazaki | |
| 2018/0039191 A1 | 2/2018 | Shibazaki | |

FOREIGN PATENT DOCUMENTS

| | | |
|---|---|---|
| JP | H05-217843 A | 8/1993 |
| JP | H07-086126 A | 3/1995 |
| JP | H09-007924 A | 1/1997 |
| JP | 2002-170770 A | 6/2002 |
| JP | 2006-245030 A | 9/2006 |
| JP | 2007-287878 A | 11/2007 |
| JP | 2009-147317 A | 7/2009 |
| JP | 2009-212518 A | 9/2009 |
| JP | 2011-060882 A | 3/2011 |
| JP | 2012-99850 A | 5/2012 |
| JP | 2012-227551 A | 11/2012 |
| JP | 2013-153167 A | 8/2013 |
| JP | 2013-175500 A | 9/2013 |
| JP | 2013-239721 A | 11/2013 |
| JP | 2015-535615 A | 12/2015 |
| KR | 2008-0096520 A | 10/2008 |
| KR | 2008-0104131 A | 12/2008 |
| TW | 200739678 A | 10/2007 |
| WO | 2004/023214 A1 | 3/2004 |
| WO | 2004/055803 A1 | 7/2004 |
| WO | 2004/057590 A1 | 7/2004 |
| WO | 2005/104196 A1 | 11/2005 |
| WO | 2007/049704 A1 | 5/2007 |
| WO | 2007/086316 A1 | 8/2007 |
| WO | 2007/102484 A1 | 9/2007 |
| WO | 2015/022739 A1 | 2/2015 |
| WO | 2015/185166 A1 | 12/2015 |
| WO | 2016/136689 A1 | 9/2016 |
| WO | 2016/136691 A1 | 9/2016 |

OTHER PUBLICATIONS

Nov. 14, 2017 Written Opinion of the International Searching Authority issued in International Application No. PCT/JP2017/033954.
Jul. 25, 2019 Office Action Issued in U.S. Appl. No. 16/363,057.
Feb. 14, 2020 Office Action issued in Japanese Patent Application No. 2018-542468.
Apr. 30, 2020 Extended Search Report issued in European Patent Application No. 17855900.1.
May 22, 2020 Notice of Allowance issued in U.S. Appl. No. 16/363,057.
Jan. 17, 2020 Notice of Allowance issued in U.S. Appl. No. 16/363,057.
Mar. 13, 2020 Corrected Notice of Allowability issued in U.S. Appl. No. 16/363,057.
Sep. 21, 2020 Office Action issued in Korean Patent Application No. 10-2019-7010449.
Aug. 13, 2020 Office Action issued in Chinese Patent Application No. 201780060674.2.
Sep. 14, 2020 Office Action issued in Japanese Patent Application No. 2018-542468.
Oct. 8, 2020 Office Action Issued in U.S. Appl. No. 16/868,952.
Feb. 17, 2021 Notice of Allowance Issued in U.S. Appl. No. 16/868,952.
May 27, 2021 Office Action issued in Korean Patent Application No. 10-2021-7010337.
Jun. 30, 2021 Office Action issued in Taiwanese Patent Application No. 106132892.
Oct. 7, 2021, Office Aciton issued in U.S. Appl. No. 17/323,180.
Oct. 19, 2021 Office Action issued in Japanese Patent Application No. 2020-199604.
Mar. 3, 2022 Decision of Rejection issued in Korean Patent Application No. 10-2021-7010337.
Apr. 22, 2022 Notice of Allowance Issued in U.S. Appl. No. 17/323,180.
Apr. 19, 2022 Decision of Dismissal of Amendment issued in Japanese Patent Application No. 2020-199604.
May 11, 2022 Corrected Notice of Allowability issued in U.S. Appl. No. 17/323,180.
May 19, 2022 Corrected Notice of Allowability issued in U.S. Appl. No. 17/323,180.

(56) References Cited

OTHER PUBLICATIONS

Jun. 28, 2022 Corrected Notice of Allowability issued in U.S. Appl. No. 17/323,180.
May 16, 2023 Office Action issued in Japanese Patent Application No. 2022-115029.
Dec. 26, 2022 Office Action issued in Korean Patent Application No. 10-2022-7025858.
May 30, 2023 Office Action issued in Japanese Patent Application No. 2020-199604.
Mar. 31, 2023 Office Action issued in Chinese Patent Application No. 202110890873.4.
Mar. 31, 2023 Office Action issued in Chinese Patent Application No. 202110890872.X.
Aug. 15, 2023 Office Action issued in Japanese Patent Application No. 2022-115029.
Nov. 10, 2023 Office Action issued in Taiwanese Patent Application No. 111143429.
Nov. 13, 2023 Office Action issued in Chinese Patent Application No. 202110890873.4.
Dec. 19, 2023 Office Action issued in Japanese Patent Application No. 2022-115029.

\* cited by examiner

MEASUREMENT SYSTEM, SUBSTRATE PROCESSING SYSTEM, AND DEVICE MANUFACTURING METHOD

CROSS-REFERENCE TO RELATED APPLICATIONS

This is a continuation of U.S. patent application Ser. No. 17/323,180 filed May 18, 2021 (now U.S. Pat. No. 11,430,684), which in turn is a continuation of U.S. patent application Ser. No. 16/868,952 filed May 7, 2020 (now U.S. Pat. No. 11,107,718), which is a continuation of U.S. patent application Ser. No. 16/363,057 filed Mar. 25, 2019 (now U.S. Pat. No. 10,777,441), which is a continuation of International Application No. PCT/JP2017/033954, with an international filing date of Sep. 20, 2017, claiming priority to Japanese Application No. 2016-192810 filed Sep. 30, 2016. The disclosure of each of the applications identified above is incorporated by reference herein in its entirety.

BACKGROUND OF THE INVENTION

Field of the Invention

The present invention relates to a measurement system, a substrate processing system, and a device manufacturing method, and more particularly to a measurement system used in a micro-device manufacturing line, a substrate processing system that includes the measurement system, and a device manufacturing method that uses an exposure apparatus structuring a part of the substrate processing system.

Description of the Background Art

In a lithography process, when overlay exposure is performed on the wafer, in the wafer that has gone through processing processes such as resist coating, developing, etching, CVD (Chemical Vapor Deposition), and CMP (Chemical Mechanical Polishing), distortion may occur due to the processes in the arrangement of the shot areas on the previous layer, and the distortion nay cause a decrease in the overlay accuracy. Taking such a point into consideration, recent exposure apparatuses have a grid correction function and the like for correcting not only a primary component of wafer deformation, but also a nonlinear component and the like of the shot arrangement that occurs due to the processes (for example, refer to U.S. Patent Application Publication No. 2002/0042664).

However, requirements on overlay accuracy is becoming more and more severe due to finer integrated circuits, therefore, to perform correction with higher accuracy, it is essential to increase the number of sample shot areas in wafer alignment (EGA), that is, to increase the number of marks that should be detected. Therefore, in recent years, a twin-stage type exposure apparatus came to be employed which allows an increase in the number of sample shot areas while maintaining throughput.

SUMMARY OF THE INVENTION

According to a first aspect, there is provided a measurement system used in a manufacturing line for micro-devices, comprising: a plurality of measurement devices in which each device performs measurement processing on a substrate; and a carrying system to perform delivery of a substrate with the plurality of measurement devices, wherein the plurality of measurement devices includes a first measurement device that acquires position information on a plurality of marks formed on a substrate, and a second measurement device that acquires position information on a plurality of marks formed on a substrate, and position information on a plurality of marks formed on a substrate can be acquired under a setting of a first condition in the first measurement device, and position information on a plurality of marks formed on another substrate can be acquired under a setting of the first condition in the second measurement device.

According to a second aspect, there is provided a measurement system used in manufacturing line for micro-devices, comprising: in a plurality of measurement devices in which each device performs measurement processing on a substrate; and a carrying system to perform delivery of a substrate with the plurality of measurement devices, wherein the plurality of measurement devices includes a first measurement device that acquires position information on a plurality of marks formed on a substrate, and a second measurement device that acquires position information on a plurality of marks formed on a substrate, and position information on a plurality of marks formed on a substrate can be acquired in the first measurement device, and position information on a plurality of marks formed on another substrate included in the same lot as the substrate can be acquired in the second measurement device.

According to a third aspect, there is provided a measurement system used in a manufacturing line for micro-devices, comprising: a plurality of measurement devices in which each device performs measurement processing on a substrate; and a carrying system to perform delivery of a substrate with the plurality of measurement devices, wherein the plurality of measurement devices includes a first measurement device that acquires position information on a plurality of marks formed on a substrate, and a second measurement device that acquires position information on a plurality of marks formed on a substrate, and position Information on a plurality of marks formed on a substrate can be acquired under a setting of a first predetermined condition in the first measurement device, and position information on a plurality of marks formed on another substrate can be acquired under a setting of a second predetermined condition different from the first predetermined condition in the second measurement device.

According to a fourth aspect, there is provided a measurement system used in a manufacturing line for micro-devices, comprising: a first measurement device that performs measurement processing on a substrate; and a second measurement device that performs measurement processing on a substrate, wherein measurement processing with the first measurement device and measurement processing with the second measurement device can be concurrently executed.

According to a fifth aspect, there is provided a measurement system used in a manufacturing line for micro-devices, comprising: a first measurement device that performs measurement processing on a substrate; and a second measurement device that performs measurement processing on a substrate, wherein a substrate that has been measured and processed by one of the first measurement device and the second measurement device can be measured and processed by the other of the first measurement device and the second measurement device.

According to a sixth aspect, there is provided a substrate processing system, comprising: the measurement system according to any one of the first aspect to the fifth aspect; and an exposure apparatus that has a substrate stage on which the substrate that has completed measurement of position information of the plurality of marks by at least one of the first measurement device and the second measurement device of the measurement system is mounted, and to the substrate mounted on the substrate stage, performs alignment measurement in which position information of a part of marks selected from a plurality of marks on the substrate is acquired and exposure in which the substrate is exposed with an energy beam.

According to a seventh aspect, there is provided a substrate processing system, comprising: a first measurement system and a second measurement system structured from the measurement system according to any one of the first aspect to the fifth aspect; and an exposure apparatus that has a substrate stage on which the substrate that has completed measurement of position information on the plurality of marks by at least one of the first measurement device and the second measurement device of the measurement system is mounted, and to the substrate mounted on the substrate stage, performs alignment measurement in which position information on a part of marks selected from a plurality of marks on the substrate is acquired and exposure in which the substrate is exposed with an energy beam, wherein acquiring position information on the plurality of marks performed in at least one of the first measurement device and the second measurement device that the first measurement system is equipped with is performed on a substrate that has gone through at least one processing of; cleaning, oxidation/diffusion, film deposition, etching, ion implantation, and CMP and is before coating of a sensitive agent for the next exposure, acquiring position information on the plurality of marks performed in at least one of the first measurement device and the second measurement device that the second measurement system is equipped with is performed on a substrate before etching processing, the substrate having been exposed by the exposure apparatus and has been developed, and acquiring position information on the plurality of marks for different substrates by each of the first measurement system and the second measurement system is performed concurrently with alignment measurement and exposure to different substrates by the exposure apparatus.

According to an eighth aspect, there is provided a device manufacturing method, comprising: exposing a substrate using an exposure apparatus that structures a part of the substrate processing system according to one of the sixth aspect and the seventh aspect, and developing the substrate that has been exposed.

BRIEF DESCRIPTION OF DRAWINGS

In the accompanying drawings:

FIG. 2 is a perspective view of an external appearance showing a measurement system that the substrate processing system in FIG. 1 is equipped with;

FIG. 10 is a block diagram showing an input output relation of an exposure controller that the exposure apparatus is equipped with;

DESCRIPTION OF EMBODIMENTS

Figure 1:
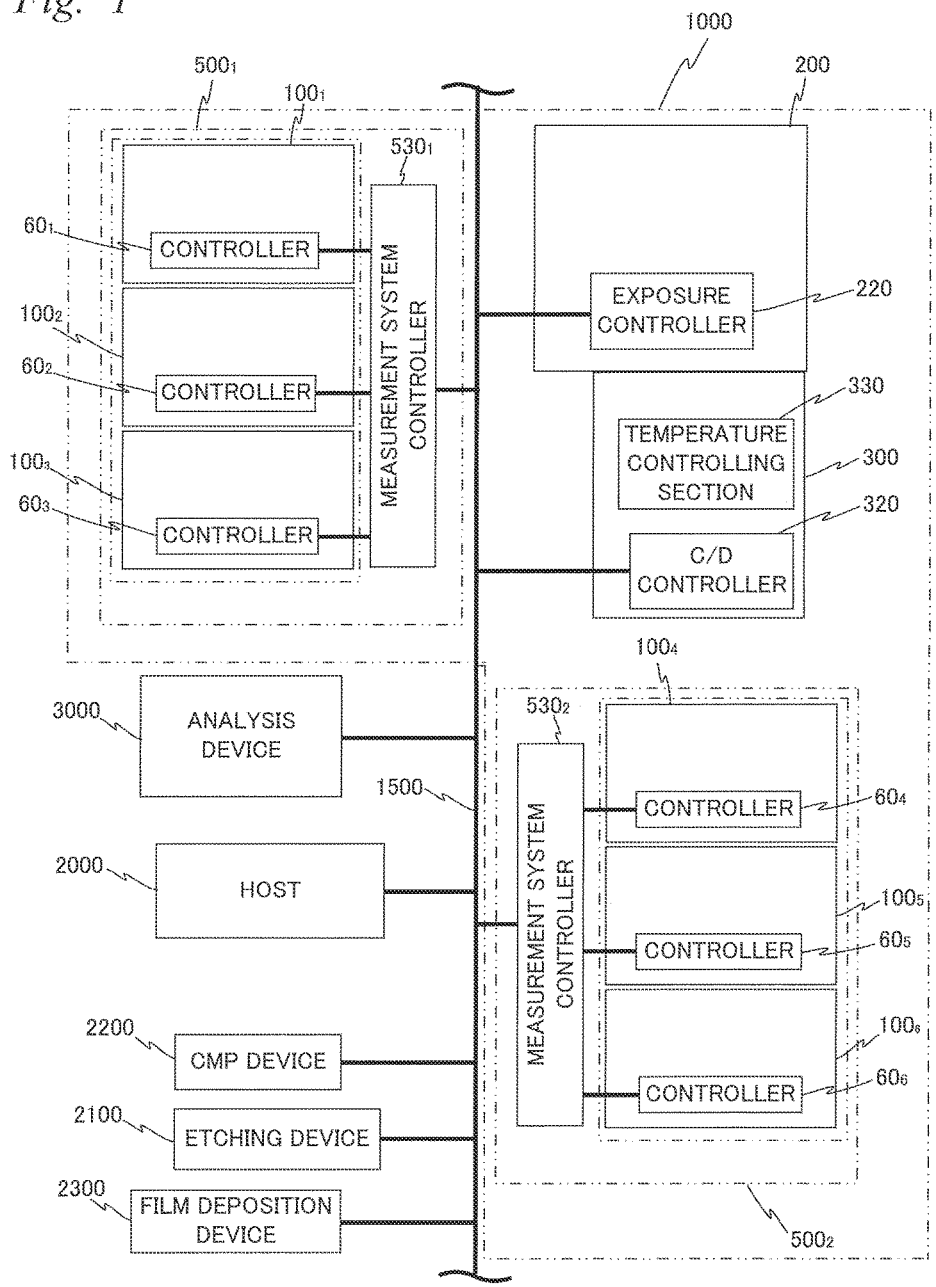
FIG. 1 is a block diagram showing a substrate processing system according to an embodiment, along with other apparatuses to be used in a micro-device manufacturing line.

Hereinafter, an embodiment will be described, based on FIGS. 1 to 14. FIG. 1 is a block diagram, showing a substrate processing system 1000 according to a first embodiment used in a manufacturing line for manufacturing microdevices (e.g., semiconductor devices), along with other devices used in the manufacturing line.

Substrate processing system 1000, as is shown in FIG. 1, is equipped with an exposure apparatus 200 and a coater/developer 300 (resist coating/developing apparatus) that are connected in-line with each other. Also, substrate processing system 1000 is equipped with a measurement system $500_1$ and a measurement system $500_2$. Hereinafter, coater/developer 300 will be expressed shortly referred to as C/D 300. Note that connected in-line means that different apparatuses are connected so that a carrying route of a wafer (substrate) is substantially connected, and in the description, terms such as "connected in-line" and "in-line connection" will be used in such a meaning. For example, in the case two different apparatuses are connected in-line, a wafer (substrate) that has finished processing in one apparatus can be sequentially carried to the other apparatus using a carrier mechanism such as a robot arm. Note that the case in which the different apparatuses are connected via an interface section may also be called an "in-line connection."

Measurement system $500_1$, here, is equipped with three measurement devices $100_1$ to $100_3$ arranged adjacent to one another in a predetermined direction inside one chamber 502 (refer to FIGS. 2 and 3), a measurement system controller $530_1$ which generally controls the entire measurement system $500_1$, and the like. Each of the measurement devices $100_1$ to $100_3$ has a controller $60_i$ (i=1 to 3), and each of the controllers $60_i$ is connected to measurement system controller $530_1$. Note that each of the measurement devices $100_1$ to $100_3$ may be controlled by measurement system controller $530_1$, without being equipped with controller $60_i$ (i=1 to 3).

Measurement system $500_2$ is equipped with three measurement devices $100_4$, $100_5$, and $100_6$, arranged adjacent to one another in a predetermined direction inside one chamber (not shown), and a measurement system controller $530_2$ which generally controls the entire measurement system $500_2$, and the like. Measurement devises $100_4$, $100_5$, and $100_6$ have controllers $60_4$, $60_5$, and $60_6$, respectively, and each of the controllers $60_i$ (i=4 to 6) is connected to measurement controller $530_2$. Note that each of the measurement devices $100_4$ to $100_6$ may be controlled by measurement system controller $530_2$, without being equipped with controller $60_i$ (i=4 to 6).

Exposure apparatus 200 and C/D 300 that substrate processing system 1000 is equipped with both have a chamber, and the chambers are disposed adjacent to each other.

An exposure controller 220 that exposure apparatus 200 has, a coater/developer controller 320 that C/D 300 has, measurement system controller $530_1$, and measurement system controller $530_2$ are connected to one another, via a local area network (LAN) 1500. To LAN 1500, a host computer (HOST) 2000 that controls the entire manufacturing line, an analysis device 3000, and a group of devices performing various types of processing (processing of a pre-process in a wafer process) under the control of host computer 2000 are also connected. Of the group of devices, FIG. 1 representatively shows an etching device 2100, a CMP device 2200, and a film deposition device 2300 such as a CVD device. Other than these apparatuses, a cleaning device, an oxidation/diffusion device, an ion implantation device and the like are connected to LAN 1500.

Note that substrate processing system 1000 may include at least one of host computer 2000, analysis device 3000, etching device 2100, CMP device 2200, and film deposition device 2300.

Figure 2:
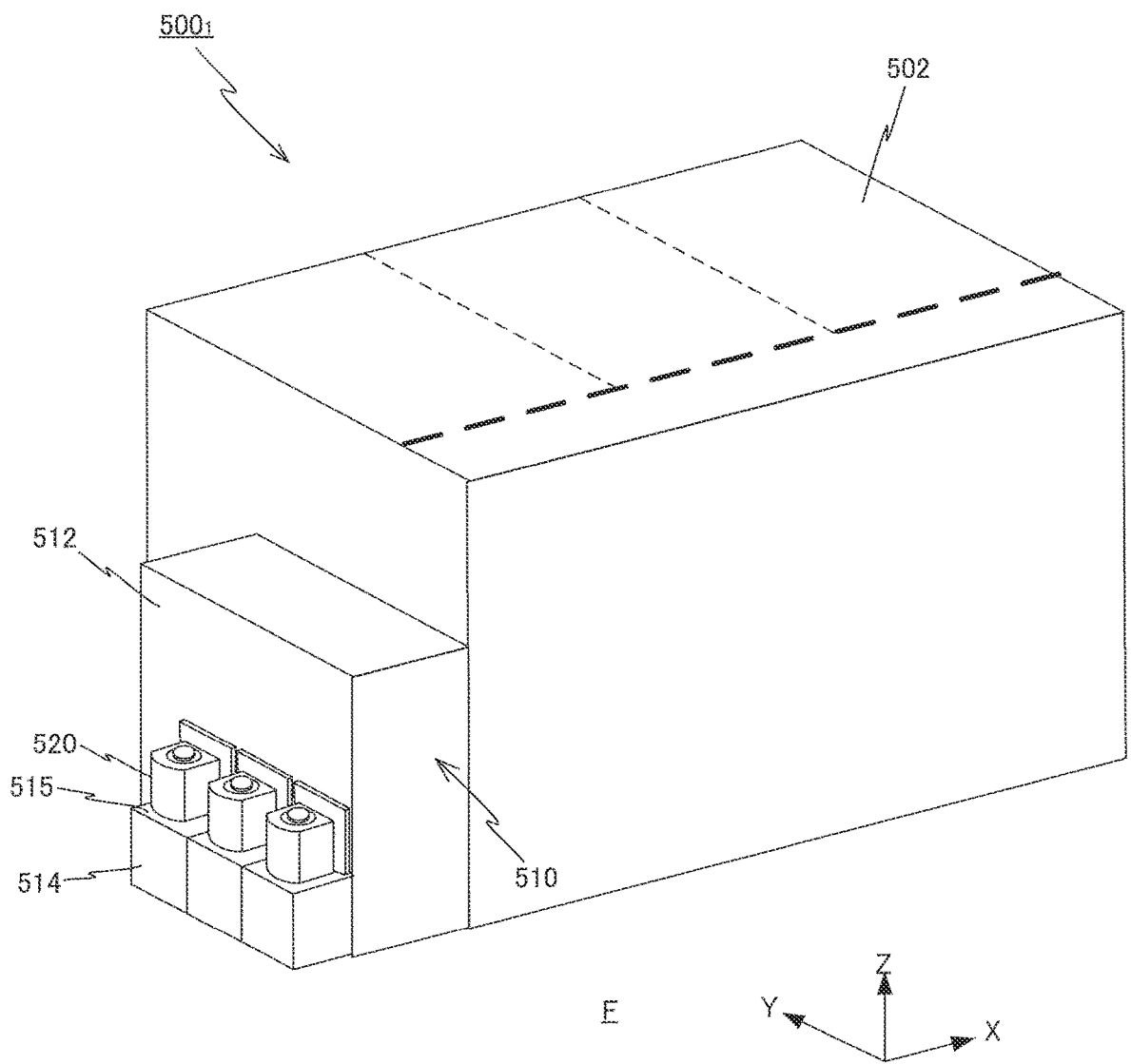

First of all, the measurement systems will be described. Here, while measurement system $500_1$ and measurement system $500_2$ have a difference of the substrate subject to measurement being a substrate before exposure or after exposure, the structure is similar to each other with the systems having a similar function; therefore, measurement system $500_1$ will be representatively discussed and described in the description below. FIG. 2 shows a perspective view of an external appearance of measurement system $500_1$. Measurement system $500_1$ is installed on a floor F of a clean room apart from other devices that structure substrate processing system 1000. That is, measurement system $500_1$ is not connected in-line with exposure apparatus 200 and C/D 300.

Measurement system $500_1$ is equipped with; chamber 502 in which the three measurement devices $100_1$ to $100_3$ are arranged, and a carrier system 510 arranged at one side of chamber 502. In the embodiment, carrier system 510 is an EFEM (Equipment Front End Module) system. Hereinafter, carrier system 510 is also called EFEM system 510.

Note that as it will be described later on, while carrier system 510 of the embodiment is for FOUP (Front-Opening Unified Pod), the carrier is not limited to FOUP, and other types of carriers (e.g., SMIF pod) that can house one or a plurality of wafers may be handled in carrier system 510.

In the description below, a direction in which chamber 502 and EFEM system 510 are arranged will be described as an X-axis direction, a direction perpendicular to the X-axis within a plane parallel to floor surface F will be described as a Y-axis direction, and a direction orthogonal to the X-axis and the Y-axis will be described as a 2-axis direction.

Figure 3:
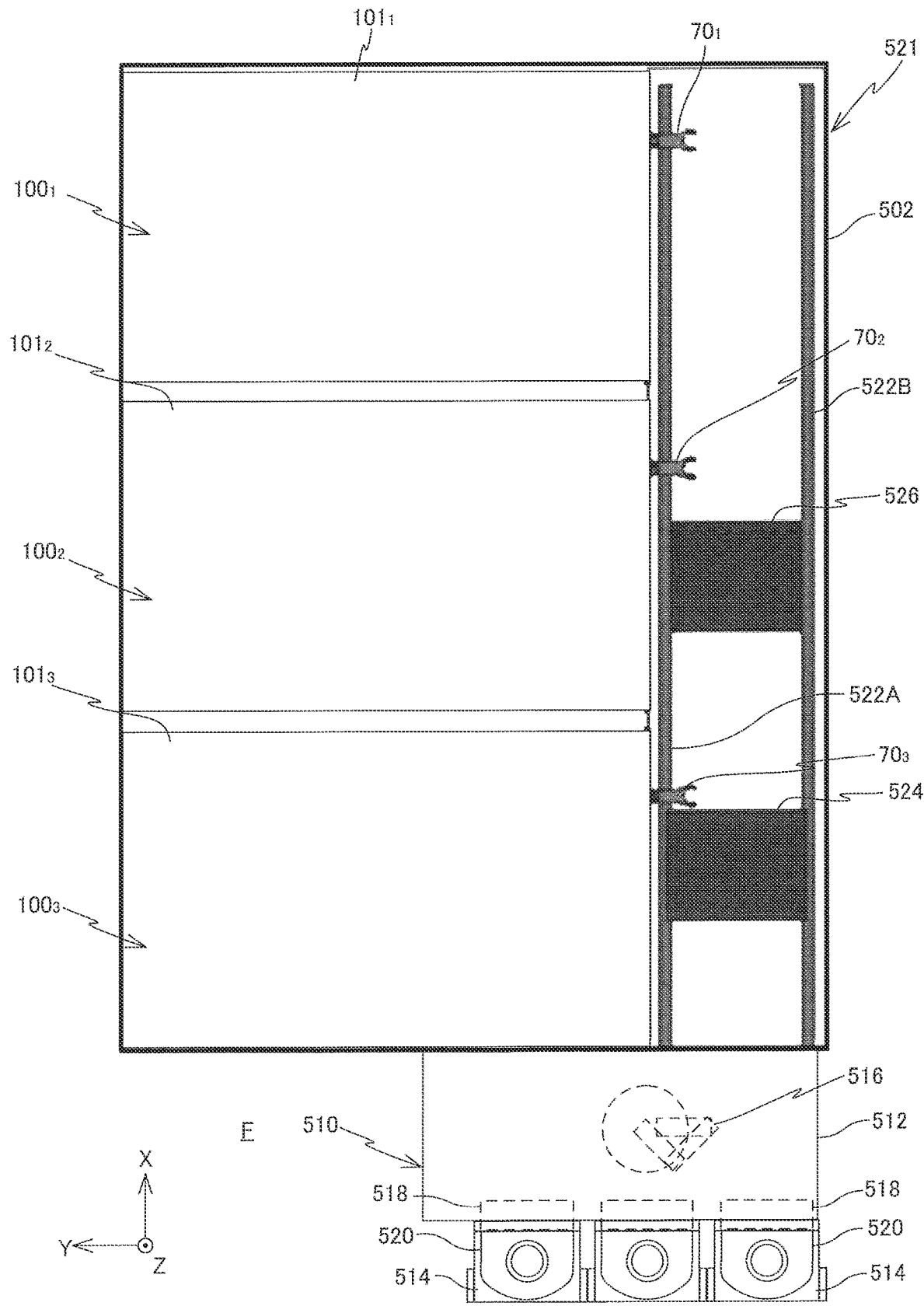
FIG. 3 is a planar view showing the measurement system in FIG. 1 with the ceiling section of a chamber removed.

As is shown in FIG. 2, chamber 502 has a rectangular parallelepiped shape, and in a first space therein, as is shown in FIG. 3, measurement devices $100_1$ to $100_3$ are housed arranged in the X-axis direction. FIG. 3 shows a planar view of measurement system $500_1$ with the ceiling section of chamber 502 removed, and in FIG. 3, a chamber $101_i$ (i=1 to 3) that each of measurement devices $100_1$ to $100_3$ has is shown. Note that each of measurement devices $100_1$ to $100_3$ does not have to be equipped with chamber $101_i$.

Since the plurality of measurement devices $100_1$ to $100_3$ are arranged in the X-axis direction, measurement system $500_1$ can be equipped with the plurality of measurement devices $100_1$ to $100_3$ without increasing the width in the Y-axis direction of measurement system $500_1$. In a factory where measurement system $500_1$ and the like is installed, a pathway for operators extends in the Y-axis direction, and devices that perform various types of processing described above (such as etching device 2100 and CMP device 2200) are arranged along the pathway. Consequently, to effectively use floor surface F of the factory, it is important to suppress the width in the Y-axis direction of measurement system $500_1$.

Also, on the −Y side of the first space in chamber 502, a carrying system 521 is arranged that can deliver/receive a wafer to/from each of measurement devices $100_1$ to $100_3$. Mote that in the description below, for the sake of convenience, space on the −Y side of the first space where carrying system 521 is installed is to be called a second space. In FIG. 2, the bold broken line shows a virtual partition between the first space and the second space.

Adjacent to chamber 502 on the −X side (front surface side), EFEM system 510 is installed on floor surface F. EFEM system 510 is a module equipment equipped with an EFEM main body 512 in which a robot for carrying wafers is installed inside, and a loading port attached to the −X side (front surface side) of EFEM main body 512. To EFEM main body 512 at the front surface side, a plurality of loading ports 514 (may also be called a carrier mounting device) for FOUP is provided arranged in the Y-axis direction. Note that in the embodiment, while EFEM main body 512 has three loading ports 514, the number of loading ports is not limited to three, and may be one, two, four, or more than four. Here, FOUP is a carrier that is aimed to carry and store a wafer used in a semiconductor factory of a mini-environment method specified in SEMI standard E47.1, and is a front opening type cassette integrated carriage/storage box. In FIGS. 2 and 3, a FOUP 520 is installed on each of the three loading ports 514, and in the FOUP, at least one wafer is housed as a measurement target.

In the embodiment, although it is omitted in the drawings, a track rail for OHT (Overhead Hoist Transport) is provided near the ceiling of the clean room directly above the three loading ports 514. OHT is an unmanned carrier that travels in a space of a ceiling level, and by this OHT, FOUP 520 is delivered to loading port 514.

Each of the three loading ports 514 has a mounting section 515 and an open/close mechanism 518 (refer to FIG. 3) that opens/closes the cover of FOUP 520 mounted on mounting section 515. Open/close mechanism 518 is provided in the front part of EFEM main body 512 that faces FOUP 520 mounted on mounting section 515 of loading port 514, and can open/close the cover of FOUP 50 while maintaining the air-tight state inside FOUP 520 with respect to the outside.

Since this type of open/close mechanism is known, description on the structure and the like of open/close mechanism 518 will be omitted.

Inside EFEM main body 512, a wafer carrier robot 516 (refer to FIG. 3) is provided that can have access to the inside of the three FOUPs in a state where the cover is open to put in and take out the wafer. Note that to the upper part of EFEM main body 512, a FFU (Fan Filter Unit, not shown) may be provided to keep the degree of cleanliness inside EFEM main body 512, and temperature controlled air from an air conditioner may be sent to the inside of EFEM main body 512, via FFU. Note that a buffer for stabilizing the temperature of the wafer using the temperature controlled air from the air conditioner may be provided within EFEM main body 512.

At a part on the back surface side of EFEM main body 512 facing the second space of chamber 502, an opening is formed, and the opening is opened/closed by an open/close member.

Each part (such as robot 516 and open/close mechanism 518) structuring EFEM system 510 is controlled by measurement system controller $530_1$ (refer to FIG. 1).

Inside the second space of chamber 502, as is shown in FIG. 3, carrying system 521 is installed. Provided in the carrying system are: guides 522A and 522B that cover almost the whole length of chamber 502 extending in the X-axis direction on each of one side and the other side in the Y-axis direction within the second space, a carrying member 524 used for loading that can move back and forth along guide 522A, and a carrying member 526 used for unloading that can move back and forth along guide 522B.

Carrying member 524 for loading can be moved along guide 522A by a linear motor (will be written as linear motor 522A using the same reference code as the guide in which the stator is incorporated) that has a stator incorporated in guide 522A and a mover provided in carrying member 524. Also, carrying member 526 for unloading can be moved along guide 522B by a linear motor (will be written as linear motor 522B using the same reference code as the guide in which the stator is incorporated) that has a stator incorporated in guide 522B and a mover provided in carrying member 526. Linear motors 522A and 522B are controlled by measurement system controller $530_1$. Note that carrying members 524 and 526 may be made to move in a non-contact manner using an air slider or the like. Also, the drive mechanism to move carrying members 524 and 526 is not limited to the linear motors (522A and 522B) described above, and may be a structure using a rotation motor and a ball screw mechanism.

Guide 522A is arranged at a position higher than that of guide 522B. Therefore, carrying member 524 for loading moves in the space above carrying member 526 for unloading.

Note that in carrying system 521 described above, carrying member 524 and guide 522A may be used for loading/unloading a wafer, and carrying member 526 and guide 522B may be used for loading/unloading a wafer.

Also, while carrying system 521 described above can deliver/receive a wafer to/from each of the plurality of measurement devices $100_1$ to $100_3$, carrying system 521 may have a carrying device (including the guide and the carrying member) that delivers/receives a wafer only to/from measurement device $100_1$, a carrying device (including the guide and the carrying member) that delivers/receives a wafer only to/from measurement device $100_2$, and a carrying device (including the guide and the carrying member) that delivers/receives a wafer only to/from measurement device $100_3$. In this case, each of the carrying devices may have a guide for loading and a carrying member, and a guide for unloading and a carrying member, or a guide used for both loading and unloading and a carrying member.

As is shown in FIG. 3, in measurement device $100_i$ (i=1 to 3), a wafer carrying system $70_i$ (i=1 to 3) is provided that has a multi-joint type robot which performs delivery/receiving of a wafer to/from carrying member 524 and carrying member 526. Wafer carrying system $70_i$ (i=1 to 3) performs delivery/receiving of a wafer to/from carrying member 524 and carrying member 526 via an opening of chamber $101_i$.

Carrying member 524 receives a wafer subject to measurement processing inside FOUP 520 from robot 516 at a wafer delivery position (loading side wafer delivery position) set near the dividing line between main body 512 and chamber 502, and carries the wafer to the wafer delivery position between wafer carrying system $70_i$ (i=one of 1 to 3) and measurement device $100_i$. The wafer subject to measurement processing described above of measurement device $100_i$ (i=1 to 3) in the embodiment is a wafer on which at least exposure of a first layer has been completed and a wafer on which necessary treatment of the pre-process processing in the wafer process such as etching, oxidation/diffusion, ion implantation, and flattening (CMP) has been applied after completing development, and is a wafer prior to carriage into C/D 300 for resist coating.

Note that in the case measurement is performed with at least two of measurement devices $100_1$ to $100_3$, carrying member 524 for loading receives the wafer subject to measurement on which measurement by another measurement device $100_i$ (i=one of 1 to 3) has been completed from wafer carrying system $70_i$ (i=one of 1 to 3), and carries the wafer to the wafer delivery position between wafer carrying system $70_j$ (j=one of 1 to 3, j≠1) and measurement device $100_j$.

Carrying member 525 receives the wafer on which measurement has been completed from wafer carrying system $70_i$ (i=one of 1 to 3), and carries the wafer to an unloading side wafer delivery position (a position below the loading side wafer delivery position described earlier) set near the dividing line between EFEM main body 512 and chamber 502.

Robot 516 carries (returns) the wafer that has undergone measurement processing carried to the unloading side wafer delivery position by carrying member 526 into FOUP 520.

Referring back to FIG. 1, as each of measurement devices $100_1$ to $100_3$, in the embodiment, a measurement device of a similar structure is used.

Note that in the embodiment, while an example was shown of a case in which by carrying system 521 that performs delivery of the wafer between measurement device $100_i$ such as carrying member 524 and carrying member 526 being arranged in the second space of chamber 502, the space in which the wafer is carried by carrying member 524 and carrying member 526 is consequently an air-tight space, the embodiment is not limited to this, and the three measurement devices $100_1$ to $100_3$ may be arranged on floor surface F, and along with these measurement devices $100_1$ to $100_3$ (whether housed in the same chamber or not), another chamber may be provided in which an air-tight chamber where carrying system 521 is housed inside is formed. That is, measurement system $500_1$ does not have to be equipped with chamber 502.

Also, instead of carrying members 524 and 526, a multi-joint type robot that can move back and forth along a guide may be used. In this case, wafer carrying system $70_i$ does not have to be equipped with the multi-joint type robot, and only has to be equipped with a wafer holding section for loading and a wafer holding section for unloading where delivery of the wafer is performed with the multi-joint type robot of carrying system 521.

Also, in the case the multi-joint type robot is used instead of carrying members 524 and 526, EFEM system 510 does not have to be equipped with robot 516. In this case, the multi-joint type robot of carrying system 521 may take out the wafer from FOUP 520, or return the wafer to FOUP 520.

Figure 4:
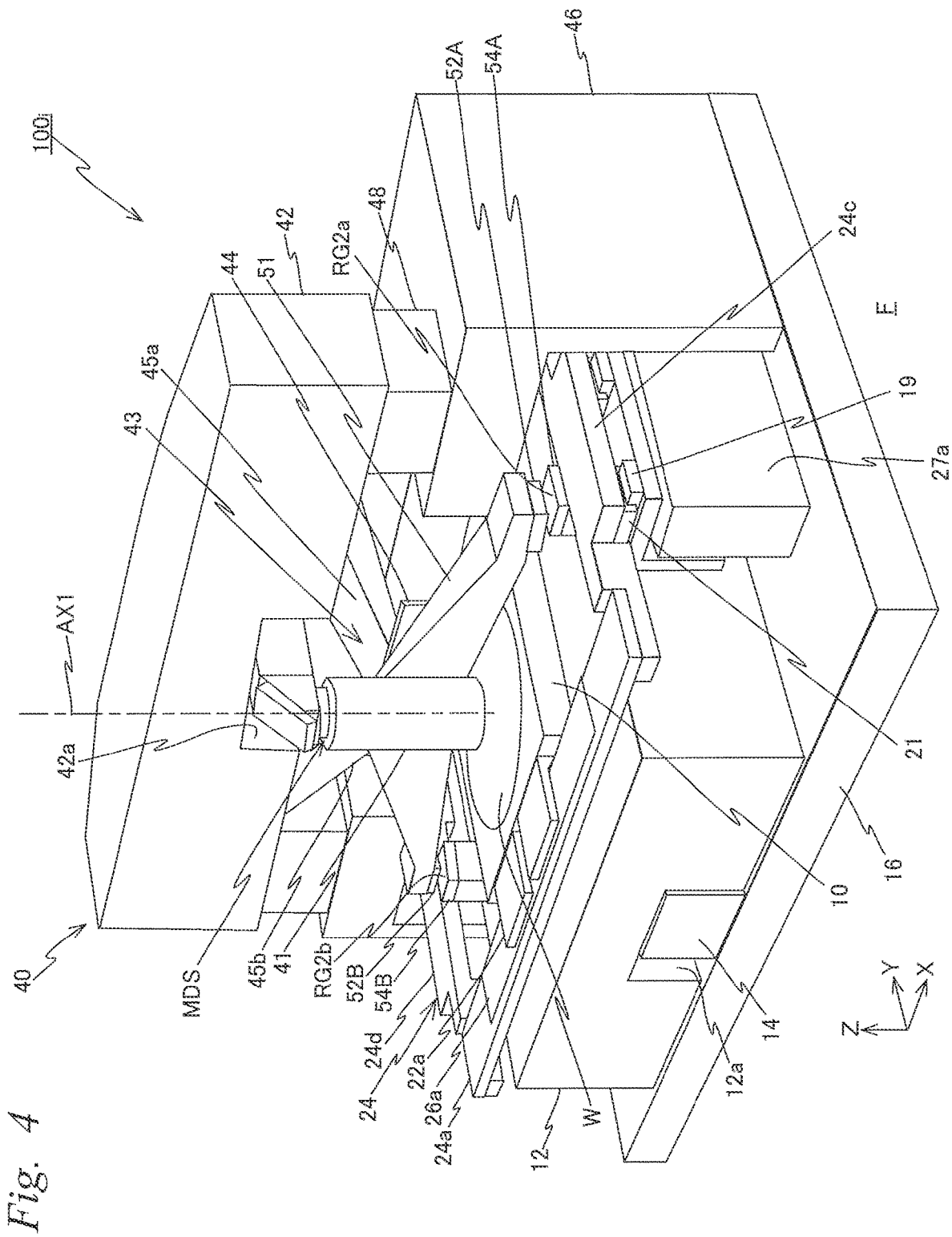
FIG. 4 is a perspective view schematically showing a structure of a measurement device that structures a part of the measurement system.

Here, measurement device 100$_i$ will be described in detail. FIG. 4 schematically shows a perspective view of a structure of measurement device 100$_i$. Note that while measurement device 100$_i$ shown in FIG. 4 is actually structured by chamber 101$_i$ described earlier and the structure part housed inside chamber 101$_i$, in the description below, the description related to chamber 101$_i$ will be omitted. In measurement device 100$_i$ according to the embodiment, a mark detection system MDS is provided as is will be described later on, and in the description below, a direction in an optical axis AX1 of mark detection system MDS is to coincide with the Z-axis direction described earlier, a direction in which a movable stage to be described later on moves in long strokes within an XY plane orthogonal to the Z-axis direction is to coincide with the Y-axis direction described earlier, and rotation (tilt) directions around the X-axis, the Y-axis, and the Z-axis will be described as θX, θy, and θz directions, respectively. Here, mark detection system MDS has a cylindrical barrel section 41 provided at its lower end (tip), and inside barrel section 41, an optical system (dioptric system) is housed, consisting of a plurality of lens elements having a common optical axis AX1 in the Z-axis direction. In the description, for the sake of convenience, optical axis AX1 of the dioptric system inside barrel section 41 is to be referred to as optical axis AX1 of mark detection system MDS.

Figure 5A:
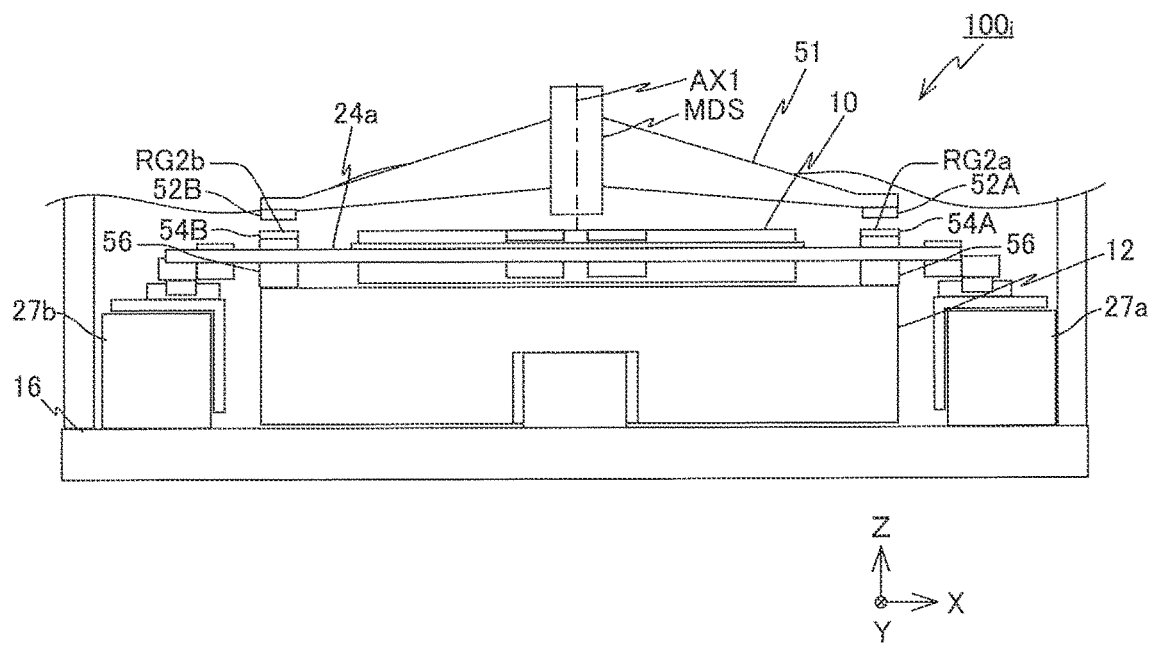
FIG. 5A is a partly omitted front view (a view when viewed from the −Y direction) of the measurement device in FIG. 4.
Figure 5B:
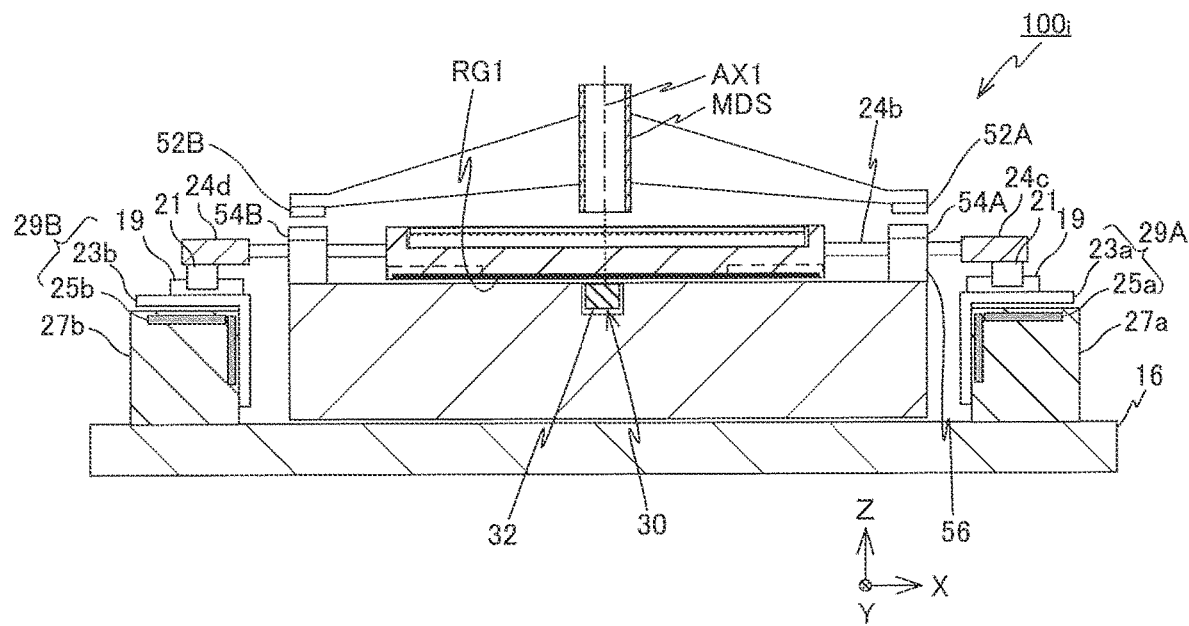
FIG. 5B is a partly omitted cross-sectional view of the measurement device when a cross-section is taken in the XZ plane that passes through an optical axis AX1 of a mark detection system.
Figure 6:
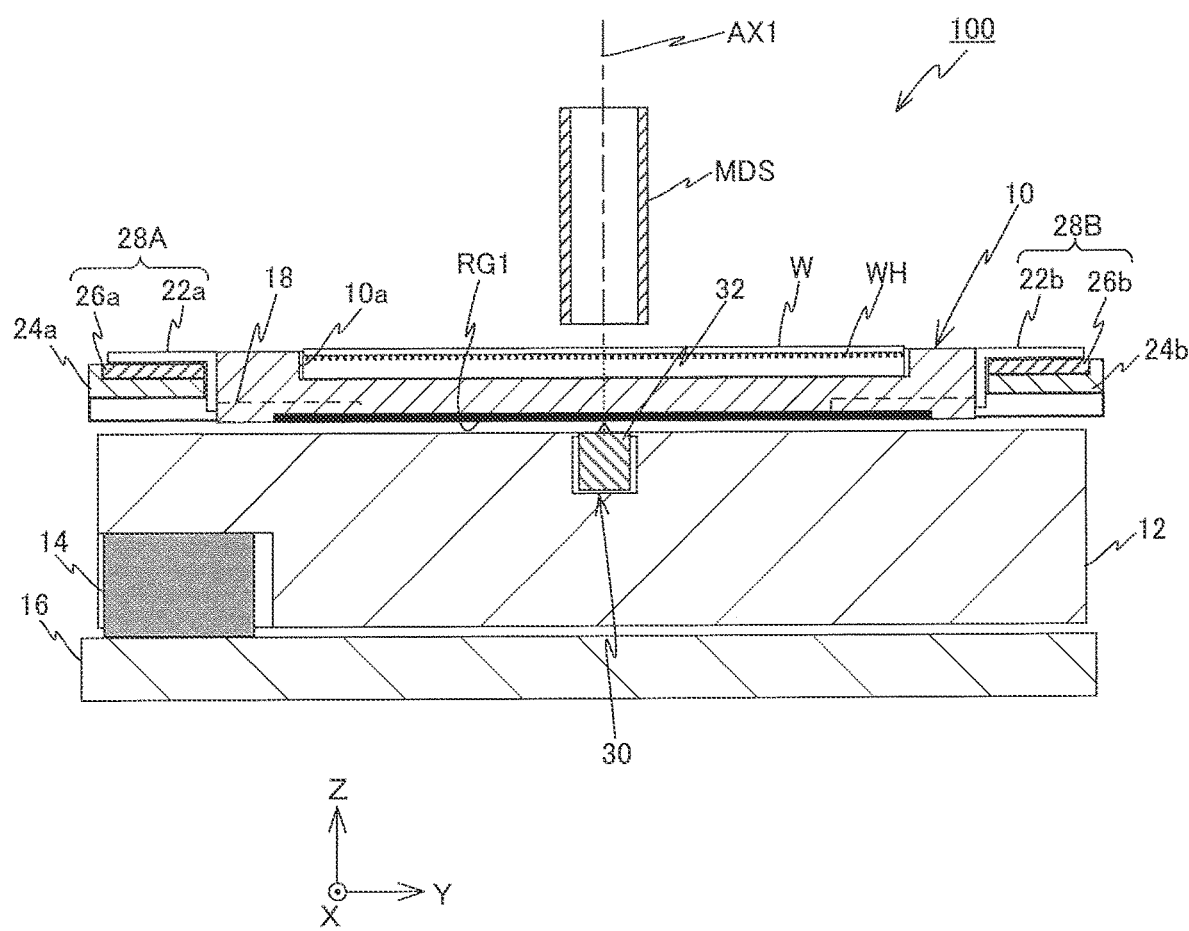
FIG. 6 is a partly omitted cross-sectional view of the measurement device when a cross-section is taken in the YZ plane that passes through optical axis AX1 of the mark detection system.

FIG. 5A shows a partly omitted front view (a view when viewed from the −Y direction) of measurement device 100$_i$ in FIG. 4, and FIG. 5B shows a partly omitted cross-sectional view of measurement device 100$_i$ when a cross-section is taken in the XZ plane that passes through optical axis AX1. Also, FIG. 6 shows a partly omitted cross-sectional view of measurement device 100$_i$ when a cross-section is taken in the YZ plane that passes through optical axis AX1.

Measurement device 100$_i$, as is shown in FIG. 4, is equipped with; a surface plate 12 having an upper surface almost parallel to the XY plane orthogonal to optical axis AX1, a wafer slider (hereinafter shortly referred to as a slider) 10 arranged on surface plate 12 that is movable in predetermined strokes in the X-axis and the Y-axis directions with respect to surface plate 12 while holding a wafer W and can also move finely (fine displacement) in the Z-axis, the θx, the θy and the θz directions, a drive system 20 (refer to FIG. 8) that drives slider 10, a first position measurement system 30 (not shown in FIG. 4, refer to FIGS. 6 and 8) that measures position information on slider 10 with respect to surface plate 12 in each of the X-axis, the Y-axis, the Z-axis, the θx, the θy and the θz directions (hereinafter referred to as directions of six degrees of freedom), a measurement unit 40 that has mark detection system MDS for detecting a mark on wafer W mounted on (held by) slider 10, a second position measurement system 50 (refer to FIG. 8) that measures relative position information between mark detection system MDS (measurement unit 40) and surface plate 12, and a controller 60$_i$ (not shown in FIG. 4, refer to FIG. 8) that acquires measurement information according to the first position measurement system 30 and measurement information according to the second position measurement system 50 and obtains position information on a plurality of marks on wafer W held by slider 10 using mark detection system MDS, while controlling drive of slider 10 by drive system 20.

Surface plate 12 consists of a rectangular parallelepiped member having a rectangular shape in a planar view, and its upper surface is finished so that the degree of flatness is extremely high to form a guide surface on movement of slider 10. As the material for surface plate 12, a material of low thermal expansion coefficient also called a zero thermal expansion material is used, such as, e.g. an invar alloy, an ultra-low expansion steel, or an ultra-low expansion glass ceramics.

In surface plate 12, a total of three cutout shaped spaces 12a whose bottom section is open is formed, one in the center in the X-axis direction of a surface on the −Y side, and one each on both ends in the X-axis direction of a surface on the +Y side. Of the three spaces 12a, FIG. 4 shows space 12a formed on the surface on the −Y side. Inside each of the spaces 12a, a vibration isolator 14 is arranged. Surface plate 12 is supported at three points so that its upper surface is almost parallel to the XY plane, by three vibration isolators 14 on an upper surface parallel to an XY plane of a base frame 16 having a rectangular shape in a planar view installed on floor surface F. Note that the number of vibration isolators 14 is not limited to three.

Slider 10, as is shown in FIG. 6, has one each, or a total of four air hydrostatic bearings (air bearings) 16 attached to the four corners of the bottom surface in a state where each of the bearing surfaces is almost flush with the lower surface of slider 10, and by static pressure (pressure within gap) between a bearing surface of pressurized air which blows out coward surface plate 12 from these four air bearings 18 and the upper surface (guide surface) of surface plate 12, slider 10 is supported by levitation via a predetermined clearance (air-gap, gap), such as a clearance of around several μm, on the upper surface of surface plate 12. In the embodiment, as the material for slider 10, a zero thermal expansion glass (e.g., Zerodur of Schott AG) is used, which is a kind of zero thermal expansion material.

In the upper part of slider 10, a recess section 10a is formed, having a predetermined depth with a circular shape in a planar view whose inner diameter is slightly larger than the diameter of wafer W, and inside recess section 10a, a wafer holder WH whose diameter is almost the same as that of wafer w is arranged. As wafer holder WH, while a vacuum chuck, an electrostatic chuck, or a mechanical chuck may be used, as an example, a vacuum chuck of a pin chuck method is to be used. Wafer W is held by suction by wafer holder WH, in a state where its upper surface is almost flush with the upper surface of slider 10. In wafer holder WH, a plurality of suction ports is formed, and the plurality of suction ports is connected to a vacuum pump 11 (refer to FIG. 8) via a vacuum piping system (not shown). And, operation such as on/off of vacuum pump 11 is controlled by controller 60$_i$. Note that one of, or both slider 10 and wafer holder WH may be called "a first substrate holding member."

Figure 8:
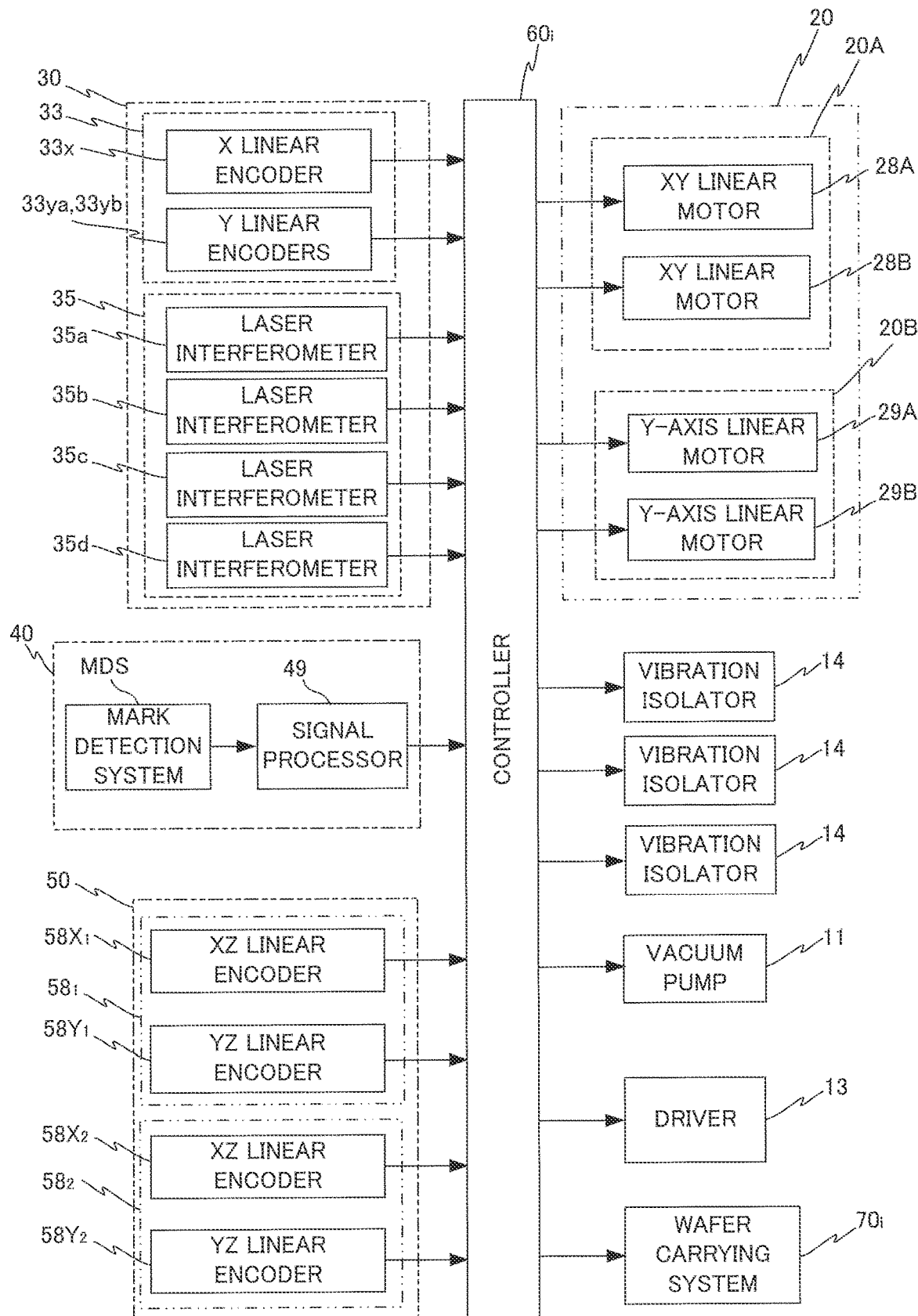
FIG. 8 is a block diagram showing an input output relation of a controller which mainly structures a control system of the measurement device.

Also, in slider 10, a vertical movement member (not shown) is provided that moves vertically, for example, via three circular openings formed in wafer holder WH, and loads the wafer onto wafer holder WH as well as unloads the wafer from wafer holder WH together with wafer carrying system 70$_i$ (not shown in FIG. 4, refer to FIG. 8). A driver 13 that moves the vertical movement member is controlled by controller 60$_i$ (refer to FIG. 8).

In the embodiment, as wafer holder WH, as an example, a wafer holder that can hold by suction a 300 mm wafer having a diameter of 300 mm is to be used. Note that in the case wafer carrying system $70_i$ has a non-contact holding member that holds the wafer on wafer holder WH by suction in a non-contact manner from above, such as a Bernoulli chuck or the like, the vertical movement member does not have to be provided in slider 10, and therefore, the circular opening for the vertical movement member also does not have to be formed in wafer holder WH.

As is shown in FIGS. 5B and 6, on the lower surface of slider 10 in an area slightly larger than wafer W, a two-dimensional grating (hereinafter simply referred to as a grating) RG1 is arranged horizontally (parallel to the surface of wafer W). Grating RG1 includes a reflective diffraction grating whose periodic direction is in the X-axis direction (X diffraction grating) and a reflective diffraction grating whose periodic direction is in the Y-axis direction (Y diffraction grating). The pitch between the grid lines of the X diffraction grating and the Y diffraction grating is set, for example, to 1 μm.

Vibration isolator 14 is an active type vibration isolation system (so-called AVIS (Active Vibration Isolation System)), and is equipped with an accelerometer, a displacement sensor (e.g., a capacitive sensor), an actuator (e.g., a voice coil motor), and an air mount which functions as an air damper and the like. Vibration isolator 14 can attenuate vibration of relatively high frequency with the air mount (air damper) and can also isolate vibration (control vibration) with the actuator. Accordingly, vibration isolator 14 can prevent vibration traveling through surface plate 12 and base frame 16. Note that a hydraulic power damper may be used, instead of the air mount (air damper).

Here, the reason why the actuator is provided in addition to the air mount is because since the internal pressure of the gas within the gas chamber of the air mount is high, control response can be secured only to around 20 Hz, therefore, when control of high response is necessary, the actuator has to be controlled according to the output of the accelerometer not shown. However, fine vibration such as floor vibration is isolated by the air mount.

The upper end surface of vibration isolator 14 is connected to surface plate 12. Air (e.g., compressed air) can be supplied to the air mount via a gas supply port not shown, and the air mount expands/contracts in predetermined strokes (e.g., around 1 mm) in the Z-axis direction according to the amount of gas (pressure change of the compressed air) filled inside the air mount. Therefore, by vertically moving individually from below the three places of surface plate 12 using the air mounts that each of the three vibration isolators 14 have, position of surface plate 12 and slider 10 supported by levitation on the surface plate in the Z-axis direction, the θx direction, and the θy direction can be adjusted arbitrarily. Also, the actuator of vibration isolator 14 not only moves surface plate 12 in the Z-axis direction, but also can move the surface plate in the X-axis direction and the Y-axis direction. Note that movement quantity in the X-axis direction and the Y-axis direction is smaller than the movement quantity in the Z-axis direction. The three vibration isolators 14 are connected to controller $60_i$ (refer to FIG. 8). Note that each of the three vibration isolators 14 may be equipped with an actuator that can move surface plate 12 not only in the X-axis direction, the Y-axis direction, and the Z-axis direction, but also in, for example, directions of six degrees of freedom. Controller $60_i$ controls the actuators of the three vibration isolators 14 real time at all times, so that position in directions of six degrees of freedom of surface plate 12 to which a head section 32 of the first position measurement system 30 to be described later on is fixed maintains a desired positional relation with respect to mark detection system MDS, based on relative position information between mark detection system MDS (measurement unit 40) and surface plate 12 measured by the second position measurement system 50. Note that feedforward control can be performed on each of the three vibration isolators 14. For example, controller $60_i$ may perform feedforward control on each of the three vibration isolators 14, based on measurement information on the first position measurement system 30. Note that control of vibration isolator 14 by controller $60_i$ is to be described further later on.

Drive system 20, as is shown in FIG. 8, includes a first driver 20A that moves slider 10 in the X-axis direction and a second driver 20B that moves slider 10 in the Y-axis direction integrally with the first driver 20A.

As it can be seen from FIGS. 4 and 6, on a side surface at the −Y side of slider 10, a pair of movers 22a each consisting of a magnet unit (or a coil unit) having an inverted L-shape in a side view is fixed at a predetermined spacing in the X-axis direction. On a side surface at the +Y side of slider 10, as is shown in FIG. 6, a pair of movers 22b (mover 22b at the +X side is not shown) each consisting of a magnet unit (or a coil unit) is fixed at a predetermined spacing in the X-axis direction. Although the pair of movers 22a and the pair of movers 22b are placed symmetrical, they have a structure similar to each other.

Movers 22a and 22b, as is shown in FIGS. 4 to 6, are arranged a predetermined distance apart in the Y-axis direction structuring a part of a frame shaped movable stage 24 rectangular in a planar view, and are supported in a non-contact manner on an upper surface substantially parallel to the XY plane of a pair of plate members 24a and 24b each extending in the X-axis direction. That is, at a lower surface of movers 22a and 22b (a surface that face plate members 24a and 24b, respectively), air bearings (not shown) are provided, respectively, and by a levitation force (static pressure of pressurized air) that these air bearings generate with respect to plate members 24a and 24b, movers 22a and 22ba are supported in a non-contact manner from below by movable stage 24. Note that self-weight of slider 10 to which each pair of movers 22a and 22b are fixed is supported by the levitation force that the four air bearings 18 generate with respect to surface plate 12, as is previously described.

On the upper surface of each of the pair of plate members 24a and 24b, as is shown in FIGS. 4 to 6, stators 26a and 26b consisting of a coil unit (or a magnet unit) are placed in an area excluding both ends in the X-axis direction.

Electromagnetic interaction between the pair of movers 22a and stator 26a generates a drive force (electromagnetic force) for driving the pair of movers 22a in the X-axis direction and a drive force (electromagnetic force) for driving the pair of movers 22a in the Y-axis direction, and electromagnetic interaction between the pair of movers 22b and stator 26b generates a drive force (electromagnetic force) for driving the pair of movers 22b in the X-axis direction and a drive force (electromagnetic force) for driving the pair of movers 22b in the Y-axis direction. That is, the pair of movers 22a and stator 26a structure an XY linear motor 28A that generates a drive force in the X-axis direction and the Y-axis direction, the pair of movers 22b and stator 26b structure an XY linear meter 283 that generates a drive force in the X-axis direction and the Y-axis direction, and XY linear motor 28A and XY linear motor 28B structure the first driver 20A that drives slider 10 with predetermined strokes in the X-axis direction as well as finely drive the slider in the Y-axis direction (refer to FIG. 8). The first driver 20A can drive slider 10 in the θz direction by making the magnitude of each of the drive forces in the X-axis direction generated by XY linear motor 28A and XY linear motor 28B different. The first driver 20A is controlled by controller 60, (refer to FIG. 8). In the embodiment, while the first driver 20A generates not only a drive force in the X-axis direction but also a drive force in the Y-axis direction from the relation of structuring a coarse/fine movement drive system that drives slider 10 in the Y-axis direction with the first driver 20A as well as the second driver to be described later on, the first driver 20A does not necessarily have to generate the drive force in the Y-axis direction.

Movable stage 24 has the pair of plate members 24a and 24b and a pair of connecting members 24c and 24d placed a predetermined distance apart in the X-axis direction each extending in the Y-axis direction. A step section is formed at both ends in the Y-axis direction of connecting members 24c and 24d. And, in a state where one end and the other end in the longitudinal direction of plate member 24a are mounted on the step sections at the −Y side of each of the connecting members 24c and 24d, connecting members 24c and 24d and plate member 24a are integrated. Also, in a state where one end and the other end in the longitudinal direction of plate member 24b are mounted on the step sections at the +Y side of each of the connecting members 24c and 24d, connecting members 24c and 24d and plate member 24b are integrated (refer to FIG. 5B). That is, in this manner the pair of plate members 24a and 24b is connected with the pair of connecting members 24c and 24d to structure the frame shaped movable stage 24.

As is shown in FIGS. 4 and 5A, near both ends in the X-axis direction on the upper surface of base frame 16, a pair of linear guides 27a and 27b is fixed, extending in the Y-axis direction. Inside one of the linear guides 27a positioned at the +X side, a stator 25a (refer to FIG. 5B) of a Y-axis linear motor 29A consisting of a coil unit (or a magnet unit) that covers almost the total length in the Y-axis direction is housed on the upper surface and a surface near the −X side. Facing the upper surface and the surface near the −X side of linear guide 27a, a mover 23a is placed consisting of a magnet unit (or coil unit) having an L-shaped cross sectional surface that structures Y-axis linear motor 29A along with stator 25a. To the lower surface and the surface at the +X side of mover 23a that face the upper surface and the surface at the −X side of linear guide 27a, respectively, air bearings are fixed that blow out pressurized air to the opposing surface. Of the air bearings, especially as the air bearings fixed to the surface at the +X side of mover 23a, vacuum preloaded air bearings are used. The vacuum preloaded air bearings maintain a clearance (void, gap) in the X-axis direction between mover 23a and linear guide 27a at a constant value by balancing the static pressure of the pressurized air and the vacuum preload force between the bearing surface and linear guide 27a.

On the upper surface of mover 23a, a plurality of X guides 19 consisting of, for example, two rectangular solid members, are fixed spaced apart at a predetermined distance in the Y-axis direction. Each of the two X guides 19 is engaged in a non-contact manner with a slide member 21 having an inversed U sectional shape that structures a uniaxial guide device along with X guide 19. Air bearings are provided at each of the three surfaces of slide member 21 that face X guide 19.

The two slide members 21, as is shown in FIG. 4, are each fixed to the lower surface (surface at the −Z side) of connecting member 24c.

The other linear guide 27b positioned at the −X side houses inside a stator 25b of a Y-axis linear motor 29B consisting of a coil unit (or a magnet unit), and is structured similar to linear guide 27a except for being symmetric (refer to FIG. 5B). Facing the upper surface and the surface near the +X side of linear guide 27b, a mover 23b is placed consisting of a magnet unit (or coil unit) which is symmetric but has an L-shaped cross sectional surface similar to mover 23a that structures Y-axis linear motor 29B along with stator 25b. Facing each of the upper surface and the surface at the +X side of linear guide 27b, air bearings are fixed to each of the lower surface and the surface at the −X side of mover 23b, and especially as the air bearings fixed to the surface at the −X side of mover 23b, vacuum preloaded air bearings are used. By the vacuum preloaded air bearings, the clearance (void, gap) in the X-axis direction between mover 23b and linear guide 27b is kept at a constant value.

Between the upper surface of mover 23b and the bottom surface of connecting member 24d, as is previously described, two uniaxial guide devices are provided which are structured by X guide 19 and slide member 21 engaging with X guide 19 in a non-contact manner.

Movable stage 2A is supported from below by movers 23a and 23b via two each of (a total of four) uniaxial guide devices on the +X side and the −X side, and is movable in the X-axis direction on mover 23a and 23b. Therefore, by the first driver 20A previously described, when slider 10 is driven in the X-axis direction, reaction force of the drive force acts on movable stage 24 in which stators 26a and 26b are provided and movable stage 24 moves in a direction opposite to slider 10 according to the momentum conservation law. That is, the movement of movable stage 24 prevents (or effectively suppresses) generation of vibration caused by the reaction force of the drive force in the X-axis direction to slider 10. That is, movable stage 24 functions as a counter mass when slider 10 moves in the X-axis direction. However, movable stage 24 does not necessarily have to function as a counter mass. Note that a counter mass may be provided to prevent (or effectively suppress) generation of vibration caused by the drive force to drive slider 10 in the Y-axis direction with respect to movable stage 24, although it is not provided here in particular since slider 10 only moves finely in the Y-axis direction with respect to movable stage 24.

Y-axis linear motor 29A generates a drive force (electromagnetic force) that drives mover 23a in the Y-axis direction by electromagnetic interaction between mover 23a and stator 25a, and Y-axis linear motor 29B generates a drive force (electromagnetic force) that drives mover 23b in the Y-axis direction by electromagnetic interaction between mover 23b and stator 25b.

The drive force in the Y-axis direction that Y-axis linear motors 29A and 29B generate acts on movable stage 24 via two each of the uniaxial guide devices at the +X side and the −X side. This allows slider 10 to be driven in the Y-axis direction integrally with movable stage 24. That is, in the embodiment, movable stage 24, the four uniaxial guide devices, and the pair of Y-axis linear motors 29A and 29B structure a second driver 20B (refer to FIG. 6) that drives slider 10 in the Y-axis direction.

In the embodiment, the pair of Y-axis linear motors 29A and 29B is physically separated from surface plate 12 and is also separated in a vibratory manner by the three vibration isolators 14. Note that linear guides 27a and 27b in which stators 25a and 25b of the pair of Y-axis linear motors 29A and 29B provided may be structured movable in the Y-axis direction with respect to base frame 16, so that the linear guides may function as a counter mass when driving slider 10 in the Y-axis direction.

Measurement unit 40, as is shown in FIG. 4, has a unit main section 42 that has a cutout shaped space 42a having an opening at a bottom section formed at a surface on the −Y side, mark detection system MDS previously described connected to unit main section 42 in a state where a base end is inserted into space 42a, and a connection mechanism 43 that connects barrel section 41 at the tip of mark detection system MDS to unit main section 42.

Connection mechanism 43 includes a support plate 44 that supports barrel section 41 from the back side (the +Y side) via a mounting member (not shown), and a pair of support arms 45a and 45b whose one end each supports support plate 44 and the other end is each fixed to the bottom surface of unit main section 42.

In the embodiment, as mark detection system MDS, for example, an FIA (Field Image Alignment) system of an image processing method is used that irradiates a broadband detection beam generated in an illumination light source such as a halogen lamp on a target mark, picks up an image of the target mark formed on a light receiving surface by the reflection light from the target mark and an image of an index (not shown) (an index pattern on an index plate provided inside) using an imaging device (such as a CCD), and outputs their imaging signals. The imaging signals from mark detection system MDS are supplied to controller $60_i$ (refer to FIG. 8), via a signal processor 49 (not shown in FIG. 4, refer to FIG. 8). In measurement device $100_i$, measurement conditions (also called alignment measurement conditions) of marks using mark detection system MDS can be switched (selected) and set. The alignment measurement conditions which are switched (selected) and set includes; irradiating conditions for irradiating a detection beam on a mark of the detection target, light receiving conditions for receiving light generated from the mark, and signal processing conditions for processing photo-electrically converted signals obtained by receiving the light generated from the mark. The irradiating conditions and light receiving conditions are switched and set by controller $60_i$ via mark detection system MDS, and the signal processing conditions are switched and set by controller $60_i$ via signal processor 49.

The irradiating conditions which are switched, for example, includes at least one of; wavelength of the detection light, light amount of the detection light irradiated on the mark from an optical system that mark detection system MDS has, and NA or σ of the optical system. Also, the light receiving conditions which are switched includes at least one of; order of diffracted light generated from the mark, and wavelength of the light generated from the mark.

For example, by selectively setting a filter used in a wavelength selection mechanism that mark detection system MDS has on an optical path of the illumination light from the illumination light source, the wavelength of the detection light (illumination light) can be selected. Also, by controlling setting or state of stop of an illumination field stop, an illumination aperture stop, and an image forming aperture stop (e.g., also including an image forming aperture stop equipped with a shielding section of an annular shielding shape used with an annular illumination aperture stop and the like) that mark detection system MDS has, illumination conditions (normal illumination/modified illumination), dark field/bright field detection method, numerical aperture N. A., σ and illumination amount of the optical system and the like can be set and controlled.

Also, the signal processing conditions which are switched and set includes at least one of; a waveform analysis (waveform processing) algorithm used in signal processor 49, selection of a signal processing algorithm such as an EGA calculation model and the like, selection of various parameters used in each of the selected signal processing algorithms.

The FIA system capable of such switching (selecting) and setting of alignment measurement conditions is disclosed in, for example, U.S. Patent Application Publication No. 2008/0013073 and the like, and an FIA system having a similar structure can also be employed in mark detection system MDS of the embodiment. Note that it is also disclosed in the U.S. Patent Application Publication description described above that by changing the illumination aperture stop from a normal illumination aperture stop which has a circular transmitting section to an illumination aperture stop having an annular shape transmitting section and by further arranging a phase difference plate at a position near an image forming aperture stop in the latter part of image forming aperture stop, the FIA system (alignment sensors) is made to function also as a phase difference microscope type sensor, and a predetermined phase difference is given to a diffracted light of a predetermined order generated from the mark as one of the light receiving conditions. In the embodiment, mark detection system MDS also is to have an alignment auto-focus function that adjusts the focal position of the optical systems.

Referring back to FIG. 4, a head mounting member 51 having a rough isosceles triangle shape is placed in between barrel section 41 and support plate AA. In head mounting member 51, an opening section penetrating in the Y-axis direction in FIG. 4 is formed and barrel section 41 is attached to (fixed to) support plate 44 via the mounting member (not shown) inserted in the opening section. Head mounting member 51 also has its rear surface fixed to support plate 44. In this manner, barrel section 41 (mark detection system MDS), head mounting member 51, and support plate 44 are integrated with unit main section 42, via the pair of support arms 45a and 45b.

Inside unit main section 42, signal processor 49 and the like previously described are placed that performs processing on the imaging signals output as detection signals from mark detection system MDS, calculates position information on the target mark with respect to the detection center, and outputs the information to controller $60_i$. Unit main section 42 is supported from below via a plurality of, e.g., three vibration isolators 48, at three points, on a support frame 46 having a portal shape when viewed from the −Y side installed on base frame 16. Each vibration isolator 48 is an active type vibration isolation system (a so-called AVIS (Active Vibration Isolation System)), and is equipped with an accelerometer, a displacement sensor (e.g., a capacitive sensor), an actuator (e.g., a voice coil motor), a mechanical damper such as an air damper or a hydraulic damper, and the like. Each vibration isolator 48 can attenuate vibration of relatively high frequency with the mechanical damper and can also isolate vibration (control vibration) with the actuator. Accordingly, each vibration isolator 48 can avoid relatively high frequency vibration from traveling between support frame 46 and unit main section 42.

Note that mark detection system MDS is not limited to the FIA system, and for example, a diffracted light interference type alignment detection system may also be used that irradiates a coherent detection light on the subject mark, makes two diffracted lights (e.g., diffracted lights of the same order or diffracted lights diffracted in the same direction) generated from the target mark interfere with each other, and detects the interfered light and outputs the detection signals, instead of the FIA system. Or, the diffracted light interference type alignment system may be used with the FIA system and the two target marks may be detected simultaneously. Furthermore, as mark detection system MDS, a beam scan type alignment system that scans a measurement beam in a predetermined direction with respect to a target mark while slider 10 is moved in a predetermined direction may also be used. Also, in the embodiment, while mark detection system MDS has the alignment auto-focus function, instead of, or in addition to this, measurement unit 40 may be equipped with a focal position detection system such as a multi-point focal position detection system of an oblique incidence method having a structure similar to the one disclosed in, for example, U.S. Pat. No. 5,448,332.

The first position measurement system 30, as is shown in FIGS. 5B and 6, is placed within a recess section formed on the upper surface of surface plate 12 and has head section 32 fixed to surface plate 12. The upper surface of head section 32 faces the lower surface of slider 10 (forming surface of grating RG1). A predetermined clearance (void, gap), e.g., a clearance of several mm, is formed between the upper surface of head section 32 and the lower surface of slider 10.

The first position measurement system 30, as is shown in FIG. 8, is equipped with an encoder system 33 and a laser interferometer system 35. Encoder system 33 can acquire position information on slider 10, by irradiating a plurality of beams from head section 32 on a measurement section (forming surface of grating RG1) on the lower surface of slider 10 as well as receiving a plurality of return beams (e.g., a plurality of diffracted teams from grating RG1) from the measurement section on the lower surface of slider 10. Encoder system 33 includes an X linear encoder 33x which measures position in the X-axis direction of slider 10 and a pair of Y linear encoders 33ya and 33yb which measure position in the Y-axis direction of slider 10. In encoder system 33, a head of a diffraction interference type is used that has a structure similar to the encoder head disclosed in, for example, U.S. Patent Application Publication No. 2007/288121 and the like (hereinafter shortly written as an encoder head as appropriate). Note that while a head includes a light source, a light receiving system (including a photodetector), and an optical system, in the embodiment, of these parts, only at least the optical system has to be placed inside the housing of head section 32 facing grating RG1, and at least one of the light source and the light receiving system may be placed outside of the housing of head section 32.

In the embodiment, the first position measurement system 30 (encoder system 33) has a common detection point for measuring position information in the X-axis direction and Y-axis direction of slider 10, and controller 60$_i$ controls the actuators of the three vibration isolators 14 real time, so that the position of the detection point within the XY plane coincides with the detection center of mark detection system MDS, for example, at a nm level. Control of the actuators of these three vibration isolators 14 is performed, based on relative position information between mark detection system MDS (measurement unit 40) and surface plate 12 measured by the second position measurement system 50. Accordingly, in the embodiment, by using encoder system 33, controller 60$_i$ can always perform measurement of position information within the XY plane of slider 10 directly under (rear surface side of slider 10) the detection center of mark detection system MDS when measuring the alignment marks on wafer W mounted on slider 10. Controller 60$_i$ also measures the rotation quantity in the θz direction of slider 1C, based on a difference between measurement values of the pair of Y linear encoders 33ya and 33yb.

Laser interferometer system 35 can acquire position information on slider 10 by making a measurement beam enter the measurement section (the surface on which grating RG1 is formed) on the lower surface of slider 10, and also receiving the return beam (e.g., reflection light from a surface on which grating RG1 is formed). Laser interferometer system 35, for example, makes four measurement beams enter the lower surface of slider 10 (the surface on which grating RG1 is formed). Laser interferometer system 35 is equipped with laser interferometers 35a to 35d (refer to FIG. 8) that irradiate these four measurement beams, respectively. In the embodiment, four Z heads are structured by laser interferometers 35a to 35d. Note that the measurement beams from each of the laser interferometers 35a to 35d are irradiated on positions at each vertex of a square having two sides parallel to the X-axis and two sides parallel to the Y-axis on the lower surface (a surface on which grating RG1 is formed) of slider 10, whose center is the detection center of encoder system 33.

In the embodiment, the surface on which grating RG1 is formed also functions as a reflection surface of each measurement beam from laser interferometer system 35. Controller 60$_i$ measures information on the position in the Z-axis direction and the rotation quantity in the θx direction and the θy direction of slider 10, using laser interferometer system 35. Note that as it is obvious from the description above, although slider 10 is not positively driven by drive system 20 previously described with respect to surface plate 12 in the Z-axis, the θx and the θy directions, because slider 10 is supported by levitation on surface plate 12 by the four air bearings placed at the four corners of the bottom surface, the position of slider 10 actually changes on surface plate 12 in each of the Z-axis, the θx and the θy directions. That is, slider 10 is actually movable with respect to surface plate 12 in each of the Z-axis, the θx and the θy directions. Displacement in each of the θx and θy directions in particular causes a measurement error (Abbe error) in encoder system 33. Taking such points into consideration, position information in each of the Z-axis, the θx and the θy directions of slider 10 is measured by the first position measurement system 30 (laser interferometer system 35).

Note that for measurement of information on position in the Z-axis direction and the rotation quantity in the θx direction and the θy direction of slider 10, since the beams only have to be incident on three different points on the surface where grating RG1 is formed, the Z heads, e.g., laser interferometers, that are required should be three. Note that a cover glass to protect grating RG1 can be provided on the lower surface of slider 10, and on the surface of the cover glass, a wavelength selection filter may be provided that allows each measurement beam from encoder system 33 to pass and prevents each measurement beam from laser interferometer system 35 from passing.

As it can be seen from the description so far, controller 60$_i$ can measure the position in directions of six degrees of freedom of slider 10 by using encoder system 33 and laser interferometer system 35 of the first position measurement system 30. In this case, in encoder system 33, influence of air fluctuation can almost be ignored since the optical path lengths of all measurement beams in the air are extremely short, and optical path lengths of the pair of measurement beams irradiated on grating RG1 from X head 73x, optical path lengths of the pair of measurement beams irradiated on grating RG1 from Y head 37ya, and optical path lengths of the pair of measurement beams irradiated on grating RG1 from Y head 37yb are almost equal with each other. Accordingly, position information within the XY plane (including the θz direction) of slider 10 can be measured with high precision by encoder system 33. Also, because the substantial detection point on grating RG1 in the X-axis direction and the Y-axis direction by encoder system 33 and the detection point on the lower surface of slider 10 in the Z-axis direction by laser interferometer system 35 each coincide with the detection center of mark detection system MDS within the XY plane, generation of the so-called Abbe error which is caused by shift within the XY plane between the detection point and the detection center of mark detection system MDS can be suppressed to a level that can be ignored. Accordingly, controller $60_i$ can measure the position in the X-axis direction, the Y-axis direction, and the Z-axis direction of slider 10 without Abbe error caused by shift in the XY plane between the detection point and the detection center of mark detection system MDS with high precision by using the first position measurement system 30.

However, for the Z-axis direction parallel to optical axis AX1 of mark detection system MDS, position information in the XY plane of slider 10 is not necessarily measured at a position at the surface of wafer W by encoder system 33, that is, the Z position of the placement surface of grating RG1 and the surface of wafer W do not necessarily coincide. Therefore, in the case grating RG1 (that is, slider 10) is inclined with respect to the XY plane, when slider 10 is positioned based on measurement values of each of the encoders of encoder system 33, as a result, a positioning error (a kind of Abbe error) corresponding to the inclination with respect to the XY plane of grating RG1 occurs due to a Z position difference ΔZ (that is, position displacement in the Z-axis direction between the detection point by encoder system 33 and the detection center (detection point) by mark detection system MDS) between the placement surface of grating RG1 and the surface of wafer W. However, this positioning error (position control error) can be acquired by a simple calculation by using difference ΔZ, pitching quantity θx, and rolling quantity θy, and using this as an offset and by setting the position of slider 10 based on position information after correction in which measurement values of (each encoder of) encoder system 33 are corrected by the offset amount, the kind of Abbe error described above no longer affects the measurement Or, instead of correcting the measurement values of (each encoder of) encoder system 33, one or a plurality of information for moving the slider such as a target position to where slider 10 should be positioned may be corrected, based on the above offset.

Note that in the case grating RG1 (that is, slider 10) is inclined with respect to the XY plane, head section 32 may be moved so that a positioning error due to the inclination does not occur. That is, in the case an inclination has been measured in grating RG1 (that is, slider 10) with respect to the XY plane by the first position measurement system 30 (e.g., laser interferometer system 35), surface plate 12 that holds head section 32 may be moved, based on position information acquired using the first position measurement system 30. Surface plate 12, as is described above, can be moved using vibration isolators 14.

Also, in the case grating RG1 (that is, slider 10) is inclined with respect to the XY plane, position information on the mark acquired using mark detection system MDS may be corrected, based on the positioning error caused by the inclination.

The second position measurement system 50, as is shown in FIGS. 4, 5A, and 5B, has a pair of head sections 52A and 52B provided at the lower surface of one end and the other end in the longitudinal direction of head mounting member 51 previously described, and scale members 54A and 54B that are placed facing head sections 52A and 52B. The upper surface of scale members 54A and 54B is to be the same height as the surface of wafer W held by wafer holder WH. On each of the upper surfaces of scale members 54A and 54B, reflection type two-dimensional gratings RG2a and RG2b are formed. Two-dimensional gratings (hereinafter shortly referred to as gratings) RG2a and RG2b both include a reflective diffraction grating (X diffraction grating) whose periodic direction is in the X-axis direction and a reflective diffraction grating (Y diffraction grating) whose periodic direction is in the Y-axis direction. The pitch between the grid lines of the X diffraction grating and the Y diffraction grating is set to, for example, 1 μm.

Scale members 54A and 54B consist of a material having a low thermal expansion, e.g., a zero thermal expansion material, and are each fixed on surface plate 12 via support members 56, as is shown in FIGS. 5A and 5B. In the embodiment, dimensions of scale members 54A and 54B and support members 56 are decided so that gratings RG2a and RG2b face head sections 52A and 52B with a gap of around several mm in between.

Figure 7:
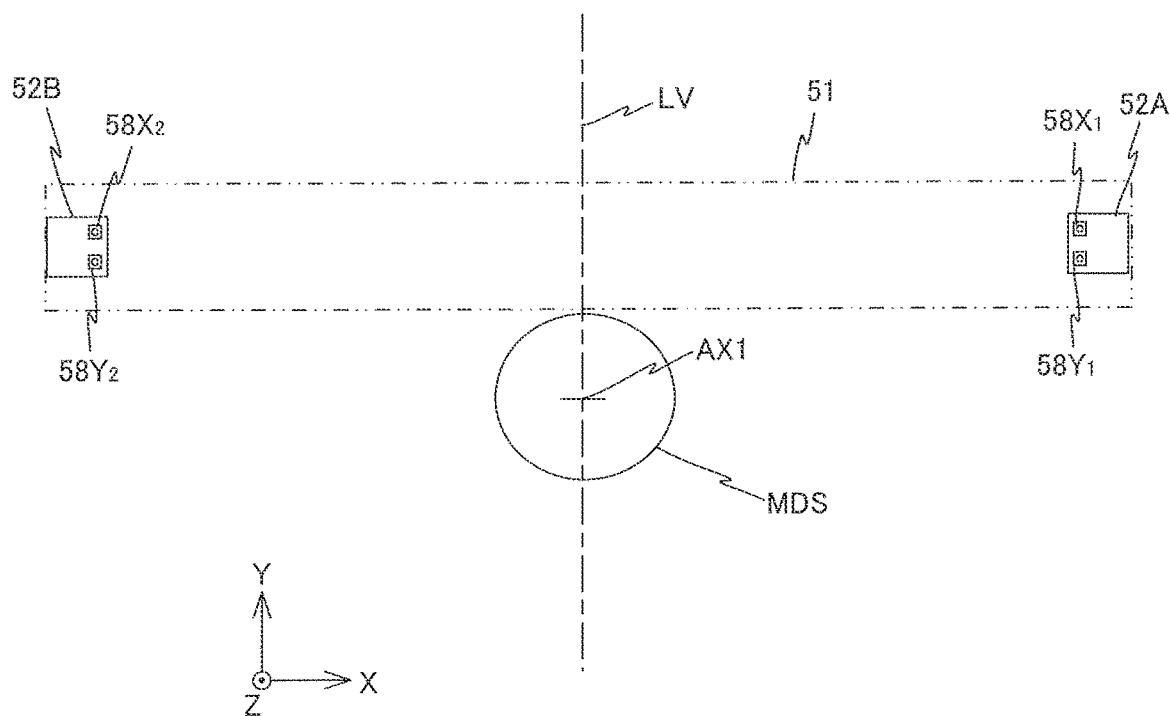
FIG. 7 is a view used to explain a structure of a second position measurement system.

As is shown in FIG. 7, one head section 52A fixed to the lower surface at the end on the +X side of head mounting member 51 includes an XZ head $58X_1$ whose measurement direction is in the X-axis and the Z-axis directions and a YZ head $58Y_1$ whose measurement direction is in the Y-axis and the Z-axis directions housed in the same housing. XZ head $58X_1$ (to be more accurate, an irradiation point on grating RG2a of the measurement beam emitted by XZ head $58X_1$) and YZ head $58Y_1$ (to be more accurate, an irradiation point on grating RG2a of the measurement beam emitted by YZ head $58Y_1$) are placed on the same straight line parallel to the Y-axis.

The other head section 52B is placed symmetric to head section 52A with respect to a straight line (hereinafter called a reference axis) LV which passes through optical axis AX1 of mark detection system MDS and is parallel to the Y-axis, however, the structure is similar to that of head section 52A. That is, head section 52B has XZ head $58X_2$ and YZ head $58Y_2$ placed symmetric to XZ head $58X_1$ and YZ head $58Y_1$ with respect to reference axis LV, and the irradiation points of the measurement beams irradiated on grating RG2b from each of the XZ head $58X_2$ and YZ head $58Y_2$ set on the same straight line parallel to the Y-axis Head sections 52A and 52B structure an XZ linear encoder which measures position in the X-axis direction (X position) and position in the Z-axis direction (Z position) of gratings RG2a and RG2b and a YZ linear encoder which measures position in the Y-axis direction (Y position) and Z position, using scale members 54A and 54B, respectively. Gratings RG2a and RG2b, here, are formed on the upper surface of scale members 54A and 54B which are each fixed on surface plate 12 via support members 56, and head sections 52A and 52B are provided at head mounting member 51 which is integral with mark detection system MDS. As a result, head sections 52A and 52B measure the position (positional relation between mark detection system MDS and surface plate 12) of surface plate 12 with respect to mark detection system MDS. In the description below, for the sake of convenience, XZ linear encoder and YZ linear encoder will be described as XZ linear encoders $58X_1$ and $58X_2$ and YZ linear encoders $58Y_1$ and $58Y_2$ (refer to FIG.

8), using the same reference code as XZ heads $58X_1$ and $58X_2$ and YZ heads $58Y_1$ and $58Y_2$.

In the embodiment, XZ linear encoder $58X_1$ and YZ linear encoder $58Y_1$ structure a four-axis encoder $58_1$ (refer to FIG. 8) that measures position information in each of the X-axis, the Y-axis, the Z-axis, and the θx directions with respect to mark detection system MDS of surface plate 12. Similarly, XZ linear encoder $58X_2$ and YZ linear encoder $58Y_2$ structure a four-axis encoder $58_2$ (refer to FIG. 8) that measures position information in each of the X-axis, the Y-axis, the Z-axis, and the θX directions with respect to mark detection system MDS of surface plate 12. In this case, position information in the θy direction of surface plate 12 with respect to mark detection system MDS is obtained (measured), based on position information in the Z-axis direction with respect to mark detection system MDS of surface plate 12 measured by each of the four-axis encoders $58_1$ and $58_2$, and position information in the θz direction of surface plate 12 with respect to mark detection system MDS is obtained (measured), based on position information in the Y-axis direction with respect to mark detection system MDS of surface plate 12 measured by each of the four-axis encoders $58_1$ and $58_2$.

Accordingly, four-axis encoder $58_1$ and four-axis encoder $58_2$ structure the second position measurement system 50 which measures position information in directions of six degrees of freedom of surface plate 12 with respect to mark detection system MDS, namely, measures information on relative position in directions of six degrees of freedom between mark detection system MDS and surface plate 12. The information on relative position in directions of six degrees of freedom between mark detection system MDS and surface plate 12 measured by the second position measurement system 50 is supplied at all times to controller $60_i$, and based on this information on relative position, controller $60_i$ controls the actuators of the three vibration isolators 14 real time so that the detection point of the first position measurement system 30 is in a desired position relation with respect to the detection center of mark detection system MDS, or to be more specific, the position in the XY plane of the detection point of the first position measurement system 30 coincides with the detection center of mark detection system MDS such as at a run level, and the surface of wafer W on slider 10 also coincides with the detection position of mark detection system MDS. Note that if the detection point of the first position measurement system 30 can be controlled to be in a desired position relation with respect to the detection center of mark detection system MDS, the second position measurement system 50 does not have to measure the information on relative position in all directions of six degrees of freedom.

As is obvious from the description on the first position measurement system 30 described earlier and the description on the second position measurement system 50, in measurement device $100_i$, the first position measurement system 30 and the second position measurement system 50 structure a position measurement system that measures position information in directions of six degrees of freedom of slider 10 with respect to mark detection system MDS.

FIG. 8 shows a block diagram of an input output relation of controller $60_i$, which mainly structures a control system of each measurement device $100_i$ (i=1 to 3) of measurement system $500_1$ (and a control system of each measurement device $100_i$ (i=4 to 6 of measurement system $500_2$). Controller $60_i$ includes a workstation (or a microcomputer) or the like, and has overall control over each part that structures measurement device $100_i$. As is shown in FIG. 8, measurement device $100_i$, is equipped with wafer carrying system $70_i$ that has a part of the system placed inside a chamber along with component parts shown in FIG. 4. Wafer carrying system $70_i$, as is previously described, consists of, for example, a horizontal multi-joint arm robot.

Measurement system $500_2$, which is structured similarly to measurement system $500_1$ described above, is equipped with; a chamber similar to chamber 502 where the three measurement devices $100_i$ (i=4 to 6) and a carry system 521 are housed, and the EFEM system arranged at one side of the chamber.

In the embodiment, as is obvious from FIG. 1, while measurement system $500_2$ is not connected in-line with exposure apparatus 200 and C/D 300 similarly to measurement system $500_1$, measurement system $500_2$ may be connected in-line to at least one of exposure apparatus 230 and C/D 300. In the embodiment, although it is omitted in the drawings, a track rail for OHT is provided near the ceiling of the clean room directly above the three loading ports 514 of EFEM system 510 of measurement system $500_2$. The OHT carries in FOUP 520 onto loading port 514. Also, each of the three measurement devices $100_i$ (i=4 to 6) that measurement system $500_2$ is equipped with is structured similarly to measurement devices $100_i$ (i=1 to 3) described earlier.

Figure 9:
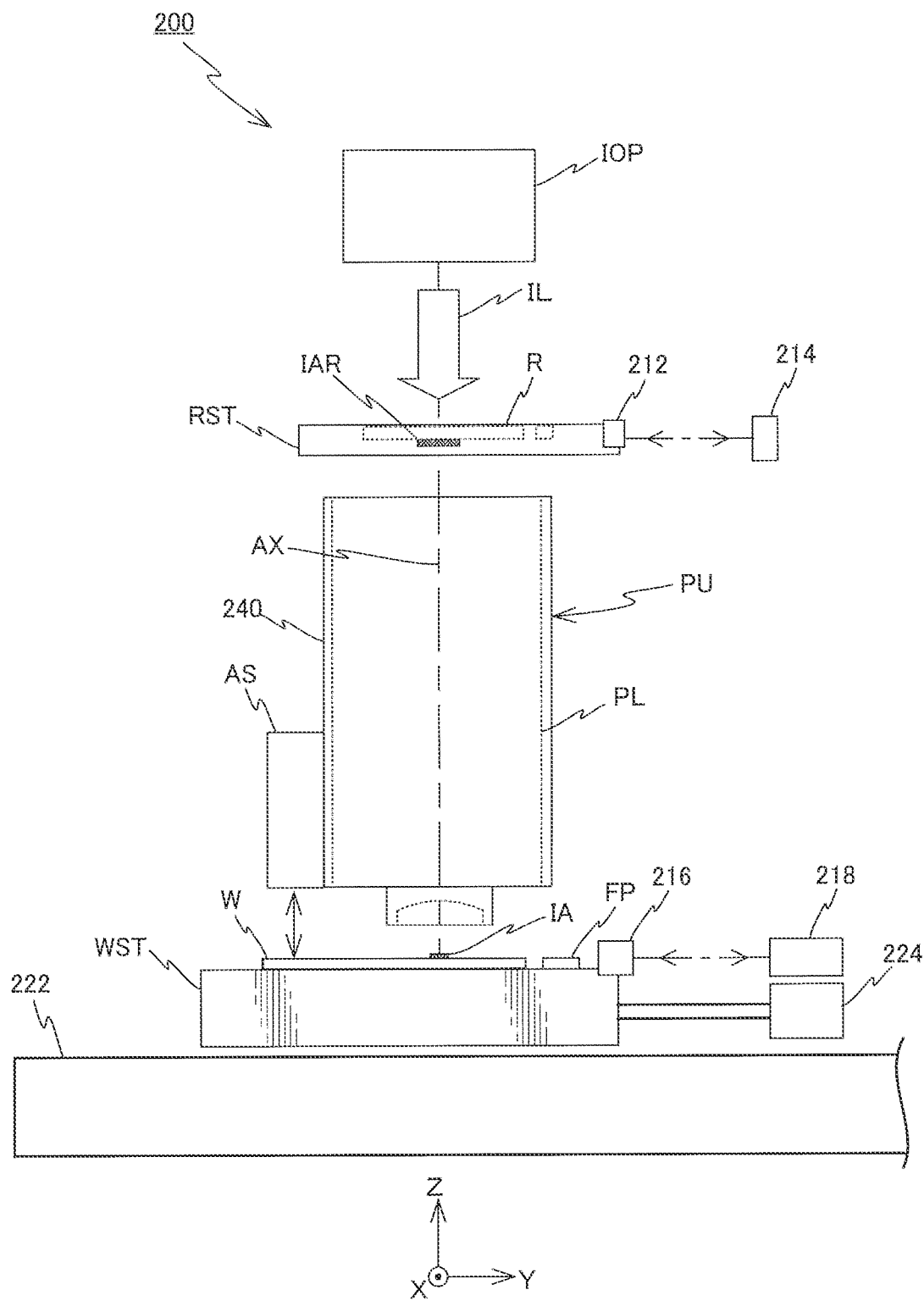
FIG. 9 is a view schematically showing an exposure apparatus shown in FIG. 1.

Exposure apparatus 200, as an example, is a projection exposure apparatus (scanner) of a step-and-scan method. FIG. 9 shows the inside of the chamber of exposure apparatus 200, with component parts partly omitted.

Exposure apparatus 200, as is shown in FIG. 9, is equipped with an illumination system IOP, a reticle stage RST that holds a reticle R, a projection unit PU that projects an image of a pattern formed on reticle R on wafer W coated with a sensitive agent (resist), a wafer stage WST that moves within the XY plane holding wafer W, a control system for these parts and the like. Exposure apparatus 200 is equipped with a projection optical system PL that has an optical axis AX parallel to the Z-axis direction.

Illumination system IOP includes a light source, and an illumination optical system connected to the light source via a light transmitting optical system, and illuminates a slit shaped illumination area IAR set (limited) by a reticle blind (masking system) on reticle R extending narrowly in the X-axis direction (orthogonal direction of the page surface in FIG. 9) with an almost uniform illuminance. The structure of illumination system IOP is disclosed in, for example, U.S. Patent Application Publication No. 2003/0025890 and the like. Here, as illumination light IL, an ArF excimer laser beam (wavelength 193 nm) is used as an example.

Reticle stage RST is arranged below illumination system IOP in FIG. 9. Reticle stage RST can be finely moved within a horizontal plane (XY plane) on a reticle stage surface plate not shown by a reticle stage drive system 211 (not shown in FIG. 9, refer to FIG. 10) which includes a linear motor and the like, and can also be moved in predetermined strokes in a scanning direction (the Y-axis direction which is the lateral direction within the page in FIG. 9).

On reticle stage RST, reticle R is mounted that has a pattern area formed on a surface on the −Z side (pattern surface) and a plurality of marks formed whose positional relation with the pattern area is known. Position information (including rotation information in the θz direction) within the XY plane of reticle stage RST is constantly detected by a reticle laser interferometer (hereinafter referred to as "reticle interferometer") 214 via a movable mirror 212 (or a reflection surface formed on an end surface of reticle stage RST), for example, at a resolution of around 0.25 nm.

Figure 10:
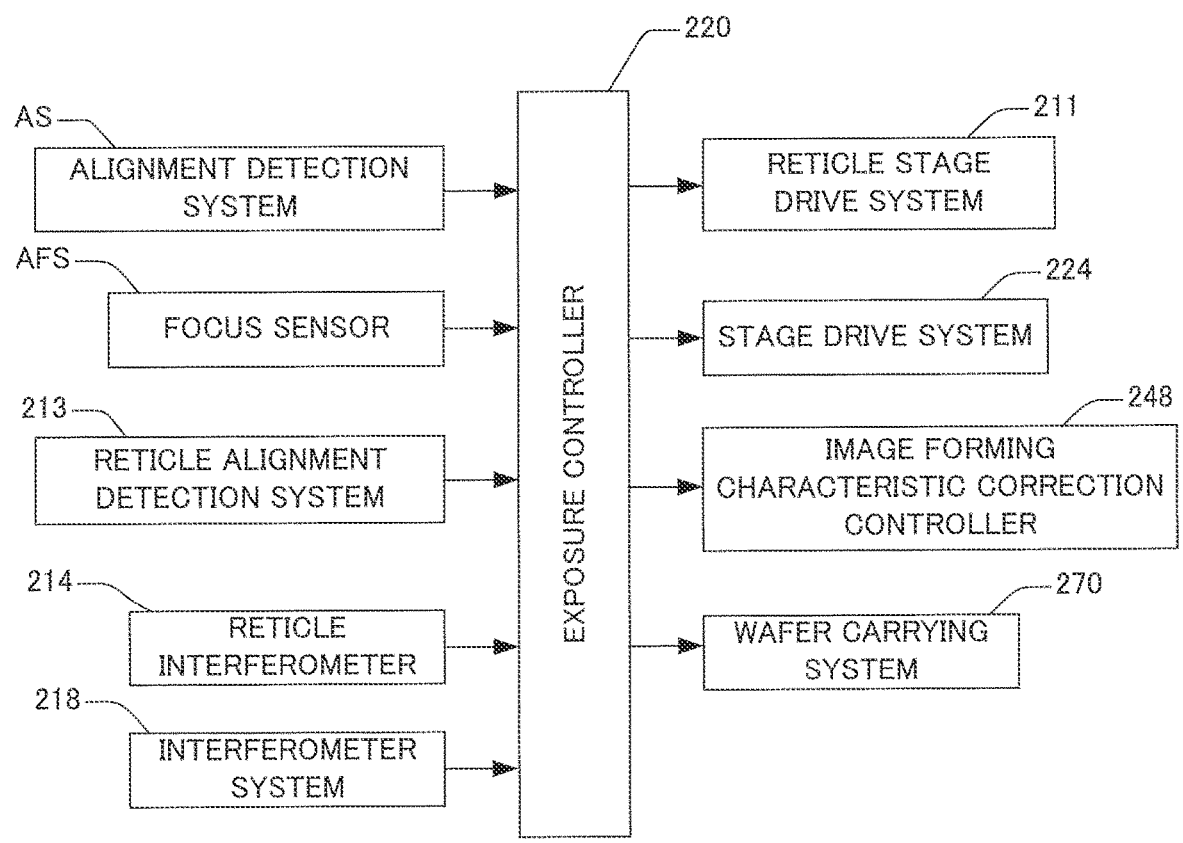

Measurement information on reticle interferometer 214 is supplied to exposure controller 220 (refer to FIG. 10). Note that measurement of the position information within the XY plane of reticle stage RST described above may be performed by an encoder, instead of reticle interferometer 214.

Projection unit PU is arranged below reticle stage RST in FIG. 9. Projection unit PU includes a barrel 240, and projection optical system PL held within barrel 240. Projection optical system PL, for example, is double telecentric, and has a predetermined projection magnification (e.g., ¼ times, ⅕ times, ⅛ times or the like). Reticle R is arranged so that its pattern surface almost coincides with a first surface (object plane) of projection optical system PL, and wafer W whose surface is coated with a resist (sensitive agent) is arranged on a second surface (image plane) side of projection optical system PL. Therefore, when illumination area IAR on reticle R is illuminated with illumination light IL from illumination system. IOP, illumination light IL having passed through reticle R forms a reduced image (a reduced image of a part of the circuit pattern) of the circuit pattern of reticle R within illumination area IAR on an area (hereinafter also called an exposure area) IA on wafer W conjugate with illumination area IAR, via projection optical system PL. Then, by reticle stage RST and wafer stage WST being synchronously driven, reticle R is relatively moved in the scanning direction (the Y-axis direction) with respect to illumination area IAR (illumination light IL) and wafer W is relatively moved in the scanning direction (the Y-axis direction) with respect to exposure area IA (illumination light IL), so that scanning exposure of a shot area (divided area) on wafer W is performed and the pattern of reticle P is transferred onto the shot area.

As projection optical system PL, as an example, a refraction system is used consisting of a plurality of only refraction optical elements (lens elements), e.g., around 10 to 20, arranged along optical axis AX parallel to the Z-axis direction. Of the plurality of lens elements structuring projection optical system PL, the plurality of lens elements on the object surface side (reticle R side) is a movable lens that can be shifted in the Z-axis direction (the optical axis direction of projection optical system PL) and is movable in a tilt direction (that is, the θx direction and the θy direction) with respect to the XY plane, by driving elements not shown, such as, for example, a piezoelectric element and the like. Then, by an image forming characteristic correction controller 248 (not shown in FIG. 9, refer to FIG. 10) independently adjusting applied voltage with respect to each driving element based on instructions from exposure controller 220, each of the movable lenses is moved individually so that various image forming characteristics (magnification, distortion aberration, astigmatism, coma aberration, curvature of field and the like) are to be adjusted Note that instead of, or in addition to moving the movable lenses, a structure may be employed in which an airtight chamber is provided in between specific lens elements which are adjacent inside barrel 240, and the pressure of gas inside the airtight chamber is controlled by image forming characteristic correction controller 248, or a structure may be employed in which a center wavelength of illumination light IL can be shifted by image forming characteristic correction controller 248. Such structures may also allow the image forming characteristics of projection optical system PL to be adjusted.

Wafer stage WST is moved on a wafer stage surface plate 222 in predetermined strokes in the X-axis direction and the Y-axis direction by a stage drive system 224 (indicated as a block for convenience in FIG. 9) which includes a planar motor, a linear motor or the like, and is also finely moved in the Z-axis direction, the θx direction, the θy direction, and the θz direction. On wafer stage WST, wafer W is held by vacuum chucking or the like via a wafer holder (not shown). In the embodiment, the wafer holder is to be able to hold a 300 mm wafer by suction. Note that, instead of wafer stage WST, a stage device can be used that is equipped with a first stage which moves in the X-axis direction, the Y-axis direction and the θz direction, and a second stage which finely moves in the Z-axis direction, the θx direction, and the θy direction on the first stage. Note that one of wafer stage WST and the wafer holder of wafer stage WST or both may be called "a second substrate holding member."

Position information (including rotation information (yawing amount (rotation amount θz in the θz direction), pitching amount (rotation amount θx in the θx direction), and rolling amount (rotation amount θy in the θy direction)) within the XY plane of wafer stage WST is constantly detected by a laser interferometer system (hereinafter shortly referred to as interferometer system) 218 via a movable mirror 216 (or a reflection surface formed on an end surface of wafer stage WST) at a resolution of, for example, around 0.25 nm. Note that measurement of the position information within the XY plane of wafer stage WST may be performed by an encoder system, instead of interferometer system 218.

Measurement information on interferometer system 218 is supplied to exposure controller 220 (refer to FIG. 10). Exposure controller 220 controls the position (including rotation in the θz direction) within the XY plane of wafer stage WST via stage drive system 224, based on measurement information on interferometer system 218.

Also, although it is omitted in FIG. 9, position in the Z-axis direction and tilt amount of the surface of wafer W is measured by a focus sensor AFS (refer to FIG. 10) consisting of a multi-point focal point detection system of an oblique incidence method disclosed in, for example, U.S. Pat. No. 5,446,332 and the like. Measurement information on this focus sensor AFS is also supplied to exposure controller 220 (refer to FIG. 10).

Also, on wafer stage WST, a fiducial, plate FP is fixed whose surface is at the same height as the surface of wafer W. On the surface of this fiducial plate FP, a first fiducial mark used for base line measurement and the like of an alignment detection system AS and a pair of second fiducial marks detected with a reticle alignment detection system to be described later on are formed.

On a side surface of barrel 240 of projection unit PU, alignment detection system AS is provided that detects alignment marks formed on wafer W or the first fiducial mark. As alignment detection system AS, as an example, an FIA (Field Image Alignment) system is used, which is a kind of an image forming alignment sensor of an image processing method that measures a mark position by Irradiating a broadband (wide band) light such as a halogen lamp on a mark and performing image processing on an image of this mark. Note that instead of alignment detection system AS of the image processing method, or along with alignment detection system AS, a diffracted light interference type alignment system may also be used.

In exposure apparatus 200, furthermore above reticle stage RST, a pair of reticle alignment detection systems 213 (not shown in FIG. 9, refer to FIG. 10) that can simultaneously detect a pair of reticle marks at the same Y position on reticle R mounted on reticle stage RST is provided spaced apart by a predetermined distance in the X-axis direction. Detection results of the marks by reticle alignment detection system 213 are supplied to exposure controller 220.

FIG. 10 shows an input output relation of exposure controller 220 in a block diagram. As is shown in FIG. 10, other than each of the components described above, exposure apparatus 200 is equipped with a wafer carrying system 270 and the like that carries the wafers, connected to exposure controller 220. Exposure controller 220 includes a microcomputer, a workstation or the like, and has overall control over the whole apparatus including each of the components described above. Wafer carrying system 270, for example, consists of a horizontal multi-joint arm robot.

Referring back to FIG. 1, although it is omitted in the drawing, C/D 300 is equipped with, for example, a coating section in which coating of a sensitive agent on a wafer is performed, a developing section in which the wafer can be developed, a baking section that performs pre-bake (PB) and pre-develop bake (post-exposure bake: PEB), and a wafer carrying system (hereinafter referred to as a C/D inner carrying system for the sake of convenience). C/D 300 is furthermore equipped with a temperature controlling section 330 that can control the temperature of the wafer. Temperature controlling section 330 is normally a cooling section, and is equipped, for example, with a flat plate (temperature controlling device) called a cool plate. The cool plate is cooled, for example, by circulating cooling water Other than this, thermoelectric cooling by the Peltier effect may be used in some cases.

Analysis device 3000 performs various analyses and operations, in accordance with instructions from host computer 2000. In one example, analysis device 3000, for example, performs an operation according to a predetermined program, based on measurement results of overlay displacement acquired, for example, in the manner described later on by measurement system $500_2$, and calculates correction values which are to be fed back to exposure apparatus 200.

In substrate processing system 1000 according to the embodiment, exposure apparatus 200 and C/D 300 both are equipped with a bar code reader (not shown), and while wafers are being carried by each of wafer carrying system 270 (refer to FIG. 10) and the C/D inner carrying system (not shown), the bar code reader appropriately reads identification information on each wafer, such as wafer number, lot number and the like. In the description below, to simplify the explanation, description related to reading the identification information for each wafer using the bar code reader is to be omitted.

Figure 11:
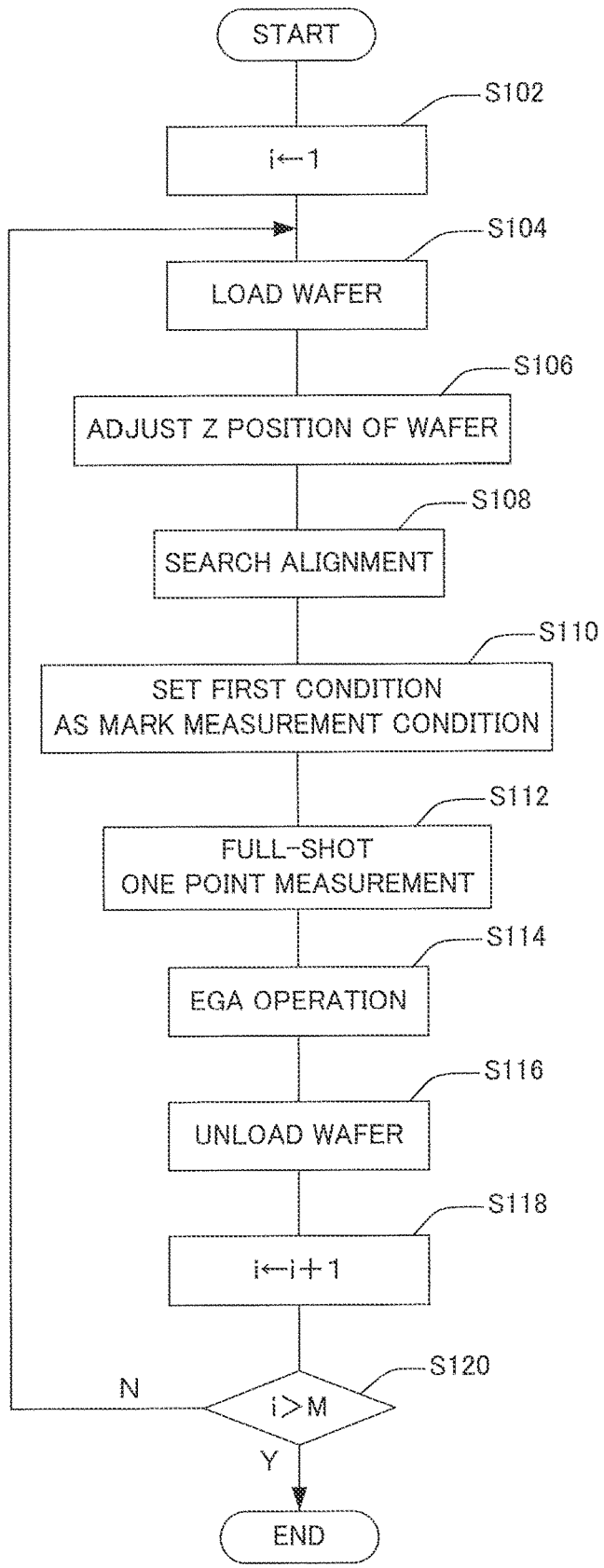
FIG. 11 is a flowchart corresponding to a processing algorithm of a controller $60_i$ when processing wafers in one lot.

Next, in the three measurement devices $100_1$ to $100_3$ of one of the measurement devices $500_1$, an operation of each measurement device $100_i$ when concurrently processing a plurality of wafers (e.g., 25 pieces of wafers) included in the same lot is to be described, based on a flowchart in FIG. 11 that corresponds to a processing algorithm of controller $60_i$ of measurement device $100_i$. Here, as an example, of the 25 pieces of wafer in the same lot, measurement device $100_1$ is to be in charge of measurement processing of 9 pieces, measurement device $100_2$ is to be in charge of 8 pieces, and measurement device $100_3$ is to be in charge of 8 pieces. Note that the plurality of pieces (25 pieces) of wafers in the same lot may be apportioned to two measurement devices of measurement device $100_1$, measurement device $100_2$, and measurement device $100_3$. Also, as is described above, the plurality of pieces of wafers included in the same lot may, or may not be apportioned equally.

As a premise, wafer A serving as a measurement target of measurement device $100_i$ (i=1 to 3) is to be a 300 mm wafer, and a wafer on which processing (such as etching, oxidation/diffusion, ion implantation, and flattening (CMP)) in the pre-process of wafer processing has been applied, and a wafer which is not yet coated by a resist. On wafer W serving as a measurement target, by exposure performed earlier on the previous layers, a plurality of, e.g., I (as an example, I=98) divided areas called shot areas (hereinafter called shots) are formed arranged in a matrix shape, and on street lines surrounding each shot or street lines inside each shot (in the case a plurality of chips are made in one shot), a plurality of types of marks, such as search alignment marks (search marks) for search alignment, wafer alignment marks (wafer marks) for fine alignment and the like are to be provided. The plurality of types of marks is formed, along with the shots. In the embodiment, as search marks and wafer marks, two-dimensional marks are to be used.

Also, by an operator of measurement device $100_i$, information necessary for alignment measurement to wafer W is to be input in advance via an input device (not shown) and stored in a memory of controller $60_i$. Here, the information necessary for alignment measurement includes various information such as, thickness information on wafer W, flatness information on wafer holder WH, and design information on shots and on arrangement of alignment marks on wafer W.

Processing corresponding to the flowchart in FIG. 11 described below is performed by the three measurement devices $100_1$ to $100_3$, concurrently and individually.

A processing algorithm corresponding to a flowchart in FIG. 11 starts, for example, when the operator or host computer 2000 instructs the measurement to be started. On this operation, of the 25 pieces of wafers included in one lot, the pieces of wafers that each of the measurement devices is in charge are to be housed within a wafer carrier at a predetermined position inside chamber $101_i$ of measurement device $100_i$. Other than this, concurrently with the measurement processing by the three measurement devices $100_i$, each of the wafers of the one lot may be carried sequentially into measurement device $100_i$. For example, under the control of measurement system controller $530_1$ that controls robot 516, carrying member 524 and carrying member 526 and the like, for example, 25 pieces of wafers included in one lot inside a predetermined FOUP 520 may be taken out one by one sequentially by robot 516, and then be sequentially carried to a predetermined delivery position between each of the three measurement devices $100_i$ by carrying member 524. In this case the processing algorithm corresponding to the flowchart in FIG. 11 starts when measurement system controller $530_1$ gives instructions to each of the controllers $60i$ and robot 516 to start carriage.

Note that, in the case exposure apparatus 200 and measurement system $500_1$ are connected, instructions for starting measurement may be given from exposure controller 220 of exposure apparatus 200 to measurement system controller $530_1$, without going through host computer 2000.

Note that measurement device $100_i$ is equipped with a bar code reader (not shown) similarly to exposure apparatus 200 and C/D 300, and identification information on each wafer, e.g., wafer number, lot number and the like, is appropriately read by the bar code reader during the carriage of the wafer by wafer carrying system $70_i$ (refer to FIG. 8). In the description below, to simplify the explanation, description related to reading the identification information for each wafer using the bar code reader is to be omitted. Note that each of the measurement devices $100_i$ does not have to be equipped with the bar code reader. For example, the bar code reader may be arranged in carrying system 521.

First of all, in step S102, a count value i of a counter that shows the number of a measurement target wafer in a lot is initialized to 1 (i←1).

In the next step, S104, wafer W is loaded onto slider 10. This loading of wafer W is performed by wafer carrying system $70_i$ and the vertical movement member on slider 10, under the control of controller $60_i$. Specifically, wafer W is carried from the wafer carrier (or the delivery position) to an area above slider 10 at the loading position by wafer carrying system $70_i$, and then by the vertical movement member being moved upward by a predetermined amount by driver 13, wafer W is delivered to the vertical movement member. Then, after wafer carrying system $70_i$ has been withdrawn from above slider 10, by the vertical movement member being moved downward by driver 13, wafer W is mounted on wafer holder WH on slider 10. Then, vacuum pump 11 is turned on, so that wafer W loaded on slider 10 is vacuum chucked at wafer holder WH. Note that in the case each of the plurality of wafers included in one lot is sequentially carried into measurement device $100_i$ concurrently with the measurement processing by measurement device $100_i$, prior to the loading of the wafer described above, the plurality of wafers in the predetermined FOUP 520 is taken out one by one, sequentially by robot 516, and the wafers are delivered to carrying member 524 by robot 516 and then carried by carrying member 524 to a predetermined delivery position between measurement device $100_i$ to be delivered to wafer carrying system $70_i$.

In the next step, S106, position (Z position) in the Z-axis direction of wafer W is adjusted. Prior to this adjustment of the Z position, controller $60_i$ controls the internal pressure (drive force in the Z-axis direction that vibration isolator 14 generates) of the air mounts of the three vibration isolators 14 based on relative position information between mark detection system MDS and surface plate 12 regarding the Z-axis direction, the θy direction, and the θx direction measured by the second position measurement system 50, and surface plate 12 is set so that its upper surface becomes parallel to the XY plane and the Z position is at a predetermined reference position. Wafer W is considered to have uniform thickness. Accordingly, in step S106, controller $60_i$ moves surface plate 12 in the Z-axis direction and adjusts the Z position of the surface of wafer W, by adjusting the drive force in the Z-axis direction that the three vibration isolators 14 generates, such as the internal pressure (amount of compressed air) of the air mounts, so that the surface of wafer W is set within a range in which focal position of the optical system is adjustable by the auto-focus function of mark detection system MDS, based on thickness information on wafer W in the memory. Note that controller $60_i$ may perform adjustment of the Z position of the wafer surface based on detection results (output) of the focal position detection system in the case measurement unit 40 is equipped with a focal position detection system. For example, mark detection system MDS may be equipped with a focal position detection system that detects position in the Z-axis direction of the surface of wafer W via an optical element (objective optical element) at the tip. Also, the adjustment of the Z position of the surface of wafer W based on the detection results of the focal position detection system can be per formed by moving slider 10 along with surface plate 12, which is moved using vibration isolators 14. Note that a drive system 20 having a structure that can move in slider 10 not only in a direction within the XY plane but also in the Z-axis direction, the θx direction, and the θy direction may be employed, and drive system 20 may be used to move slider 10. Note that Z position adjustment of the wafer surface may include tilt adjustment of the wafer surface. By using drive system 20 to adjust tilt of the wafer surface, in the case an error (a kind of Abbe error) caused by a difference ΔZ of the Z position between the placement surface of grating RG1 and the surface of wafer W, at least one of the measures described above should be performed.

In the next step, S108, search alignment of wafer W is performed, under a measurement condition setting of a search mark determined in advance. The measurement condition of the search mark may be the sane condition as a first condition set in step S110 to be described later on, or a measurement condition more suitable for search mark measurement taking into consideration the difference between a wafer mark and a search mark.

In search alignment, for example, at least two search marks positioned in peripheral sections almost symmetrical to the center of wafer W are detected using mark detection system MDS. Controller $60_i$ controls movement of slider 10 by drive system 20, and while positioning each of the search marks within a detection area (detection field) of mark detection system MDS, acquires measurement information by the first position measurement system 30 and measurement information by the second position measurement system 50, and obtains position information on each search mark, based on detection signals when the search marks formed on wafer W is detected using mark detection system MDS and measurement information by the first position measurement system 30 (or measurement information by the second position measurement system 50).

Here, measurement of search marks is performed by irradiating a broadband light (detection light) on a search mark from the optical system of mark detection system MDS, and receiving the light generated from the search mark, which is a light of a predetermined wavelength (detection wavelength) and a diffracted light of a predetermined order (e.g. $\pm 1^{st}$ order), by a detector, and processing the photo-electrically converted signals according to a predetermined signal processing condition.

Controller $60_i$ obtains position coordinates on a reference coordinate system of the two search marks, based on detection results of mark detection system MDS (relative positional relation between the detection center (index center) of mark detection system MDS obtained from processing the photo-electrically converted signals described above under the signal processing condition described above) output from signal processor 49 and measurement values of the first position measurement system 30 (and measurement values of the second position measurement system 50) at the time of detection of each search mark. Here, the reference coordinate system is to be an orthogonal coordinate system set by measurement axes of the first position measurement system 30.

Thereafter, a residual rotation error of wafer W is calculated from the position coordinates of the two search marks, and slider 10 is finely rotated so that this rotation error becomes almost zero. This completes the search alignment, of wafer W. Note that since wafer W is actually loaded on slider 10 in a state where pre-alignment has been performed, the center position displacement of wafer W is small enough to be ignored, and the residual rotation error is extremely small.

In the next step, S110, a first condition instructed from measurement system controller $530_1$ is set as the measurement condition (alignment measurement condition) of a mark including at least one of an irradiating condition for irradiating a detection beam on the mark, a light receiving condition for receiving light generated from the mark, and a signal processing condition for processing a photo-electrically converted signal obtained by receiving the light generated from the nark.

In step S110, at least one of an irradiating condition, a light receiving condition, and a signal processing condition that is switchable and suitable for detection of the wafer mark is set as the first condition. Here, as an example of the first condition, for example, optimization is to be performed of the wavelength of the illumination light in mark detection system MDS. Also, as an example, here, the wafer mark formed on wafer W subject to processing is a mark formed on the outermost layer of pattern layers (layers) laminated on wafer W, and to observe this, the wavelength of a specific observation light does not have to be specified, and a broadband white light generated by an Illumination light source such as a halogen lamp may be used for observation. Accordingly, controller $60_i$ performs setting (control) of the wavelength selection mechanism, so that a filter that transmits a light beam (white light) having a wavelength of 530 to 800 nm in the wavelength selection mechanism of mark detection system MDS is to be selected.

In the next step S112, alignment measurement on all wafers (full-shot one point measurement, or in other words, full-shot EGA measurement) is performed under the setting of the first condition, that is, one wafer mark is measured for each of the 98 shots. Specifically, controller $60_i$ obtains position coordinates on the reference coordinate system of wafer marks on wafer W, that is, position coordinates of the shots, similarly to the measurement of position coordinates of each search alignment mark at the time of search alignment described earlier. However, in this case, by irradiating the wafer mark with detection light of a broadband wavelength determined by the first condition, via the optical system of mark detection system MDS, at a light amount of a default setting in a conventional illumination condition (σ value), receiving a diffracted light of a predetermined order (e.g., $\pm 1^{st}$ order) generated from the wafer mark by a detector, and processing the photo-electrically converted signal according to a signal processing condition (processing algorithm) of a default setting, detection results of the mark used to calculate position coordinates on a reference coordinate system of the wafer mark on wafer W can be obtained.

However, in this case, different from the time of search alignment, measurement information of the second position measurement system 50 is used without exception when calculating position coordinates of the shots. The reason, as is described earlier, is that controller $60_i$ controls the actuators of the three vibration isolators 14 real time based on measurement information of the second position measurement system 50, so that position within the XY plane of detection points of the first position measurement system 30 coincides with the detection center of mark detection system MDS, for example, at a nm level, and also the surface of wafer W on slider 10 coincides with the detection position of mark detection system MDS. However, at the time of detection of the wafer marks, since there is no assurance that the position within the XY plane of the detection points of the first position measurement system 30 coincides with the detection center of mark detection system MDS at, for example, a nm level, it is necessary to calculate the position coordinates of the shots, taking into consideration position displacement between the detection point and the detection center as an offset. For example, by correcting the detection results of mark detection system MDS or the measurement values of the first position measurement system 30 using the offset described above, position coordinates on the reference coordinate system of the wafer marks on wafer W to be calculated can be corrected.

Here, on this full-shot one point measurement, controller $60_i$ moves slider 10 (wafer W) in a direction in at least one of the X-axis direction find the Y-axis direction via drive system 20 based on measurement information on the first position measurement system 30 and measurement information on the second position measurement system 50, and positions the wafer mark within a detection area of mark detection system MDS. That is, the full-shot one point measurement is performed, moving slider 10 within the XY plane with respect to mark detection system MDS by a step-and-repeat method.

Note that in the case measurement unit 40 is equipped with a focal position detection system, controller $60_i$ may perform adjustment of the Z position of the wafer surface, based on detection results (output) of the focal position detection system, similarly to the description in step S106.

On alignment measurement (full-shot one point measurement) to all wafers in step S112, when slider 10 is moved within the XY plane, while an offset load acts on surface plate 12 with the movement, in the embodiment, controller $60_i$ individually performs feedforward control on the three vibration isolators 14 so that the influence of the offset load is canceled out according to the X, Y coordinate positions of the slider included in the measurement information on the first position measurement system 30, and individually controls the drive force in the Z-axis direction that each of the vibration isolators 34 generates. Note that controller $60_i$ may individually perform feedforward control of the three vibration isolators 14 so that the influence of the offset load is canceled out by predicting the offset load acting on surface plate 12 based on information on a known moving route of slider 10, without using the measurement information on the first position measurement system 30. Also, in the embodiment, since information on unevenness (hereinafter called holder flatness information) of a wafer holding surface (a surface set by the upper end of a plurality of pins of a pin chuck) of wafer holder WH is to be obtained in advance by experiment or the like, on alignment measurement (e.g., full-shot one point measurement), when slider 10 is moved, controller $60_i$ finely adjusts the Z position of surface plate 12 by performing feedforward control of the three vibration isolators 14 so that an area including measurement target wafer marks on the wafer W surface is smoothly positioned within a range of the focal depth of the optical system of mark detection system MDS, based on the holder flatness information Mote that one of the feedforward control to cancel out the influence of the offset load acting on surface plate 12 and the feedforward control based on the holder flatness information described above, or both of the feedforward controls do not have to be executed.

Note that in the casa magnification of mark detection system MDS is adjustable, the magnification may be set low on search alignment, and the magnification may be set high on alignment measurement. Also, in the case center position displacement and residual rotation error of wafer W loaded on slider 10 are small enough to be ignored, step S108 may be omitted.

In the full-shot one point measurement in step S112, actual measurement values are to be detected of position coordinates of the sample shot areas (sample shots) in the reference coordinate system used in the EGA operation to be described later on. Sample shots, among all shots on wafer W, refer to specific shots of a plurality of numbers (at least three) decided in advance to be used in the EGA operation which will be described later on. Note that in the full-shot one point measurement, all shots on wafer W are to be sample shots. After step S112, the processing proceeds to step S114.

In step S114, EGA operation is performed using position information on wafer marks measured in step S112. EGA operation, refers to a statistical calculation performed after measurement (EGA measurement) of wafer marks described above for obtaining a coefficient of a model formula which expresses a relation between a position coordinate of a shot and a correction amount of the position coordinate of the shot using a statistical calculation such a least squares method, based on data on a difference between a design value and the actual measurement value of a position coordinate of a sample shot.

In the embodiment, as an example, the following model formula is used to calculate the correction amount from the design value of the position coordinate of the shot.

$$\left.\begin{aligned} dx &= a_0 + a_1 \cdot X + a_2 \cdot Y + a_3 \cdot X^2 + a_6 \cdot X \cdot Y + a_5 \cdot Y^2 + \\ &\quad a_6 \cdot X^3 + a_7 \cdot X^2 Y + a_8 \cdot X \cdot Y^2 + a_9 \cdot Y^3 \ldots \\ dy &= b_0 + b_1 \cdot X + b_2 \cdot Y + b_3 \cdot X^2 + b_4 \cdot X \cdot Y + b_5 \cdot Y^2 + \\ &\quad b_6 \cdot X^3 + b_7 \cdot X^2 \cdot Y + b_8 \cdot X \cdot Y^2 + b_9 \cdot Y^3 \ldots \end{aligned}\right\} \quad (1)$$

Here, dx and dy are correction amounts in the X-axis direction and the Y-axis direction from design values of position coordinates of a shot, and X and Y are design position coordinates of the shot in a wafer coordinate system whose origin is set at the center of wafer W. That is, formula (1) described above is a polynomial expression of design position coordinates X and Y of each shot in the wafer coordinate system whose origin is the center of the wafer, and is a model formula that expresses a relation between position coordinates X and Y and the correction amounts (alignment correction component) dx and dy of the position coordinates of the shot. Note that in the embodiment, since rotation between the reference coordinate system and the wafer coordinate system is canceled by the search alignment described earlier, the description below will be made describing the coordinate systems as the reference coordinate system, without making any distinction in particular between the reference coordinate system and the wafer coordinate system.

When using model formula (1), correction amount of the position coordinates of a shot can be obtained from coordinate positions X and Y of the shot of wafer W. However, to calculate this correction amount, coefficients $a_0, a_1, \ldots, b_0, b_1, \ldots$ have to be obtained. After EGA measurement, coefficients $a_0, a_1, \ldots, b_0, b_1, \ldots$ of formula (1) described above are obtained using statistical calculation such as the least squares method, based on data on a difference between the design value and the actual measurement value of the position coordinate of the sample shot.

After coefficients $a_0, a_1, \ldots, b_0, b_1, \ldots$ of formula (1) are decided, by substituting design position coordinates X and Y of each shot (divided area) in the wafer coordinate system into model formula (1) whose coefficients have been decided, and obtaining correction amounts dx and dy of the position coordinates of each shot, a true arrangement (not only linear components but also including nonlinear components as deformation components) can be obtained for the plurality of shots (divided areas) on wafer W.

Now, in the case of wafer W on which exposure has already been performed, the waveform of detection signals obtained from the measurement results is not always favorable for all wafer marks due to the influence of the process so far. When positions of wafer marks having such unfavorable measurement results (waveform of detection signals) are included in the EGA operation described above, position error of the wafer marks having such unfavorable measurement results (waveform of detection signals) has an adverse effect on the calculation results of coefficients $a_0, a_1, \ldots, b_0, b_1, \ldots$.

Therefore, in the embodiment, signal processor 49 is to send only measurement results of the wafer marks with favorable measurement results to controller $60_i$, and controller $60_i$ is to execute the EGA operation described above, using positions of all the wafer marks whose measurement results have been received. Note that orders of the polynomial expression in formula (1) described above are not limited in particular. Controller $60_i$ associates the results of EGA operation with identification information (e.g. wafer number, lot number) of the wafers and stores the results as an alignment history data file in an inner or outer storage device. Note that information other than the results of the EGA operation (e.g., information on marks used in the EGA operation) may also be included in the alignment history data file.

When the EGA operation is finished in step S114, the processing proceeds to step S116 where wafer W is unloaded from slider 10. This unloading is performed by wafer carrying system $70_i$ and the vertical movement member on slider 10 under the control of controller $60_i$, in a procedure opposite to the loading procedure in step S104. Note that in the case each of a predetermined number of wafers that measurement device $100_i$ is in charge of, the wafers being a part of the same lot, is sequentially carried into measurement device $100_i$ and is sequentially carried out from measurement device $100_i$ concurrently with the measurement processing by measurement device $100_i$, wafer W which has finished measurement is delivered to carrying member 526 by wafer carrying system $70_i$, carried to the unloading side wafer delivery position described earlier by carrying member 526, and then is to be returned into the predetermined FOPU 520 by robot 516.

In the next step S118, after count value i of the counter is incremented by 1 (i←i+1), the processing proceeds to step S120 in which the judgment is made of whether or not count value i is larger than a number M of the wafers that measurement device $100_i$ is in charge of in the same lot. The number M is 9 in measurement device $100_1$, and 8 in measurement devices $100_2$ and $100_3$.

Then, in the case the judgment in this step S120 is negative, the judgment is made that processing to all the wafers that measurement device $100_i$ is in charge of is not yet complete, therefore, the processing returns to step S104, and thereinafter the processing from step S104 to step S120 (including making judgment) is repeated until the judgment in step S120 is affirmed.

Then, when the judgment in step S120 is affirmed, this completes the series of processing in this routine, according to the judgment that the processing to all the wafers that measurement device $100_i$ is in charge of has been completed.

As is obvious from the description so far, according to measurement device $100_i$, position information (coordinate position information) of at least one each of the wafer marks is measured for each of I (e.g., 98) shots on wafer W upon alignment measurement, and by using the measured position information (excluding position information on wafer marks having unfavorable measurement results) in statistical calculation such as the least squares method, coefficients $a_0, a_1, \ldots, b_0, b_1, \ldots$ of formula (1) above are obtained.

Accordingly, it becomes possible to accurately obtain deformation components of a wafer grid not only for linear components but also for nonlinear components. Here, the wafer grid refers to a grid which is formed when the center of shots on wafer W arranged according to a shot map (data concerning an arrangement of shots formed on wafer W) are connected. Obtaining correction amounts (alignment correction components) dx and dy of position coordinates of the shots for a plurality of shots is none other than obtaining deformation components of the wafer grid. Note that in the description, the wafer grid will be referred to shortly as a "grid," or also as an "arrangement of shot area (or shot)."

In measurement system $500_1$, measurement processing in accordance with the flowchart described earlier can be performed concurrently by the three measurement devices $100_1$ to $100_3$. That is, by measurement devices $100_1$ to $100_3$, position measurement of at least one wafer mark with respect to all shots of each wafer can be performed on each of a predetermined number of wafers subject to measurement each housed inside the wafer carrier; a total of one lot of wafers, within a measurement processing time required for substantially one third of the pieces of wafers in one lot, and it becomes possible to accurately obtain deformation components of the wafer grid not only for linear components but also for nonlinear components. Note that also in the case of performing carry-in of the wafer to each measurement device $100_i$ and carry-out of the wafer that has been measured from each measurement device $100_i$ concurrently with the measurement processing, processing can be performed concurrently on the wafers in one lot inside FOUP 520 carried into one loading port 514, and to the one let of wafers, position measurement of at least one wafer mark with respect to all shots of each wafer becomes possible in a measurement processing time of substantially one-third of the wafers in one lot, and it becomes possible to accurately obtain deformation components of the wafer grid not only for linear components but also for nonlinear components. Note that the three measurement devices $100_1$ to $100_3$ may be adjusted, for example, using a reference wafer or the like, so that in the case each of the three measurement devices $100_1$ to $100_3$ performs measurement processing on, for example, one wafer in one lot under the same conditions, measurement results which are substantially the same can be obtained.

Information on the wafer grid of each wafer that has been obtained, e.g., data on deformation components of the wafer grid of each wafer that has been obtained (data of model formula (1) after coefficients $a_0, a_1, \ldots, b_0, b_1, \ldots$ have been determined), is sent to measurement system controller $530_1$ as a part of alignment history data file for each wafer by controller $60_i$ of measurement device $100_i$. Measurement system controller $530_1$ stores the information on the wafer grid of each wafer that has been received, such as an alignment history data file including data on deformation components of the wafer grid of each wafer that has been received (data of model formula (1) after coefficients $a_0, a_1, \ldots, b_0, b_1, \ldots$ have been determined), for example, in an internal storage device for each wafer.

As is described above, in measurement devices $100_1$ to $100_3$, since wafer measurement processing is performed on the 25 pieces of wafers included in one lot, concurrently dividing the processing into nine, eight, and eight pieces of wafers, the measurement processing by measurement devices $100_1$ to $100_3$ is completed almost simultaneously. Accordingly, measurement processing is completed in one-third of the time required when compared to the case when the 25 pieces of wafers in the same lot is sequentially processed using one measurement device. Note that in the case described above, processing is preferably started with measurement device $100_1$ whose number of wafers in charge is one more than that, of the other devices.

Measurement system controller $530_1$ sends information on the wafer grid (alignment history data file) for each of a plurality of wafers included in one lot to host computer 2000, when measurement of all the wafers included in the lot has been completed. Needless to say, the information on the wafer grid (alignment history data file) sent from measurement system $500_1$ also includes data on nonlinear components of the wafer grid.

Note that controller $60_i$ of measurement, device $100_i$ may be connected to host computer 2000 via LAN 1500, and the information on the wafer grid (alignment history data file) may be sent from controller $60_i$ to host computer 2000, without going through measurement system controller $530_1$.

Also, in the embodiment, while the information on the wafer grid is to be sent (output) from measurement system $500_1$, the information (data) sent from measurement system $500_1$ is not limited to this, and for example, coordinate position information on a plurality of wafer marks measured by measurement device $100_i$ may be sent (output) as a part of the alignment history data file for each wafer.

Note that of the 25 pieces of wafers included in one lot, in the case the pieces of wafers that each of the measurement devices is in charge are housed within a wafer carrier inside chamber $101_i$ of measurement device $100_i$, at the point when measurement is completed, the pieces of wafers that each of the measurement devices is in charge are returned into each of the wafer carriers. Therefore, in measurement system controller $530_1$, the wafers inside each of the wafer carriers have to be returned into FOUP 520, using carrying system 521. Meanwhile, in the case each of the wafers in one lot is to be sequentially carried into measurement devices $100_i$ concurrently with the measurement processing of the three measurement devices $100_i$, carrying member 526 receives the wafer that has completed measurement from wafer carrying system $70_i$ (i=one of 1 to 3), carries the wafer to the unloading side wafer delivery position described earlier, and robot 516 carries (returns) the wafer on which processing has been performed and is carried to the unloading side wafer delivery position into FOUP 520.

Next, an operation flow will be described of a case in which processing is continuously performed on multiple wafers by the lithography system including exposure apparatus 200 and C/D 300.

Firstly, the C/D inner carrying system (e.g., a SCARA robot) takes out a first wafer (described as $W_1$) from a wafer carrier placed within a chamber of C/D 300 and carries in the wafer to the coating section. In accordance with the carry-in, the coating section begins coating of resist. When the coating of resist is completed, the C/D inner carrying system takes out wafer $W_1$ from the coating section, and carries the wafer into the baking section. In accordance with the carry-in, heating processing (PB) of wafer begins at the baking section. Then, when PB of the wafer is completed, the C/D inner carrying system takes out wafer $W_1$ from the baking section, and carries the wafer into temperature controlling section 330. In accordance with the carry-in, cooling of wafer $W_1$ using the cool plate inside temperature controlling section 330 begins. This cooling is performed with the target temperature being a temperature which does not have any influence inside exposure apparatus 200, generally, the target temperature of an air conditioning system of exposure apparatus 200 which is decided, for example, in a range of 20 to 25 degrees. Normally, at the point when the wafer is delivered to temperature controlling section 330, the temperature of the wafer is within a range of ±0.3[° C.], however, temperature controlling section 330 adjusts the temperature to a range of ±10[mK] to the target temperature.

Then, when the cooling (temperature control) inside temperature controlling section 330 is completed, wafer $W_1$ is mounted on a loading side substrate mounting section of a substrate delivery section provided in between C/D 300 and exposure apparatus 200 by the C/D inner carrying system.

Inside C/D 300, a series of operations on wafers similar to the ones described above as in resist coating, PB, cooling, and carrying operation of the wafers described above that accompanies the series of operations are repeatedly performed, and the wafers are sequentially mounted on the loading side substrate mounting section. Note that practically by providing two or more each of the coating section and the C/D inner carrying system inside the chamber of C/D 300, parallel processing on a plurality of wafers becomes possible and the time required for pre-exposure processing can be shortened.

Wafer $W_1$ mounted on the loading side substrate mounting section described earlier is carried to a predetermined waiting position inside exposure apparatus 200 by wafer carrying system 270. However, the first wafer, wafer $W_1$, is loaded immediately onto wafer stage WST by exposure controller 220, without waiting at the waiting position. This loading of the wafer is performed under the control of exposure controller 220 similarly to the loading performed in measurement device $100_i$ described earlier, using the vertical movement member (not shown) on wafer stage WST and wafer carrying system 270. After the loading, search alignment similarly to the one described earlier and wafer alignment of the EGA method where shots of, e.g., around 3 to 16 are to be alignment shots are performed to the wafer on wafer stage WST, using alignment detection system AS. On wafer alignment by the EGA method, alignment history data file of the wafer (target wafer) subject to wafer alignment and exposure in exposure apparatus 200 is supplied from host computer 2000 to exposure controller 220 of exposure apparatus 200, along with identification information (e.g., wafer number, lot number) and the like of the target wafer. The alignment history data that exposure apparatus 200 has acquired from host computer 2000 includes wafer grid information on each wafer measured by measurement system $500_1$, and exposure controller 220 performs wafer alignment as in the description below, after a predetermined preparatory operation. Note that exposure controller 220 and measurement system controller $530_1$ may communicate alignment history data and the like, without going through host computer 2000.

Here, the reason of performing wafer alignment of the EGA method where shots of, e.g., around 3 to 16 are to be alignment shots in exposure apparatus 200 will be described, prior to specifically describing the wafer alignment.

Correction amounts (coefficients $a_0, a_1, \ldots, b_0, b_1, \ldots$ of formula (1) described above) of position coordinates of shots on wafer W obtained by measurement device $100_i$ are used, for example, for positioning of the wafer with respect to the exposure position on exposure of wafer W by exposure apparatus 200. However, wafer W whose correction amounts of position coordinates have been measured with measurement device $100_i$ by exposure apparatus 200 is housed inside FOUP 520 after being unloaded from slider 10 of measurement device $100_i$ as is described earlier, and FOUP 520 is carried into C/D 300 by the OHT and other carrying systems. Then, after wafer W is coated with resist by C/D 300, wafer W is loaded on wafer stage WST of exposure apparatus 200 for exposure. In this case, with wafer holder WH on slider 10 and the wafer holder on wafer stage WST of exposure apparatus 200, holding state of wafer w differs due to individual difference between the wafer holders even if the same type of wafer holder is used. Therefore, even if shot of wafer W position coordinates correction amounts (coefficients $a_0, a_1, \ldots, b_0, b_1, \ldots$ of formula (1) described above) of position coordinates of shots on wafer W are obtained with measurement device $100_i$, all the coefficients $a_0, a_1, \ldots, b_0, b_1, \ldots$ cannot be used as it is. However, it can be considered that low-order components (linear components) of the first-order or less of the correction amounts of the position coordinates of the shots are affected by the different holding state of wafer W for each wafer holder, and high-order components of the second-order or more are hardly affected. This is because high-order components of the second-order or more are considered to be components that occur due to deformation of wafer W induced mainly by the process, and it is safe to consider that the components have no relation to the holding state of the wafer by the wafer holders.

Based on such consideration, coefficients $a_3, a_4, \ldots, a_9, \ldots,$ and $b_3, b_4, \ldots, b_9, \ldots$ of high-order components obtained taking a certain amount of time for wafer W by measurement device $100_i$ can be used without any changes also as coefficients of high-order components of the correction amounts of the position coordinates of wafer W in exposure apparatus 200. Accordingly, on wafer stage WST of exposure apparatus 200, performing only a simple EGA measurement (e.g., measurement of around 3 to 16 wafer marks) to obtain linear components of the correction amounts of the position coordinates of wafer W is enough.

In exposure apparatus 200, a number or wafer marks corresponding to the number of alignment shots are selected as detection targets from wafer marks included in the alignment history data whose position information is measured (marks whose position information is used when calculating the correction amounts) by measurement device $100_i$, and the wafer marks serving as the detection targets are detected using alignment detection system AS, and based on the detection results and the position (measurement information according to interferometer system 218) of wafer stage WST at the time of detection, position information on each wafer mark of the detection targets is obtained, and using the position information, EGA operation is performed and each coefficient of the following formula (2) is obtained.

$$\begin{aligned} dx &= c_0 + c_1 \cdot X + c_2 \cdot Y \\ dy &= d_0 + d_1 \cdot X + d_2 \cdot Y \end{aligned} \quad (2)$$

Then, exposure controller 220 replaces coefficients ($c_0, c_1, c_2, d_0, d_1, d_2$) obtained here with coefficients ($a_0, a_1, a_2, b_0, b_1, b_2$) included in the data of deformation components of the wafer grid of the target wafer, and by using a polynomial expression on design position coordinates X and Y of each shot in a wafer coordinate system whose origin is the center of the wafer expressed by the following formula (3) which includes the coefficients after replacement, obtains correction amounts (alignment correction components) dx and dy of the position coordinates of each shot, and decides target positions (hereinafter called positioning target position for convenience) for positioning each shot to the exposure position (projection position of the reticle pattern) on exposure of each shot for correcting the wafer grid, based on the correction amounts. Note that in the embodiment, while exposure is performed not by a static exposure method but by a scanning exposure method, the target positions are referred to as positioning target position tor convenience.

$$dx = c_0 + c_1 \cdot X + c_2 \cdot Y + a_3 \cdot X^2 + a_4 \cdot X \cdot Y + a_5 \cdot Y^2 + \\ a_6 \cdot X^3 + a_7 \cdot X^2 Y + a_8 \cdot X \cdot Y^2 + a_9 \cdot Y^3 ... \\ dy = d_0 + d_1 \cdot X + d_2 \cdot Y + b_3 \cdot X^2 + b_4 \cdot X \cdot Y + b_5 \cdot Y^2 + \\ b_6 \cdot X^3 + b_7 \cdot X^2 \cdot Y + b_8 \cdot X \cdot Y^2 + b_9 \cdot Y^3 ...$$ (3)

Note that since rotation between the reference coordinate system (stage coordinate system) and the wafer coordinate system is canceled by the search alignment also in exposure apparatus 200, distinction between the reference coordinate system and the wafer coordinate system does not have to be made in particular.

Then, exposure controller 220 performs exposure by a step-and-scan method to each shot on wafer $W_1$, while performing position control of wafer stage WST according to the positioning target position.

Then, before exposure to the wafer on wafer stage WST (in this case, wafer $W_1$) is completed, a second wafer $W_2$ is mounted on the loading side substrate mounting section of the substrate delivery section by the C/D inner carrying system, and is carried to the predetermined waiting position inside exposure apparatus 200 where it is kept waiting at the waiting position.

Then, when exposure of wafer $W_1$ is completed, wafer $W_1$ and wafer $W_2$ are exchanged on wafer stage WST, and wafer alignment and exposure similar to the description earlier is performed on wafer $W_2$ that has been exchanged. Note that in the case carriage of wafer $W_2$ to the waiting position is not completed by the time exposure to the wafer on the wafer stage (in this case, wafer $W_1$) is completed, the wafer stage is to wait near the waiting position while holding the wafer that has been exposed.

Concurrently with the wafer alignment to wafer $W_2$ that has been exchanged described above, wafer $W_1$ that has been exposed is carried to an unloading side substrate mounting section of the substrate delivery section by wafer carrying system 270.

In the manner described earlier, the wafer that has been exposed mounted on the unloading side substrate mounting section of the substrate delivery section by wafer carrying system 270 is carried into the baking section by the C/D inner carrying system, and PEB is performed by a baking apparatus inside the baking section. Inside the baking section, a plurality of wafers can be housed at the same time.

Meanwhile, the wafer that has completed PEB is taken out from the baking section by the C/D inner carrying system, and is carried into the developing section, and developing is started by a developing apparatus inside the developing section.

Then, when development of the wafer is completed, the wafer is taken out from the developing section by the C/D inner carrying system, and is carried into FOUP 520 used at the time of carry-in, or to a predetermined housing stage inside a wafer carrier different from FOUP 520. Hereinafter, inside C/D 300, to the wafers from the second wafer onward that have been exposed, PEB, development, and wafer carriage are to be repeatedly performed in a procedure similar to wafer W.

Note that in the description above, while a two-dimensional mark is used as the wafer mark, there are cases when one-dimensional marks, e.g., an X mark consisting of a line-and-space pattern whose periodic direction is in the X-axis direction, and a Y mark consisting of a line-and-space pattern whose periodic direction is in the Y-axis direction are used as the wafer mark. In this case, measurement conditions on measurement of the mark by mark detection system MDS may be different between the X mark and the Y mark. While such a state may occur by various factors, an example is to be assumed of a situation in which for example, alignment in the Y-axis direction is performed (as a reference) on an immediately preceding layer, and alignment in the X-axis direction is performed (as a reference) on a layer one layer before the immediately preceding layer, as is disclosed in, for example, U.S. Pat. No. 5,532, 091 and the like when alignment needs to be performed extending over a plurality of layers (multilayer) formed on the wafer to perform overlay exposure on the next layer. More specifically, positioning in the Y-axis direction is to be performed on the pattern (mark) formed on the outermost layer of the pattern layers already formed on wafer W, and positioning in the X-axis direction is to be performed on the pattern (mark) formed on the layer below the outermost layer. Accordingly, when observing the X mark at the time of alignment, the X mark formed on the layer below the outermost layer is to be observed from the upper surface of wafer W, via the outermost layer on which the Y mark is formed. Therefore, the alignment measurement conditions (such as illumination conditions, optical conditions, and signal processing algorithms) for appropriately measuring the X mark is different from the alignment measurement conditions for appropriately measuring the Y mark.

Figure 12:
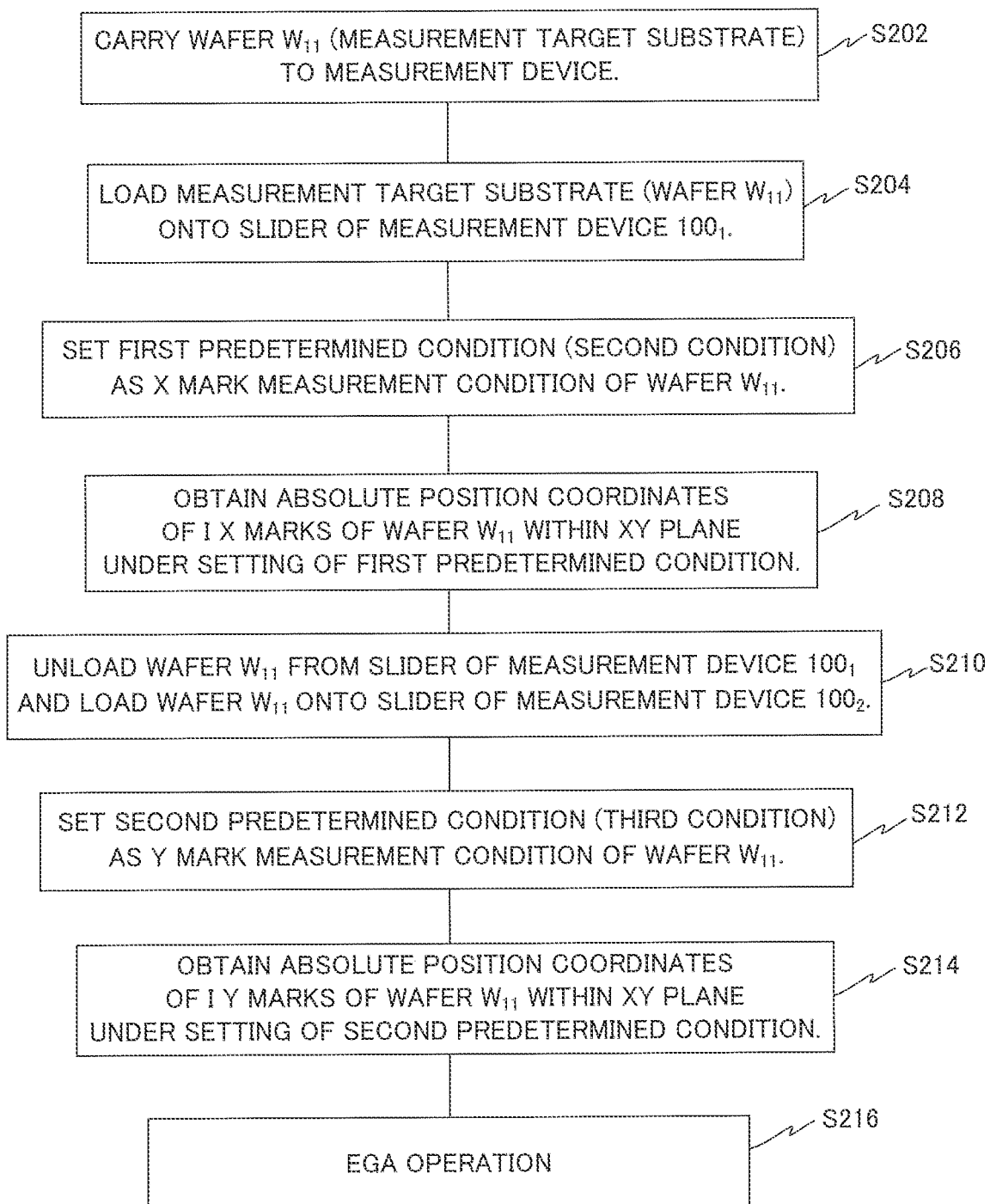
FIG. 12 is a view schematically showing a processing flow of a measurement method of position information (coordinate position information) of an X mark and a Y mark performed in the substrate processing system in FIG. 1.

Next, a measurement method for measuring position information (coordinate position information) of the X mark and Y mark for each of the I (e.g., 98 shots) shots on the measurement wafer using two measurement devices of measurement system $500_1$ will be described. FIG. 12 schematically shows a flow of processing in the measurement method in this case.

First of all, in step S202, a FOUP in which a plurality of wafers of a certain lot including wafer $W_{11}$ (measurement target substrate) is housed, is mounted on loading port 514 of measurement system $500_1$, using OHT and the like described above. The plurality of wafers of a certain lot including wafer $W_{11}$ housed in the FOUP is sequentially taken out from the FOUP using robot 516 and the like, and then is sequentially carried to at least one of measurement devices $100_i$ (i=1 to 3), using carrying system 512 and the like.

Note that in the description below, while one wafer of the plurality of wafers housed in the FOUP is described as wafer $W_{11}$, a similar processing is performed on all the plurality of wafers housed in the FOUP. Also, in the description below, as an example, a case will be described for wafer $W_{11}$ in which measurement of the Y mark is performed using measurement device $100_2$, after performing measurement of the X mark using measurement device $100_1$. As a matter of course, measurement of the X mark may be performed using measurement device $100_2$, after performing measurement of the Y mark using measurement device $100_1$.

Wafer $W_{11}$, next in step S204, when carried to measurement device $100_1$ in the manner described above, is loaded onto slider 10 of measurement device $100_1$ in a procedure similar to step S104 described earlier by wafer carrying system $70_1$ and vertical movement member on slider 10, under the control of controller $60_1$.

In the next step S206, measurement conditions of the X mark of wafer $W_{11}$ by measurement device $100_1$ is set as a first predetermined condition. In the description below, this first predetermined condition will also be referred to as a second condition to discriminate this from the first condition described earlier. The second condition is a measurement condition suitable for detection of the X mark formed on wafer $W_{11}$. Here, as an alignment measurement condition (an example of the second condition), optimization of the wavelength of the illumination light in mark detection system MDS is to be performed, as is described earlier. The X mark formed on wafer $W_{11}$ subject to processing is a mark formed on a lower layer (e.g., one layer below) when the outermost layer serves as an upper layer, and to appropriately observe the mark, an observation light (illumination light) is preferably used that has high transmittance with respect to the material that structures the outermost layer. Here, such an observation light is to be, e.g., light in the red region. Therefore, controller $60_1$ performs setting (control) of the wavelength selection mechanism, so that a filter that transmits a light beam (red light) having a wavelength of 710 to 800 nm in the wavelength selection mechanism of mark detection system MDS is to be selected.

Next, in step S208, absolute position coordinates within the XY plane of I X marks of wafer $W_{11}$ are obtained in the following manner, under the second condition which has been set. That is, controller $60a$ detects each of the I X marks on wafer $W_{11}$ using mark detection system MDS, while measuring the position information on slider 10 using the first position measurement system 30 (and the second position measurement system 50), and obtains the absolute position coordinates in the XY plane of the I X marks on wafer $W_{11}$, based on detection results of each of the I X marks and the absolute position coordinates (X, Y) of slider 10 at the time of detection of each of the X marks. However, in this case, by irradiating the wafer mark with detection light of a wavelength in the red region determined by the second condition, via the optical system of mark detection system MDS, at a light amount of a default setting in a conventional illumination condition (o value), receiving a diffracted light of a predetermined order (e.g., ±1st order) generated from the wafer mark by a detector, and processing the photo-electrically converted signal according to a signal processing condition (processing algorithm) of a default setting, detection results of the mark used to calculate position coordinates on a reference coordinate system of the wafer mark on wafer $W_{11}$ can be obtained. Also, on this operation, controller $60_1$, based on measurement values in the θx direction and the θy direction of slider 10 measured by the first position measurement system 30, obtains the absolute position coordinates within the XY plane of each of the I X marks, with Abbe errors in the X-axis direction and the Y-axis direction of the first position measurement system 30 and the measurement values in the X-axis direction and the Y-axis direction of the second position measurement system 50 serving as offsets.

Next, in step S210, wafer $W_{11}$ is unloaded from slider 10 of measurement device $100_1$ and is loaded onto slider 10 of measurement device $100_2$, without being carried out outside of measurement system $500_1$. Specifically, wafer $W_{11}$, after being unloaded from slider 10 of measurement device $100_1$ by wafer carrying system $70_1$ and the vertical movement member on slider 10 in a procedure opposite to the loading procedure in step S204 (and step 104) under the control of controller $60_1$, is delivered to carrying member 524 (or 526) by wafer carrying system $70_1$, and then is carried to a delivery position with measurement device $100_2$ by carrying member 524 (or 526). Thereafter, under the control of controller $60_2$ in a procedure similar to step S104 described earlier, wafer $W_{11}$ is loaded onto slider 10 of measurement device $100_2$ by wafer carrying system $70_2$ and vertical movement member on slider 10 of measurement device $100_2$.

In the next step S212, measurement conditions of the Y mark of wafer $W_{11}$ by measurement device $100_2$ is set as a second predetermined condition. In the description below, this second predetermined condition will also be referred to as a third condition. The third condition is a measurement condition suitable for detection of the Y mark formed on wafer $W_{11}$. Here, as an alignment measurement condition (an example of the third condition), optimization of the wavelength of the illumination light in mark detection system MDS is to be performed, as is described earlier. The Y mark formed on wafer $W_{11}$ subject to processing is a mark formed on the outermost layer, and to observe this, the wavelength of a specific observation light (illumination light) does not have to be specified, and a broadband white light generated by an illumination light source such as a halogen lamp may be used for observation. Accordingly, controller $60_5$ performs setting (control) of the wavelength selection mechanism, so that a filter that transmits a light beam (white light) having a wavelength of 530 to 800 nm in the wavelength selection mechanism of mark detection system MDS is to be selected.

Next, in step S214, absolute position coordinates within the XY plane of I Y marks of wafer $W_{11}$ are obtained similarly to obtaining the absolute position coordinates within the XY plane of the X marks in step 3208, under the third condition which has been set by controller $60_2$. On this operation, controller $60_2$ obtains the absolute position coordinates within the XY plane of each of the I Y marks, with Abbe errors in the X-axis direction and the Y-axis direction of the first position measurement system 30 obtained based on measurement values of slider 10 in the θx direction and the θy direction measured by the first position measurement system 30, and the measurement values in the X-axis direction and the Y-axis direction of the second position measurement system 50, serving as offsets.

As is described above, the three measurement devices $100_1$ to $100_3$ are adjusted, so that in the case each of the three measurement devices $100_1$ to $100_3$ performs measurement processing on, for example, one wafer in one lot under the same conditions, measurement results which are substantially the same can be obtained. Accordingly, in the next step S216, by measurement system controller $530_1$ (or controller $60_2$), coefficients $a_0, a_1, \ldots, b_0, b_1, \ldots$ in formula (1) above are obtained by a statistical calculation (EGA operation) such as the least squares method, based on the absolute position coordinates of the X mark obtained in step S208 and the absolute position coordinates of the Y mark obtained in step S214, similarly to step S114 described above. Hereinafter, similarly to the flowchart in FIG. 11, when the measurement processing to the wafers in the lot subject to measurement Is completed, this completes the series of processing.

As is described, in this example, measurement of the X marks is performed on all wafers in the lot under the second condition in measurement device $100_1$, and measurement of the Y marks can be performed on all wafers in the lot under the third condition in measurement device $100_2$. Accordingly, measurement device $100_1$ and measurement device $100_2$ can accurately measure each of the measurement target marks without changing each of the measurement conditions, until measurement on all wafers in the lot subject to measurement is completed.

Measurement system controller $530_1$ sends information on the wafer grid (alignment history data file) for each of a plurality of wafers included in one lot to host computer 2000, when measurement of all the wafers included in the lot has been completed. Needless to say, the information on the wafer grid (alignment history data file) sent from measurement system 500$_1$ also includes data on nonlinear components of the wafer grid.

Note that controller 60$_i$ of measurement device 100$_i$ may be connected to host computer 2000 via LAN 1500, and the information on the wafer grid (alignment history data file) may be sent from controller 60$_i$ to host computer 2000, without going through measurement system controller 530$_1$.

Also, in the embodiment, while information on the wafer grid is sent (output) from measurement system 500$_1$, the information (data) sent from measurement system 500$_1$ is not limited to this, and for example, coordinate position information on the wafer mark (X mark) and coordinate position information on the wafer mark (Y mark) measured by measurement device 100$_i$ may be sent (output) as at least a part of alignment history data of each wafer.

Note that in measurement system 500$_1$, it is possible to concurrently perform at least a part of acquiring the absolute position coordinate of the X mark of a wafer included in a measurement target lot by measurement device 100$_i$ and acquiring the absolute position coordinate of the Y mark of another wafer included in the measurement target lot by measurement device 100$_2$. In such a case, it becomes possible to reduce measurement time of ail wafers that are measurement targets included in the measurement target lot.

Also, in the description above, while a wafer on which the X mark and the Y mark are formed on different layers serves as the measurement target, the X mark and the Y mark may be formed on the same layer. In this case as well, in the case the measurement condition suitable for detection of the X mark and the measurement condition suitable for the Y mark are different, for example, the absolute position coordinate of the X mark may be acquired by measurement device 100$_1$ and the absolute position coordinate of the Y mark may be acquired by measurement device 100$_2$.

Now, as is described above, since measurement device 100$_i$ is equipped with the first position measurement system 30, by performing origin setting of the orthogonal coordinate system (reference coordinate system) set by the measurement axes of the first position measurement system 30, it becomes possible to manage an absolute position of slider 10, and as a consequence, an absolute position of the wafer marks, such as overlay measurement marks (registration marks) on wafer W held on slider 10 obtained from the position information on slider 10 and the detection results of mark detection system MDS, on the reference coordinate system. That is, measurement device 100$_i$ can also be made to function as overlay measuring instrument. Note that in the description, "absolute position" refers to coordinate positions on a reference coordinate system.

Accordingly, at least one of measurement devices 100$_i$ (i=1 to 3) of measurement system 500$_1$ can also be made to function as an overlay measuring instrument. However, in the embodiment, since each of the measurement devices 100$_i$ of measurement system 500$_1$ is to perform the measurement described earlier on a wafer that has finished the processing of the pre-process in the wafer processing described earlier and has not yet been coated with a resist as a measurement target, concurrently with this measurement on a wafer in a certain lot by each measurement device 100$_i$ of measurement system 500$_1$, it is possible to execute overlay measurement and the like to a wafer in another lot with measurement system 500$_2$.

Figure 13:
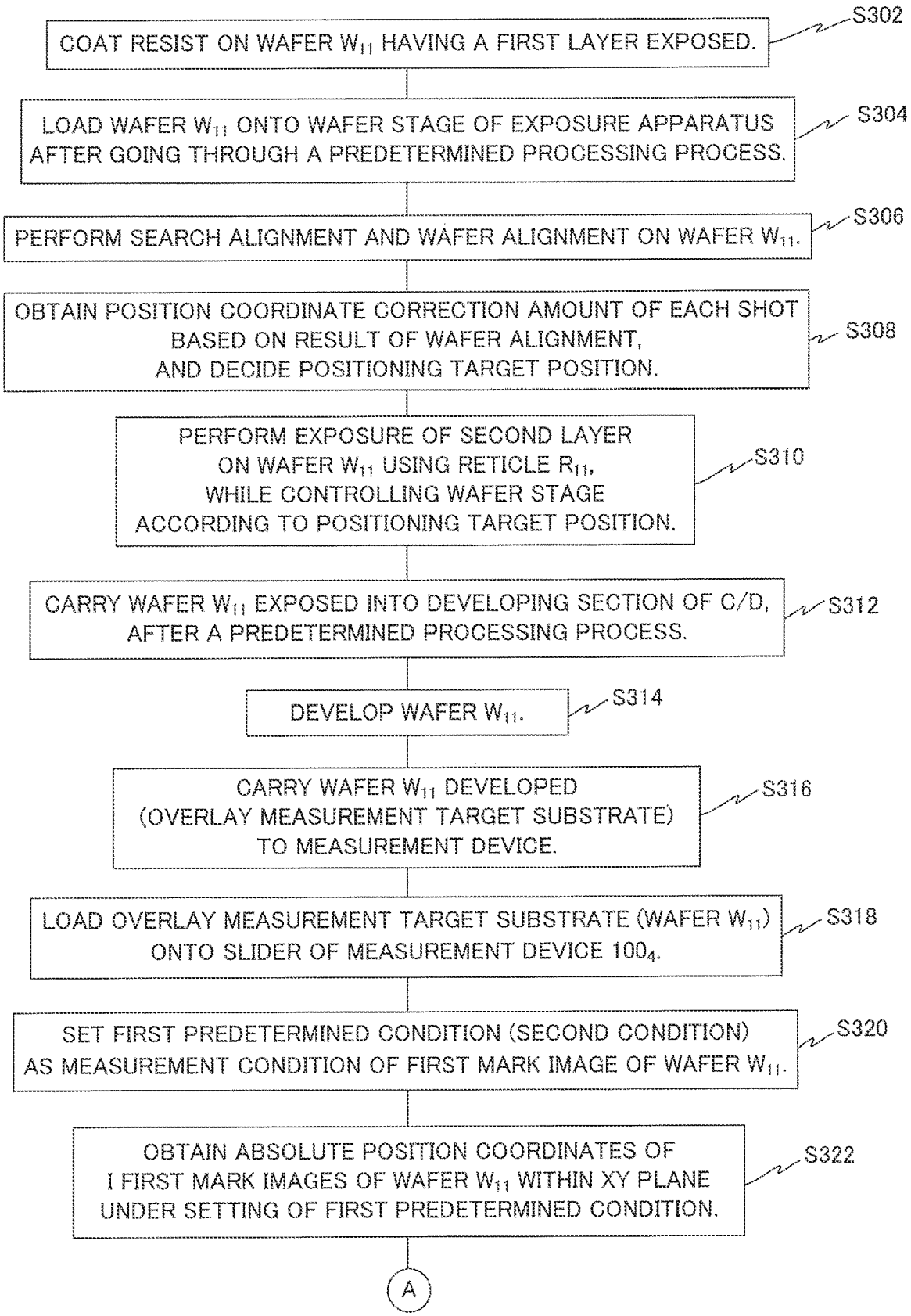
FIG. 13 is a view (No. 1) schematically showing a processing flow of an overlay displacement measurement method performed in the substrate processing system in FIG. 1.
Figure 14:
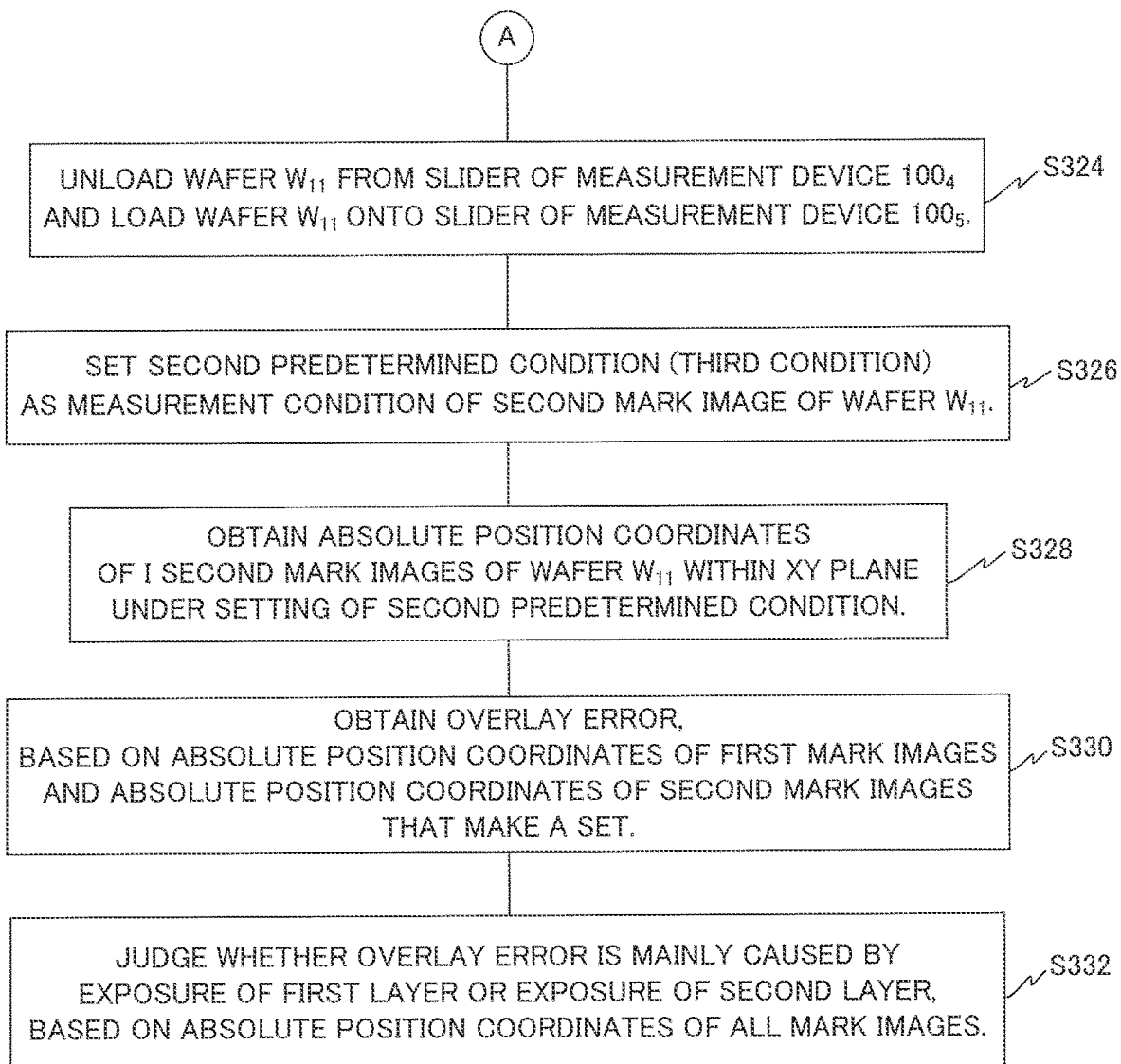
FIG. 14 is a view (No. 2) schematically showing a processing flow of an overlay displacement measurement method performed in the substrate processing system in FIG. 1.
Figure 15:
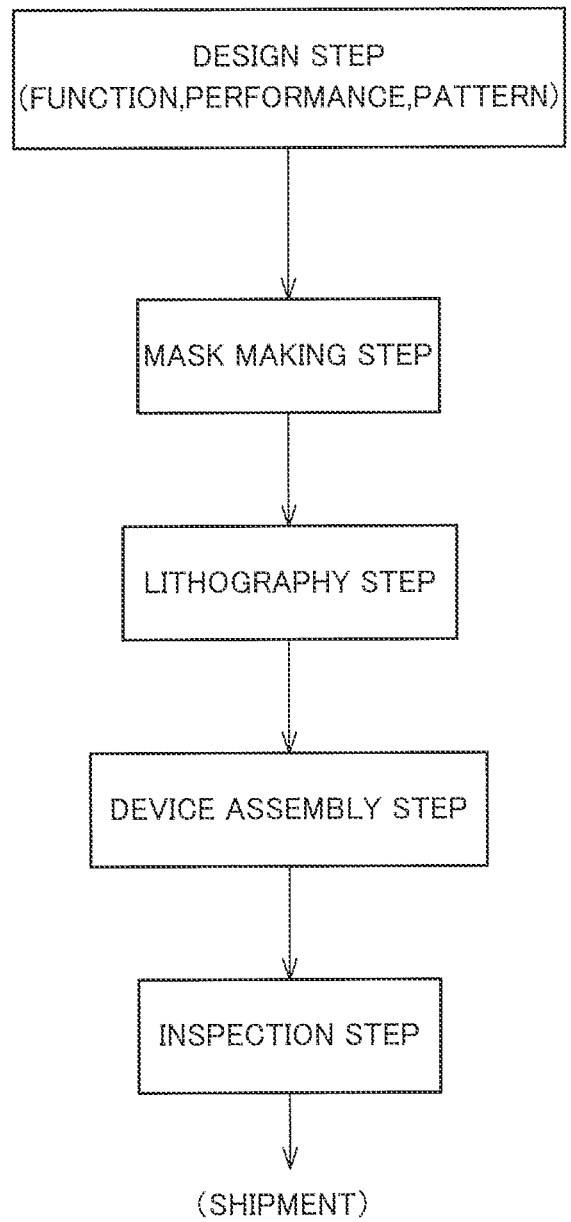
FIG. 15 is a view showing an example of a manufacturing process of a semiconductor device.

Next, an overlay measurement method will be described, using two measurement devices of the other measurement system 500$_2$. FIGS. 13 and 14 schematically show a flow of processing in the overlay measurement method in this case.

First of all, in step S302, a wafer (expressed as wafer $W_{11}$) included in a certain lot is carried into C/D 300, and in the coating section of C/D 300, by exposure apparatus 200 or an exposure apparatus different from exposure apparatus 200 such as for example, a scanner or a stepper, resist coating is performed on wafer $W_{11}$ which has undergone exposure of the first layer (lower layer). On wafer before resist coating, by exposure of the lower layer, along with a plurality of, for example, I (I is, for example, 98) shots, a wafer mark whose designed positional relation with the shot is known and a first mark (to be precise, a resist image of the first mark (also appropriately referred to as a first mark image)) for overlay displacement measurement are formed, corresponding to each of the shots. In this case, designed positional relation is also known for each of the I first mark images.

Next, in step S304, wafer $W_{11}$ that has been coated with the resist is loaded onto wafer stage WST of exposure apparatus 200, after going through a predetermined processing process similar to wafer $W_1$ described earlier. Specifically, wafer $W_{11}$ is loaded onto wafer stage WST, after having undergone heating processing (PB) in the baking section, temperature control in temperature controlling section 330 and the like.

Next, in step S306, by exposure controller 220 of exposure apparatus 200, to wafer $W_{11}$ on wafer stage WST, search alignment similar to the one described earlier using alignment detection system AS and water alignment by the EGA method in which alignment shots are, e.g., around 3 to 16 shots are performed.

Note that prior to step S302, as is described earlier, information on the wafer grid of wafer $W_{11}$ is obtained by measurement device 100$_i$ (i=1 to 3) of measurement system 500$_1$, which is supplied to exposure controller 220 of exposure apparatus 200.

In the next step, step S308, exposure controller 220 obtains correction amounts (alignment correction components) dx and dy of position coordinates of each shot expressed in formula (3) described earlier based on results of the wafer alignment, and decides positioning target position on exposure of each shot for correcting the wafer grid, based on the correction amounts.

Note that prior to step 302, positioning target position on exposure of each shot may be decided only by the results of wafer alignment by the EC-A method using alignment detection system AS in which alignment shots are, e.g., around 3 to 16 shots, without obtaining information on the wafer grid of wafer $W_{11}$ by measurement device 100$_i$ of measurement system 500$_1$.

Next, in step S310, exposure apparatus 200 performs exposure of a second layer (an upper layer whose lower layer is the first layer) by a step-and-scan method to each shot on wafer $W_{11}$, while controlling wafer stage WST according to the positioning target position. On this operation, exposure apparatus 200 performs exposure using a reticle (to be reticle $R_{11}$ for convenience) on which a second mark corresponding to the first mark image on wafer $W_{11}$ is formed. Accordingly, by this exposure of the second layer, the pattern area of reticle $R_{11}$ is overlaid and transferred with respect to I shots on wafer $W_{11}$, along with transferred images of I second marks being formed arranged in a positional relation corresponding to the positional relation of the I first marks.

Next, in step S312, wafer $W_{11}$ that has completed exposure of the second layer is carried into the developing section of C/D 300, after going through a processing process similar to wafer $W_1$ described earlier that has already been exposed. Specifically, wafer $W_{11}$ is carried to the unloading side substrate mounting section of the substrate delivery section by wafer carrying system 270, and is carried into the baking section of C/D 300 from the unloading side substrate mounting section by the C/D inner carrying system, and then PEB is performed by a baking apparatus inside the baking section. Wafer $W_{11}$ that has completed PEB is taken out from the baking section by the C/D inner carrying system, and then is carried into the developing section.

Next, in step S314, by the developing apparatus within the developing section, wafer $W_{11}$ on which a transferred image of a plurality of second marks is formed is developed. By this development, along with I shots, I sets of the first mark image and the corresponding second mark image are formed in predetermined positional relation on wafer $W_{11}$, which serve as a measurement target on overlay measurement. That is, the substrate serving as a measurement target on overlay measurement (overlay measurement target substrate) is made in this manner. Here, as a set of the first mark image and the corresponding second nark image, for example, a resist image of a box-in-box mark consisting of an external, box mark and an in-box mark arranged on the inner side of the external box can be used.

Next, in step S316, a FOUP in which a plurality of wafers of a certain lot including wafer $W_{11}$ (overlay measurement target substrate) that has been developed is housed, is taken out from C/D 300, and is mounted on loading port 514 of measurement system $500_2$, using OHT described above and the like. That is, a plurality of wafers of a certain lot including wafer $W_{11}$ inside the FOUP taken out from C/D 300 is carried to measurement system $500_2$ before the process processing (etching processing, or film deposition processing after the etching processing (including at least one of sputtering processing, CVD processing, and thermal oxidation processing)) performed after development processing is applied. The plurality of wafers of a certain lot including wafer $W_{11}$ housed in the FOUP is sequentially taken out from the FOUP using robot 516 and the like, and then is sequentially carried to at least one of measurement devices $100_i$ (i=4 to 6), using carrying system 521 and the like.

Note that in the description below, while one wafer of the plurality of wafers housed in the FOUP is described as wafer $W_{11}$, a similar processing is performed on all, or on a part of the plurality of wafers housed in the FOUP. Also, in the description below, as an example, a case will be described for wafer $W_{11}$ (measurement target substrate on overlay measurement) in which measurement of the first mark image is performed using measurement device $100_4$, and measurement of the second mark image is performed using measurement device $100_5$.

Wafer $W_{11}$, next in step S318, when carried to measurement device $100_4$ in the manner described above, is loaded onto slider 10 of measurement device $100_4$ in a procedure similar to step S104 described earlier by wafer carrying system $70_4$ and vertical movement member on slider 10, under the control of controller $60_4$.

In the next step S320, measurement conditions of the first mark image of wafer $W_{11}$ by measurement device $100_4$ is set as a first predetermined condition. In the description below, this first predetermined condition will also be referred to as a second condition to discriminate this from the first condition described earlier. The second condition is a measurement condition suitable for detection of the first mark image formed on wafer flu by exposure of the first layer. Here, as an alignment measurement condition (an example of the second condition), optimization of the wavelength of the illumination light in mark detection system MDS is to be performed, as is described earlier. The first mark image formed on wafer $W_{11}$ subject to processing is a mark formed on a first layer (a lower layer (e.g., one layer below) when a second layer (outermost layer) serves as an upper layer), and to appropriately observe the mark, an observation light (illumination light) is preferably used that has high transmittance with respect to the material that structures the outermost layer. Here, such an observation light is to be, e.g., light in the red region. Therefore, controller 604 performs setting (control) of the wavelength selection mechanism, so that a filter that transmits a light beam (red light) having a wavelength of 710 to 800 nm in the wavelength selection mechanism of mark detection system MDS is to be selected.

Next, in step S322, absolute position coordinates within the XY plane of I first mark images of wafer $W_{11}$ are obtained in the following manner, under the second condition which has been set. That is, controller $60_4$ detects each of the I first mark images on wafer $W_{11}$ using mark detection system MDS, while measuring the position information on slider 10 using the first position measurement system 30 (and the second position measurement system 50), and obtains the absolute position coordinates in the XY plane of the I first mark images on wafer $W_{11}$, based on detection results of each of the I first mark images and the absolute position coordinates (X, Y) of slider 10 at the time of detection for each of the first mark images. However, in this case, by irradiating the wafer mark with detection light of a wavelength in the red region determined by the second condition, via the optical system of mark detection system MDS, at a light amount of a default setting in a conventional illumination condition (σ value), receiving a diffracted light of a predetermined order (e.g., ±1st order) generated from the wafer mark by a detector, and processing the photoelectrically converted signal according to a signal processing condition (processing algorithm) of a default setting, detection results of the mark used to calculate position coordinates on a reference coordinate system of the wafer mark on wafer $W_{11}$ can be obtained. Also, on this operation, controller $60_4$, based on measurement values in the θx direction and the θy direction of slider 10 measured by the first position measurement system 30, obtains the absolute position coordinates within the XY plane of each of the I first mark images, with Abbe errors in the X-axis direction and the Y-axis direction of the first position measurement system 30 and the measurement values in the X-axis direction and the Y-axis direction of the second position measurement system 50 serving as offsets.

Next, in step S324, wafer $W_{11}$ is unloaded from slider 10 of measurement device $100_4$ and is loaded onto slider 10 of measurement device $100_5$, without being carried out outside of measurement system $500_2$. Specifically, wafer $W_{11}$, after being unloaded from slider 10 of measurement device $100_4$ by wafer carrying system $70_4$ and the vertical movement member on slider 10 in a procedure opposite to the loading procedure in step S318 (and step 104) under the control of controller $60_4$, is delivered to carrying member 524 (or 526) by wafer carrying system $70_4$, and then is carried to a delivery position with measurement device $100_5$ by carrying member 524 (or 526). Thereafter, under the control of controller $60_5$ in a procedure similar to step S104 described earlier, wafer $W_{11}$ is loaded onto slider 10 of measurement device $100_5$ by wafer carrying system $70_5$ and vertical movement member on slider 10 of measurement device $100_5$.

In the next step S326, measurement conditions of the second mark image of wafer $W_{11}$ by measurement device $100_5$ is set as a second predetermined condition. In the description below, this second predetermined condition will also be referred to as a third condition. The third condition is a measurement condition suitable for detection of the second mark image formed on wafer $W_{11}$ by exposure of the second layer. Here, as an alignment measurement condition (an example of the third condition), optimization of the wavelength of the illumination light in mark detection system MDS is to be performed, as is described earlier. The second mark image formed on wafer $W_{11}$ subject to processing is a mark formed on the second layer (the outermost layer), and to observe this, the wavelength of a specific observation light (illumination light) does not have to be specified, and a broadband white light generated by an illumination light source such as a halogen lamp may be used for observation. Accordingly, controller $60_5$ performs setting (control) of the wavelength selection mechanism, so that a filter that transmits a light beam (white light) having a wavelength of 530 to 800 nm in the wavelength selection mechanism of mark detection system MDS is to be selected.

Next, in step S328, absolute position coordinates within the XY plane of I second mark images of wafer $W_{11}$ are obtained similarly to obtaining the absolute position coordinates within the XY plane of the first mark images in step S322, under the third condition which has been set by controller $60_5$. On this operation, controller $60_5$, based on measurement values in the θx direction and the θy direction of slider 10 measured by the first position measurement system 30, obtains the absolute position coordinates within the XY plane of each of the I second mark images, with Abbe errors in the X-axis direction and the Y-axis direction of the first position measurement system 30 and the measurement values in the X-axis direction and the Y-axis direction of the second position measurement system 50 serving as offsets.

Next, in step S330, by measurement system controller $530_2$ (or controller $60_5$), overlay error (overlay displacement) between the first layer and the second layer is obtained, based on the absolute position coordinates of the first mark image and the absolute position coordinates of the second mark image that make a set with each other.

Next, in step 332, by measurement system controller $530_2$ (or controller $60_5$), a judgment is made, for example, in the following manner on whether exposure of the first layer or exposure of the second layer is the main cause of the overlay error, based on the absolute position coordinates of I first mark images and the absolute position coordinates of I second mark images. That is, measurement system controller $530_2$ (or controller $60_5$) obtains displacement amount ($\Delta X1_i$, $\Delta Y1_i$) (i=1 to I) from design position coordinates of the first mark image and displacement amount ($\Delta X2_i$, $\Delta Y2_i$) (i=1 to I) from design position coordinates of the second mark image, and for each of $\Delta X1_i$, $\Delta X2_i$, $\Delta Y1_i$, and $\Delta Y2_i$, obtains the sum total of i=1 to I, $\Sigma X1_i$, $\Sigma X2_i$, $\Sigma Y1_i$, and $\Sigma Y2_i$. Then, in the case of $\Sigma X1_i > \Sigma X2_i$ and $\Sigma Y1_i < \Sigma Y2_i$, measurement system controller $530_2$ (or controller $60_5$) judges that the overlay error is mainly caused by exposure of the first layer for both the X-axis direction and the Y-axis direction, and in the case of $\Sigma X1_i < \Sigma X2_i$ and $\Sigma Y1_i < \Sigma Y2_i$, measurement system controller $530_2$ (or controller $60_5$) judges that the overlay error is mainly caused by exposure of the second layer for both the X-axis direction and the Y-axis direction. Also, in the case of $\Sigma X1_i > \Sigma X2_i$ and $\Sigma Y1_i < \Sigma Y2_i$, measurement system controller $530_2$ (or controller $60_5$) judges that the overlay error is mainly caused by exposure of the first layer in the X-axis direction and exposure of the second layer in the Y-axis direction, and in the case of $\Sigma X1_i < \Sigma X2_i$ and $\Sigma Y1_i > \Sigma Y2_i$, controller $530_2$ (or controller $60_5$) judges that the overlay error is mainly caused by exposure of the second layer in the X-axis direction and exposure of the first layer in the Y-axis direction.

Note that the deciding method described above is an example, and as long as measurement system controller $530_2$ (or controller $60_5$) makes the judgment of whether the main cause of the overlay error is in exposure of the first layer or exposure of the second layer, based on the absolute position coordinates of the I first mark images and the absolute position coordinates of the I second mark images, the specific judgment method does not natter.

Note that concurrently with the processing in step S330 and step S332, wafer $W_{11}$ on which measurement has been completed of the absolute position coordinate within the XY plane of I second mark images in step S328 is delivered to carrying member 526 by wafer carrying system $70_5$, and after being carried to the unloading side wafer delivery position described earlier by carrying member 526, is to be returned into the predetermined FOPU 520 by robot 516.

Data on the overlay error (overlay displacement) of wafer $W_{11}$ obtained by the overlay measurement method described above and data on judgment results of whether the main cause of the overlay error is in exposure of the first layer or exposure of the second layer are to be fed back to at least one of the exposure apparatus that performed the exposure of the first layer and exposure apparatus 200 that performed exposure of the second layer by measurement system controller $530_2$ (or controller $60_5$).

For example, in the case the main factor of the overlay error is in exposure of the first layer, the data can be fed back to the exposure apparatus that has performed exposure on the first layer. Then, in the case the exposure apparatus performs an exposure processing similar to that of the first layer of wafer $W_{11}$ on a wafer included in a lot other than the lot including wafer $W_{11}$, a positioning target position may be decided so that the overlay error with the second layer is reduced, based on the data fed back.

Also, in the case the main factor of overlay error is in exposure of the second layer, the data may be fed back to exposure apparatus 200 that has performed exposure on the second layer. Then, in the case exposure apparatus 200 performs an exposure processing similar to that of the second layer of wafer $W_{11}$ on a wafer included in a lot other than the lot including wafer $W_{11}$, a positioning target position may be decided so that the overlay error with the first layer is reduced, based on the data fed back.

Note that feedback of data may be performed, via host computer 2000.

Also, in at least one of step S322 and step S328, in the case the absolute position coordinates for two or more marks are acquired for ail shots on wafer $W_{11}$, and first information related to shape and size of each shot on the first layer and second information related to shape and size of each shot on the second layer can be acquired, the first information may be supplied (fed back) to the exposure apparatus that has performed exposure on the first layer and the second information may be supplied (fed back) to exposure apparatus 200 that has performed exposure on the second layer. In this case, image forming characteristic correction controller 248 may be controlled, or at least one of speed and direction of reticle stage RST may be controlled, so that the shape and size of each shot on the second layer take the form of a desired state.

Note that in the description above, while the overlay error (overlay displacement) between the first layer and the second layer is obtained based on the absolute position coordinates of the first mark image and the absolute position coordinates of the second mark image, data on the absolute position coordinates of the first mark image and data on the absolute position coordinates of the second mark image may be output from measurement system $500_2$ as information on overlay error between the first layer and the second layer (position displacement between the first layer and the second layer). In this case, data output from measurement system $500_2$ may be supplied (fed back) to one of the exposure apparatus (exposure apparatus 200 or another exposure apparatus) that has performed exposure on the first layer and exposure apparatus 200 that has performed exposure on the second layer.

Also, each of the position displacement between the first mark image and the second mark image that form a set with each other may be obtained based on the absolute position coordinates of the first mark image and the absolute position coordinates of the second mark image, and the positional displacement may be output from measurement system $500a$ as information on overlay error between the first layer and the second layer (position displacement between the first layer and the second layer). Also in this case, data output from measurement system $500_2$ may be supplied (fed back) to one of the exposure apparatus (exposure apparatus 200 or another exposure apparatus) that has performed exposure on the first layer and exposure apparatus 200 that has performed exposure on the second layer.

Note that in the processing algorithm that follows the flowchart in FIGS. 13 and 14, in the case measurement of the absolute position coordinate of the first mark image is performed with measurement device $100_4$ in step S322 on all overlay measurement target substrates (wafer $W_{11}$) included in the same lot, while measurement of the absolute position coordinate of the second mark image is to be performed with measurement device $100_5$ in step S328 on the overlay measurement target substrates, the measurement of the absolute position coordinate of the second mark image with measurement device $100_5$ does not necessarily have to be performed on a part of the measurement target substrates in the lot.

Note that the absolute position coordinates of K first mark images, which is less than I, may be obtained in step S322, and the absolute position coordinates of K second mark images may be obtained in step S328.

As is obvious from the description above, with the overlay measurement method performed in substrate processing system 1000, measurement system $500_2$ can measure each of the absolute position coordinates of the first mark image and the absolute position coordinates of the second mark image, and can measure overlay error based on these absolute position coordinates. Also, an unconventional significant effect can be obtained in which the main cause of the overlay error can be specified to exposure of the lower layer or to exposure of the upper layer.

Note that since the overlay error (overlay displacement) between the first layer and the second layer is obtained in step S330 described above, step S332 may be executed as necessary.

Note that in the description above, while overlay displacement measurement marks (the first mark image and the second mark image) were used to obtain the overlay error between the first layer and the second layer, wafer marks (alignment marks) may also be used. That is, the overlay error between the first layer and the second layer may be obtained from the absolute position coordinates of I wafer marks of the first layer and the absolute position coordinates of I wafer marks of the second layer.

Also, since the wafer mark and the overlay displacement measurement mark (the first mark image and the second mark image) differ in shape, size and the like, suitable measurement conditions including illumination condition and the like differ. Therefore, for the plurality of wafers included in the same lot (measurement target lot), in step S320 described earlier, a measurement condition suitable for measurement of the resist image of the wafer mark on the wafer is to be set as the first predetermined condition instead of the measurement condition of the first mark image of wafer $W_{11}$, and in step S322, the absolute position coordinates of the resist image of the wafer mark is to be obtained under the first predetermined condition. Also, as for the wafer in which the absolute position coordinates of the resist image of the wafer mark is acquired, in step S326 described earlier, measurement conditions suitable for measurement of an overlay displacement measurement mark (at least one of the first mark image and the second mark image) may be set as the second predetermined condition, and in step S328, the absolute position coordinates of the overlay displacement measurement mark may be obtained under the second predetermined conditions Therefore, it is possible to perform position measurement with high precision for both the resist image of the wafer mark and the overlay displacement measurement mark on the plurality of wafers included in the measurement target lot, in the flow of processing according to the flowchart in FIGS. 13 and 14.

Also, in the description above, after the exposure processing of the second layer, the absolute position coordinate of the first mark image (or the wafer mark of the first layer) of wafer $W_{11}$ that has been developed is acquired by measurement device $100_4$ of measurement system $500_2$, and the absolute position coordinate of the second mark image (or the wafer mark of the second layer) is acquired by measurement device $100_5$. However, the acquisition is not limited to this, and the absolute position coordinate of the first mark image (or the wafer mark of the first layer) of wafer $W_{11}$ that has been developed may be acquired by measurement device $100_4$ of measurement system $500_2$ after the exposure processing of the first layer and before the exposure processing of the second layer, and the absolute position coordinate of the second mark image (or the wafer mark of the second layer) of wafer $W_{11}$ that has been developed may be acquired by measurement device $100_5$ of measurement system 500. In this case, the overlay error between the first layer and the second layer may be obtained with measurement system $500_2$ (controller $60_5$ or measurement system controller $530_2$), or may be obtained with another device (e.g., host computer 2000).

Also, wafer $W_{11}$ may be carried into measurement system $500_1$ or measurement system $500_2$ just before wafer $W_{11}$ that has gone through various processes (including etching processing and film deposition processing) is carried into C/D 300 (or another coater/developer) so that exposure processing is performed on the following layer of the second layer, and any one of measurement devices $100_i$ (i=one of 1 to 6) may acquire both the absolute position coordinates of the first mark image (or wafer mark of the first layer) and the absolute position coordinates of the second mark image (or wafer mark of the second layer) of wafer $W_{11}$, or the absolute position coordinates of the second mark image (or wafer mark of the second layer) of wafer $W_{11}$. Also in this case, the overlay error between the first layer and the second layer (position displacement between the first layer and the second layer) may be obtained by measurement system $500_1$ or measurement system $500_2$, or information on the absolute position coordinates acquired by measurement system $500_1$ or measurement system $500_2$ may be supplied to another apparatus (e.g., host computer 2000), and the another apparatus may obtain the overlay error between the first layer and the second layer (position displacement between the first layer and the second layer). Also, information on the overlay error between the first layer and the second layer (position displacement between the first layer and the second layer) obtained by measurement system $500_1$ or measurement system $500_2$, or information on the absolute position coordinates acquired by measurement system $500_1$ or measurement system $500_2$ may be supplied to exposure apparatus 200, or to another exposure apparatus.

Note that in the description above, while information on the overlay error between the first layer and the second layer is acquired, the description is not limited to this, and the overlay error may be acquired for an $m^{th}$ layer (lower layer, m is an integral number of 1 or more) and an $n^{th}$ layer (upper layer, n is an integral number of 2 or more and is larger than m). In this case, the $n^{th}$ layer does not necessarily have to be the following layer of the $n^{th}$ layer.

As is described so far, with substrate processing system 1000 according to the embodiment, multiple wafers are processed continuously, by each of measurement system $500_1$, measurement system $500_2$, and a lithography system including exposure apparatus 200 and C/D 300. In substrate processing system 1000, measurement processing described earlier on the measurement target wafer described earlier by measurement system $500_1$, processing by the lithography system (resist coating, exposure, and developing) with respect to the wafer that has undergone measurement by measurement system $500_1$, and measurement processing on the wafer that has completed processing by the lithography system are performed independent of each other. Therefore, while there is a restriction that the processing by the lithography system is performed on wafers which have completed measurement processing by measurement system $500_1$ and the measurement processing by measurement system $500_2$ is performed on wafers which have completed processing by the lithography system, the total processing sequence can be decided so that the throughput of the entire substrate processing system 1000 becomes maximum.

Also, with substrate processing system 1000, alignment measurement of the target wafer can be performed by measurement device $100_i$ of measurement system $500_1$ independently from the processing operation of the target wafer by exposure apparatus 200 including the simple EGA measurement and exposure described earlier, which allows an efficient processing that hardly lowers throughput of wafer processing by exposure apparatus 200. Also, as the entire substrate processing system 1000, by concurrently performing alignment and exposure processing by exposure apparatus 200 on a wafer in a certain lot on which measurement processing has been performed in advance with measurement device $100_i$ of measurement system $500_1$, measurement processing on a wafer in another lot with measurement device $100_i$ of measurement system $500_1$, and measurement processing by measurement system $500_2$ on a wafer further in another lot on which processing by the lithography system has been completed, it becomes possible to perform an efficient processing that hardly lowers throughput of wafer processing. Moreover, with measurement system $500_1$, concurrently with wafer alignment and exposure operation on wafers of a certain lot in exposure apparatus 200, full-shot EGA in which all shots serve as sample shots can be performed on wafers of another lot.

Also, with measurement device $100_i$ (i=1 to 3) of measurement system $500_1$, full-shot EGA in which all shots serve as sample shots is performed prior to (to be more precise, prior to resist coating on wafers) operations of wafer alignment and exposure by exposure apparatus 200 on wafers of the same lot that has undergone processing process in a pre-process of wafer processing (such as; etching, oxidation/diffusion, film deposition, ion implantation, and flattening (CMP)), and for each wafer that has undergone alignment measurement, alignment history data including wafer grid information (e.g., data on deformation components of the wafer grid) is acquired. The alignment history data for each wafer that has been acquired is stored in the internal storage device for each wafer by measurement system controller $530_1$. Accordingly, with exposure apparatus 200, wafer alignment and exposure can be performed on the target wafer, effectively using alignment history data for the target wafer including wafer grid information obtained using measurement system controller $530_1$. That is, in substrate processing system 1000 according to the embodiment, it can be said that alignment history data including wafer grid information (e.g., data on deformation components of the wafer grid) on the target wafer obtained in the pre-measurement processing in measurement device $100_i$ (i=1 to 3) of measurement system $500_1$ is substantially transferred (supplied) in a feed-forward manner to exposure apparatus 200.

Also, since coefficients of high-order components in the model formula obtained in the full-shot EGA in the pre-measurement processing in measurement device $100_i$ (i=1 to 3) can be employed in exposure apparatus 200 without any changes, exposure apparatus 200 only has to obtain coefficients of low-order components of the model formula described above by performing alignment measurement in which several shots serve as alignment shots, and by using this coefficients of low-order components and coefficients of the high-order components acquired in measurement device $100_i$, not only coefficients (undetermined coefficients) of model formula (1) but also coefficients (undetermined coefficients) of high-order component can also be determined, and then by using this model formula (1) whose undetermined coefficients are determined (that is, formula (3) described above) and design values (X, Y) of the arrangement of the plurality of shots on the wafer, correction amounts from design positions of each shot can be obtained, which allows correction amounts of high accuracy to be acquired similarly to the case when coefficients of low-order components and high-order components of model formula (1) are obtained in exposure apparatus 200. Then, based on this correction amounts and the design values of the arrangement of the plurality of shots on the wafer, the positioning target positions of each shot on exposure can be calculated. Accordingly, by controlling the position of wafer stage WST according to this target position, positioning of each shot can be performed with high accuracy with respect to the exposure position (projection position of the reticle pattern). This allows overlay accuracy of the image of the reticle pattern and the pattern formed in each shot area on the wafer to be improved, without any decrease in throughput of exposure apparatus 200.

Also, with measurement device $100_i$ (i=1 to 6) according to the embodiment, controller $60_i$ acquires position information on slider 10 with respect to surface plate 12 and relative position information between mark detection system MDS and surface plate 12 using the first position measurement system 30 and the second position measurement system 50, while controlling the movement of slider 10 with drive system 20, and also obtains position information on a plurality of marks formed on wafer W using mark detection system MDS. Accordingly, according to measurement device $100_i$, position information on the plurality of marks formed on wafer W can be obtained with high accuracy.

Also, with measurement device $100_i$ (i=1 to 6) according to the embodiment, controller $60_i$ constantly acquires measurement information (relative position information between surface plate 12 and mark detection system MDS) by the second position measurement system 50, and controls the position of surface plate 12 in directions of six degrees of freedom via (the actuators of) the three vibration isolators 14 real time, so that the positional relation between the detection center of mark detection system MDS and the detection point of the first position measurement system which detects position information on slider 10 in directions of six degrees of freedom with respect to surface plate 12 is maintained to a desired relation at a nm level. Also, controller $60_i$ acquires measurement information (position information on slider 10 with respect to surface plate 12) from the first position measurement system 30 and measurement information from the second position measurement system 50 (relative position information between surface plate 12 and mark detection system MDS) while controlling the movement of slider 10 by drive system 20, and obtains position information on the plurality of wafer marks, based on detection signals at the time when marks formed on wafer W are detected using mark detection system MDS, measurement information by the first position measurement system 30 obtained at the time when marks formed on wafer W are detected using mark detection system MDS, and measurement information by the second position measurement system 50 obtained at the time when marks formed on wafer W are detected using mark detection system MDS. Accordingly, with measurement device $100_i$, position information on the plurality of marks formed on wafer W can be obtained with high accuracy.

Note that, for example, in the case of performing position control of wafer W (wafer stage WST) on exposure based on the position information on the marks that are measured, without performing EGA operation using the position information on the marks that are measured, for example, measurement information by the second position measurement system 50 described above does not have to be used when calculating the position information on the marks. However, in this case, measurement information by the second position measurement system 50 obtained when detecting the marks formed on wafer W using mark detection system MDS may be offset and used to correct information used for moving wafer W, such as, for example, positioning target position of wafer W (wafer stage WST). Or, movement of reticle R (reticle stage RST) at the time of exposure may be controlled, taking into consideration the offset described above.

Also, with measurement device $100_i$ (i=1 to 6) according to the embodiment, since the first position measurement system 30 which measures position information in directions of six degrees of freedom of slider 10 on which wafer W is mounted and held at least detects wafer marks on wafer W with mark detection system MDS, measurement beam can continue to irradiate the measurement beam on grating RG1 from head section 32 in the range that slider 10 moves. Accordingly, the first position measurement system 30 can measure the position information continuously; in the entire range within the XY plane that slider 10 moves for mark detection. Accordingly, for example, in the manufacturing stage (including the start-up stage of the apparatus in a semiconductor manufacturing plant) of measurement device $100_i$, by performing origin setting of the orthogonal coordinate system (reference coordinate system) set by the measurement axes of the first position measurement system 30, it becomes possible to control an absolute position of slider 10, and as a consequence, an absolute position of the marks (not only search marks and wafer marks, but includes other marks, such as, overlay measurement marks (registration marks) and the like) formed on wafer W held on slider 10 obtained from the position information on slider 10 and the detection results of mark detection system MDS on the reference coordinate system.

As is obvious from the description so far, with substrate processing system 1000 according to the embodiment, since the system is equipped with measurement systems $500_1$ and $500_2$, even in the case exposure apparatus 200 only has the function of performing a simple EGA (e.g., acquiring position information on around 3 to 16 wafer marks using alignment system AS) to obtain linear components of the correction amounts of the position coordinates of the wafer within a predetermined amount of time (the amount of time allowed to maintain required high throughput), by using the low-order components of deformation of the wafer grid obtained performing the simple EGA measurement and the high-order components of deformation of the wafer grid obtained in advance by measurement system $500_1$ (or measurement system $500_2$), obtained, for example, by full-point EGA, deformation of the wafer grid can be obtained with high precision. Accordingly, by measurement system $500_1$ (or measurement system $500_2$), grid correction function of exposure apparatus 200 can be substantially improved. Accordingly, an exposure apparatus that does not have the latest grid correction function can perform exposure with respect to a wafer with high precision, with high throughput, or without reducing the throughput.

Note that with substrate processing system 1000 according to the embodiment described above, while the case has been described in which measurement device $100_i$, C/D 300, and exposure apparatus 200 are equipped with a bar code reader, instead of the bar code reader, the system may be equipped with a writing/reading device of a RFID tag which is a wireless IC tag. In such a case, by attaching the RFID tag to each wafer, measurement device $100_i$ writing the alignment history data described earlier into the RFID tag for each wafer using the writing/reading device, and another device such as, for example, exposure apparatus 200 reading the alignment history data from the RFID tag of a target wafer using the writing/reading device, feedforward transfer of the alignment history data for the target wafer described earlier can be easily realized.

Also, with substrate processing system 1000 according to the embodiment described above, the case has been described in which exposure apparatus 200 obtains the coefficients of the low-order components of the first-order or less of the model formula described above, and these coefficients of the low-order components and the coefficients of the high-order components of the second-order or more of the model formula described above acquired by measurement device $100_i$ are used. However, this usage is not limited, and for example, coefficients of components of the second-order or less of the model formula described above may be obtained from the detection results of the alignment marks in exposure apparatus 200, and these coefficients of the components of the second-order or less and coefficients of the high-order components of the third-order or more of the model formula described above acquired by measurement device $100_i$ may be used Or, for example, coefficients of components of the third-order or less of the model formula described above may be obtained from the detection results of the alignment marks in exposure apparatus 200, and these coefficients of the component of the third order or less and coefficients of the high-order components of the fourth-order or more of the model formula described above acquired by measurement device $100_i$ may be used That is, coefficients of components of the $(N-1)^{th}$ order (N is a whole number of two or more) or less of the model formula described above may be obtained from the detection results of the alignment marks in exposure apparatus 200, and these coefficients of the component of the $(N-1)^{th}$ order or less and coefficients of the high-order components of the $N^{th}$-order or more of the model formula described above acquired by measurement device $100_i$ may be used.

Note that in the embodiment described above, while measurement device $100_i$ (i=1 to 3) is to obtain coordinates $a_3$, $a_4$, $a_5$, ... and $b_3$, $b_4$, $b_5$ ..., of the high-order components of the second-order or more and coordinates $a_0$, $a_1$, $a_2$, $b_0$, $b_1$, $b_2$ of the low-order components of the first-order or less of the model formula (1) expressing a relation between design position coordinates X and Y of each shot in the wafer coordinate system (coincides with the reference coordinate system) and correction amounts (alignment correction components) dx and dy of the position coordinates of the shots, since the coefficients of the low-order components can be obtained in exposure apparatus 200, measurement device $100_i$ does not necessarily have to obtain the coefficients of the low-order components.

Note that in substrate processing system 1000 according to the embodiment, in the case measurement unit 40 of measurement device $100_i$ is equipped with the multi-point focal point detection system describe earlier, measurement device $100_i$ may perform a flatness measurement (also called focus mapping) along with the wafer alignment measurement. In this case, by using results of the flatness measurement, focus leveling control of wafer W at the time of exposure becomes possible without exposure apparatus 200 having to perform flatness measurement.

Note that in the embodiment above, the case has been described in which measurement devices $100_1$, $100_2$, and $100_3$ of measurement system $500_1$ having a similar structure and function concurrently perform alignment measurement processing of the same content on, for example, 25 pieces of wafers included in the same lot which are divided into three groups with the wafers in each group serving as measurement target wafers of measurement devices $100_1$, $100_2$, and $100_3$. However, measurement devices $100_1$, $100_2$, and $100_3$ may concurrently perform alignment measurement processing of the same content on wafers in different lots. For example, wafers in a lot to be exposed with the same exposure apparatus (e.g., exposure apparatus 200) next to the lot being measured by measurement device $100_1$ may be measured by measurement device $100_2$, and wafers in a lot to be exposed with the same exposure apparatus (e.g., exposure apparatus 200) next to the lot being measured by measurement device $100_2$ may be measured by measurement device $100_3$.

Note that in the embodiment above, the case has been described in which from the viewpoint of giving priority to throughput, the three measurement devices $100_1$, $100_2$, and $100_3$ of measurement system $500_1$ share the measurement processing for the 25 pieces of wafers in the same lot, and perform parallel processing. However, in the case measurement accuracy takes priority over throughput, the measurement processing described above is preferably performed by the same measurement device $100_i$ (i=one of 1 to 3) on the 25 pieces of wafers in the same lot. The reason is that there is an individual difference between the wafer holders even in the case measurement devices $100_1$, $100_2$, and $100_3$ are equipped with identical wafer holders, and a subtle difference occurs in the suction state, which may cause measurement errors in measurement devices $100_1$, $100_2$, and $100_3$. Taking into consideration such points, in the case the 25 pieces of wafers in the same lot are to be measured sharing the processing among three or two measurement devices $100_i$ of measurement system $500_1$, measurement errors caused by the individual difference among wafer holders may be obtained in advance, for example, by performing flatness measurement on the wafer holders using the same super flat wafer, and the like. Note that also in the case the plurality of wafers in the same lot are not divided among three or two measurement devices $100_i$ of measurement system $500_1$, measurement errors caused by the individual difference among wafer holders may be obtained in advance, using the super flat wafer. Also, measurement errors caused by the individual difference among wafer holders of measurement devices $100_i$ (i=4 to 6) may be obtained in advance, using the super flat wafer, regardless of sharing or not sharing the measurement of the plurality of wafers in the same lot among three or two measurement devices $100_i$ of measurement system $500_1$.

Also, the three measurement devices $100_4$ to $100_6$ of measurement system $500_2$ may be adjusted using, for example, a reference wafer, so that substantially the same measurement results can be obtained in the case of performing measurement processing, for example, on one wafer in one lot under the same conditions in each of the three measurement devices $100_4$ to $100_6$.

Also, whether to give priority to throughput or to measurement accuracy as is described above is preferably made selectable by the user of measurement system $500_1$. Also, when actually operating measurement system $500_1$, operation efficiency of each measurement device $100_i$ has to be taken into consideration, and measurement devices $100_1$, $100_2$, and $100_3$ are not necessarily constantly available (in a non-operating state) at the same time. Accordingly, only in the case two or more measurement devices $100_i$ are available at the same time, the wafers in the same lot may be apportioned to the two or more measurement devices $100_i$.

Also, for example, at least one of measurement devices $100_1$, $100_2$, and $100_3$ of measurement system $500_1$ may be a measurement device having a function different from other measurement devices. For example, one measurement device may be a measurement device equipped with a multi-point focal point detection system for performing unevenness (flatness) measurement of the wafer surface, or may be a wafer shape measurement apparatus. Also, at least one of measurement systems $500_1$ and $500_2$ may be equipped with two, four, or more than four measurement devices.

Also, in the embodiment above, the wafers in the same lot serve as measurement targets for measurement device $100_1$ of measurement system $500_1$, as well as measurement targets for measurement device $100_2$. However, the embodiment is not limited to this, and wafers of a certain lot (e.g., a lot to be sent to exposure apparatus 200) may serve as measurement targets for measurement device $100_1$, and wafers of another lot (e.g., a lot to be sent to an exposure apparatus other than exposure apparatus 200) may serve as measurement targets for measurement device $100_2$. In this case, upon setting a measurement condition (a first predetermined condition) suitable for measuring the marks on the wafers of the measurement target lot, measurement device $100_1$ may perform measurement of the measurement target marks, and upon setting a measurement condition (a second predetermined condition) suitable for measuring the marks on the wafers of the measurement target lot, measurement device $100_2$ may perform measurement of the measurement target marks.

Also, in the embodiment above, on overlay error measurement, the wafers in the same lot serve as measurement targets for measurement device $100_4$ of measurement system $500_2$, along with serving as measurement targets for measurement device $100_5$. However, the embodiment above is not limited to this, and wafers of a certain lot may serve as measurement targets for measurement device $100_4$, and wafers of another lot may serve as measurement targets for measurement device $100_5$. In this case, upon setting a measurement condition (a first predetermined condition) suitable for measuring the marks on the wafers of the measurement target lot, measurement device $100_4$ may perform measurement of the measurement target marks, and upon setting a measurement condition (a second predetermined condition) suitable for measuring the marks on the wafers of the measurement target lot, measurement device $100_5$ may perform measurement of the measurement target marks.

Note that in the case measurement device $500_6$ of measurement system $500_2$ has a structure and function similar to at least one of measurement devices $500_4$ and $500_5$, instead of one of, or both measurement devices $500_4$ and $500_5$, measurement device $500_6$ can be used.

Note that in the embodiment above, the case has been described in which substrate processing system 1000 is equipped with measurement system $500_1$ equipped with a plurality of, as an example, three measurement devices $100_1$ to $100_3$, and measurement system $500_2$ equipped with a plurality of, as an example, three measurement devices $100_4$ to $100_6$, to increase the throughput of the entire substrate processing system 1000 as much as possible. However, since measurement system $500_1$ and measurement system $500_2$ have a similar structure, in the embodiment above, the role to be played by measurement system $500_1$ can be played by measurement system $500_2$ instead, and the role to be played by measurement system $500_2$ can also be played by measurement system $500_1$ instead. Accordingly, if the throughput of the entire substrate processing system 1000 can be reduced to some extent, substrate processing system 1000 may be equipped only with one of measurement systems $500_1$ and $500_2$, such as, only with measurement system $500_1$. In this case, when measurement system $500_1$ is equipped with four or more measurement devices 100, two of the four may be made to play the roles of measurement devices $100_1$ and $100_2$ in the embodiment described earlier, and the remaining two may be made to play the roles of measurement devices $100_4$ and $100_5$.

Note that in the embodiment above, while an example of a case when performing overlay error measurement using measurement system $500_2$ was described, the embodiment is not limited to this, and measurement system $500_2$, other than overlay error measurement, may simply acquire alignment information (absolute position information, grid information and the like) of the wafer after exposure and development. Also, in measurement system $500_2$, wafers in the same lot may be apportioned to a plurality of measurement devices $100_i$ (i=at least two of 4, 5, and 6) similarly to the apportioning performed in measurement system $500_1$.

Also, in substrate processing system 1000 according to the embodiment described above, while measurement systems $500_1$ and $500_2$ are not connected in-line with both exposure apparatus 200 and C/D 300, one of, or both measurement systems $500_1$ and $500_2$ may be connected in-line with exposure apparatus 200 and C/D 300. For example, C/D 300 and measurement system $500_2$ may be connected in-line so that C/D 300 is arranged in between exposure apparatus 200 and measurement system $500_2$. Or, measurement system $500_2$ may be connected in-line with both exposure apparatus 200 and C/D 300 so that measurement system $500_2$ is arranged in between exposure apparatus 200 and C/D 300. In this case, measurement system $500_2$ does not have to be equipped with carrier system 510.

Also, in the embodiment above, one of measurement systems $500_1$ and $500_2$ does not have to be equipped with a plurality of measurement devices $100_1$. For example, measurement system $500_1$ may be equipped with a plurality of measurement devices $100_i$, and measurement system $500_2$ may be equipped with only one measurement device. In this case, measurement processing (at least one of measurement processing of wafer grid and overlay displacement measurement processing) described so far performed with the plurality of measurement devices on the wafers in the same lot should be performed, using measurement system $500_1$. Also, in this case, a typical overlay measuring instrument may be used instead of measurement system $500_2$.

Also, in the embodiment above, the case has been described in which exposure apparatus 200 effectively uses data on deformation components of the wafer grid and alignment history data file for each wafer acquired with measurement device $100_i$ (i=1 to 3 of measurement system $500_1$ as pre-measurement data. However, the embodiment is not limited to this, and based on data on deformation components of the wafer grid and alignment history data file for each wafer acquired with measurement device $100_i$, measurement system controller $530_i$ (or analysis device 3000) may obtain process control data and send this process control data in a feedback manner to host computer 2000. As the process control data obtained from the data acquired with measurement device $100_i$, control data and the like for film deposition device 2300 such as a CVD device, or CMP device 2200 can be representatively given. Note that in the embodiment above, measurement device $100_i$ (i=one of 1 to 3), from data of measurement results obtained by signal processor 49 that processes detection signals of mark detection system MDS equipped in the measurement device, is to select only measurement results of wafer marks whose waveforms of detection signals obtained as detection results of mark detection system MDS are favorable, to controller $60_i$. In other words, signal processor 49 also acquires measurement results of wafer marks whose waveforms of detection signals are not favorable. Accordingly, measurement system controller $530_i$ (or analysis device 3000) may obtain data of measurement results for all wafer marks including measurement results of wafer marks whose waveforms of detection signals are not favorable from signal processor 49, and based on the data, may obtain the process control data. Or, signal processor 49 may send data of measurement results for all wafer marks to controller $60_i$, and controller $60_i$ may perform judgment, of whether the detection signals obtained as measurement results by mark detection system MDS are favorable or not. In this case, controller $60_i$ may send data of measurement results for all wafer marks including the measurement results for wafer marks that were not used for EGA operation to measurement system controller $530_1$ (or analysis device 3000), and based on the data sent, measurement system controller $530_1$ (or analysis device 3000) may obtain the process control data.

Note that in the embodiment above, while the subject is to be a 300 mm wafer, the embodiment is not limited to this, and the wafer may be a 450 mm wafer that has a diameter of 450 mm, or a 200 mm wafer that has a diameter of 200 mm. Since wafer alignment can be performed by measurement device $100_1$ separately from exposure apparatus 200, for example, full-point EGA measurement and the like becomes possible even on a 450 mm wafer or a 200 nm wafer, without decreasing throughput in exposure processing. Note that in at least one of measurement system $500_1$ and measurement system $500_2$, diameters of the wafers measured may be different in one measurement device and other measurement devices. For example, measurement device $100_1$ of measurement system $500_1$ may measure a 300 mm wafer, and measurement device $100_2$ may measure a 450 nm wafer.

Note that in measurement device $100_i$ according to the embodiment described above, while the case has been describe where the X-axis direction and the Y-axis direction serve as periodic directions in each of gratings RG1, RG2a, and RG2b, the description is not limited to this, and in the grating section (two-dimensional grating) that the first position measurement system 30 and the second position measurement system 50 are each equipped with, the periodic direction only has to be two directions that intersect each other in the XY plane.

Also, the structure of measurement device $100_i$ described in the embodiment above is a mere example. For example, the measurement device only has to be structured so that the device has a movable stage (slider 10) with respect to base member (surface plate 12) and position information on the plurality of marks on the substrate (wafer) held on the stage can be measured. Accordingly, the measurement device does not necessarily have to be equipped with, for example, the first position measurement system 30 and the second position measurement system 50.

Also, it is a matter of course that the structure of head section 32 of the first position measurement system 30 described in the embodiment above and the arrangement of the detection points are mere examples. For example, the position of the detection points of mark detection system MDS and the detection center of head section 32 does not have to match in at least one of the X-axis direction and the Y-axis direction Or, the arrangement of the head section of the first position measurement system 30 and grating RG1 (grating section) may be opposite. That is, the head section may be provided at the head section, and the grating section may be provided at surface plate 12. Also, the first position measurement system 30 does not necessarily have to be equipped with encoder system 33 and laser interferometer system 35, and the first position measurement system 35 may be structured only by the encoder system. The first position measurement system may be structured by an encoder system which measures position information on slider 10 in directions of six degrees of freedom with respect to surface plate 12 by irradiating a beam on grating RG1 of slider 10 from the head section and receiving the return beam (diffraction beam) from the grating. In this case, the structure of the head section does not matter in particular. The first position measurement system 30 does not necessarily have to be capable of measuring position information on slider 10 in directions of six degrees of freedom with respect to surface plate 12, and for example, and may only be capable of measuring position information in the X, the Y, and the θz directions. Also, the first position measurement system which measures the position information on slider 10 with respect to surface plate 12 may be arranged in between surface plate 12 and slider 10. Also, the first measurement system may be structured by other measurement devices such as an interferometer system that measures position information on slider 10 in directions of six degrees of freedom with respect to surface plate 12, or in directions of three degrees of freedom within a horizontal plane.

Similarly, the structure of the second position measurement system 50 described in the embodiment above is a mere example. For example, head sections 52A and 52B may be fixed to the surface plate 12 side, and scales 54A and 54B may be provided integrally with mark detection system MDS. Also, the second position measurement system 50 may be equipped with only one, or with three or more head sections. In any case, it is desirable for the second position measurement system 50 to be able to measure the positional relation between surface plate 12 and mark detection system MDS in directions of six degrees of freedom. However, the second position measurement system 50 does not necessarily have to be capable of measuring the positional relation in all directions of the directions of six degrees of freedom.

Note that in the embodiment above, the case has been described in which slider 10 is supported by levitation on surface plate 12 by the plurality of air bearings, and drive system 20 that drives slider 10 with respect to surface plate 12 in a non-contact manner is structured, including the first driver 20A that drives slider 10 in the X-axis direction and the second driver 20B that drives slider 10 integrally with the first driver 20A in the Y-axis direction. However, the description is not limited to this, and drive system 20 may employ a drive system having a structure in which slider 10 is moved in directions of six degrees of freedom on surface plate 12. Such a drive system may be structured as an example, using a magnetic levitation type planar motor. In such a case, air bearing 18 will not be necessary. Note that measurement device $100_i$ may be equipped with a drive system for moving surface plate 12 separate from vibration isolators 14.

Also, in the embodiment described above, while measurement system 500 is equipped with the EFEM system as carrier system 510, instead of the EFEM system, a carrier storage device may be installed that can store a plurality of (e.g., three) carriers (such as FOUP) along the Y-axis direction. In this case, measurement system 500 may be equipped with a plurality of loading ports provided adjacent to each of a plurality of measurement devices $100_i$, and a carrier carrying device which performs delivery of a carrier (such as FOUP) in between the carrier storage device and a mounting section of the plurality of loading ports.

Note that in the embodiment described above, while the case is described in which C/D 300 is in-line connected to exposure apparatus 200, instead of C/D 300, a coating apparatus (coater) that coats a sensitive agent (resist) on a substrate (wafer) may be in-line connected to exposure apparatus 200. In this case, the wafer after exposure is to be carried into a developing apparatus (developer) that is not in-line connected to the exposure apparatus. Or, instead of C/D 300, the developing apparatus (developer) that develops the substrate (wafer) that has been exposed may be in-line connected to exposure apparatus 200. In this case, a wafer on which resist is coated in advance at a different place is to be carried into the exposure apparatus.

In the embodiment described above, while the case has been described in which the exposure apparatus is a scanning stepper, the description is not limited to this, and the exposure apparatus may be a static type exposure apparatus, or may be a reduction projection exposure apparatus of a step-and-stitch method that synthesizes shot areas. Furthermore, the embodiment described above can also be applied to a multi-stage type exposure apparatus that is equipped with a plurality of wafer stages as is disclosed in, for example, U.S. Pat. Nos. 6,590,634, 5,969,441, 6,208,407, and the like. Also, the exposure apparatus is not limited to a dry type exposure apparatus previously described that performs exposure of wafer w without going through liquid (water), and the exposure apparatus may be a liquid immersion type exposure apparatus that exposes a substrate via liquid as is disclosed in, for example, European Patent Application Publication No. 1420298, International Publication WO 2004/055803, International Publication WO 2004/057590, U.S. Patent Application Publication No. 2006/0231206, U.S. Patent Application Publication No. 2005/0280791, U.S. Pat. No. 6,952,253 and the like. Also, the exposure apparatus is not limited to an exposure apparatus used for manufacturing semiconductor devices, and for example, may be an exposure apparatus for liquid crystals used for transferring a liquid crystal display device pattern onto a square glass plate.

Semiconductor devises are manufactured through exposing a sensitive object using a reticle (mask) on which a pattern is formed with an exposure apparatus that structures a part of the substrate processing system according to each embodiment described above, and through a lithography step in which the sensitive object that has been exposed is developed. In this case, highly integrated devices can be manufactured at high yield.

Note that as is shown in FIG. 14, other than the lithography step, the manufacturing process of semiconductor devices may include steps such as; a step for performing function/performance design of a device, a step for making a reticle (mask) based on this design step, a device assembly step (including a dicing process, a bonding process, and a package process), and an inspection step.

Note that the disclosures of all publications, International Publications, U.S. Patent Application Publications, and U.S. Patents related to exposure apparatuses and the like referred to in the embodiment described above are incorporated herein by reference as a part of the present specification.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A measurement system used in a manufacturing line for micro-devices, the measurement system comprising:
a measurement device which is configured to perform measurement processing on a substrate; and
a control system which is connected to the measurement device, and which is configured to communicate with and to control the measurement device, wherein
the measurement device acquires position information on a plurality of marks formed on the substrate, and
the control system obtains a process control data based on a data provided from the measurement device, the data is obtained during the measurement processing and the data includes deformation components of arrangement information on a plurality of divided areas formed on the substrate along with the marks.

2. The measurement system according to claim 1, wherein the data includes a data of history of the measurement processing performed by the measurement device.

3. The measurement system according to claim 1, wherein the measurement device detects a detection signal of the plurality of marks formed on the substrate for acquiring the position information of the marks on the substrate, and
the data includes the detection signal of the plurality of marks corresponding to each of the position information of the plurality of marks.

4. A measurement system used in a manufacturing line for micro-devices, the measurement system comprising:
a measurement device which is configured to perform measurement processing on a substrate; and
a control system which is connected to the measurement device, and which is configured to communicate with and to control the measurement device, wherein
the measurement device detects a detection signal of a plurality of marks formed on the substrate for acquiring position information of the marks on the substrate, and
the control system obtains a process control data based on a data provided from the measurement device, the data is obtained during the measurement processing, and the data includes at least one of deformation components of arrangement information on a plurality of divided areas formed on the substrate along with the marks, a data of history of the measurement processing performed by the measurement device, and the detection signal of the plurality of marks corresponding to each of the position information of the plurality of marks.

5. The measurement system according to claim 1, wherein the control system outputs the process control data which is utilized on a processing device in a feedback manner.

6. The measurement system according to claim 5, wherein the processing device includes at least one of a film deposition device including a CVD device, a CMP device, and an exposure apparatus.

7. The measurement system according to claim 5, wherein the processing device is an exposure apparatus, and the process control data is fed-back to the exposure apparatus which formed the plurality of marks on the substrate.

8. A substrate processing system comprising:
the measurement system according to claim 1; and
an exposure apparatus that has a substrate stage on which the substrate that has completed measurement of position information of the plurality of marks by the measurement device of the measurement system is mounted, and to the substrate mounted on the substrate stage, performs alignment measurement in which position information of a part of marks selected from the plurality of marks on the substrate is acquired and exposure in which the substrate is exposed with an energy beam.

9. A substrate processing system comprising:
the measurement system according to claim 1; and
an exposure apparatus that has a substrate stage on which the substrate that has completed measurement of position information of the plurality of marks by the measurement device of the measurement system is mounted, and to the substrate mounted on the substrate stage, performs alignment measurement in which position information on a part of marks selected from the plurality of marks on the substrate is acquired and exposure in which the substrate is exposed with an energy beam, wherein acquiring position information on the plurality of marks performed in the measurement device is performed on the substrate that has gone through at least one processing of: cleaning, oxidation/diffusion, film deposition, etching, ion implantation, and CMP and is before coating of a sensitive agent for a next exposure, and the process control data is output from the control system that the measurement system is equipped with to at least one of processing devices which performed film deposition, CMP, and the previous exposure.

10. A device manufacturing method comprising:
exposing a substrate using an exposure apparatus that is a part of the substrate processing system according to claim 8, and
developing the substrate that has been exposed.

11. A device manufacturing method comprising:
exposing a substrate using an exposure apparatus that is a part of the substrate processing system according to claim 9, and
developing the substrate that has been exposed.

12. A measurement system used in a manufacturing line for micro-devices, the measurement system comprising:
a plurality of measurement devices in which each device performs measurement processing on a substrate; and
a control system which is connected to the measurement devices, and which is configured to communicate with and to control the measurement devices, wherein
the plurality of measurement devices includes a first measurement device and a second measurement device, the first measurement device acquires a first position information on a first plurality of marks formed on the substrate, and the second measurement device acquires a second position information on a second plurality of marks formed on the substrate, and the first position information on the first plurality of marks formed on the substrate is acquired under a setting of a first predetermined condition in the first measurement device, and the second position information on the second plurality of marks formed on the substrate is acquired under a setting of a second predetermined condition different from the first predetermined condition in the second measurement device, and
the control system obtains a process control data based on a data provided from the measurement devices, the data is obtained during the measurement processing.

13. The measurement system according to claim 12, wherein
the first measurement device acquires the first position information of the first plurality of marks formed on an $m^{th}$ layer (m is an integral number of 1 or more) of the substrate, and the second measurement device acquires the second position information of the second plurality of marks formed on an $n^{th}$ layer (n is an integral number of 1 or more and different from m) of the substrate, and
the control system obtains first process control data based on a data provided from the first measurement device and second process control data based on a data provided from the second measurement device.

14. The measurement system according to claim 13, wherein
the control system outputs the first process control data and the second process control data which is utilized by a processing device in a feedback manner, and the first process control data is fed-back to the processing device which processed the $m^{th}$ layer on the substrate and the second process control data is fed-back to the processing device which processed the $n^{th}$ layer on the substrate.

15. The measurement system according to claim 14, wherein
the processing device includes at least one of a film deposition device including a CVD device, a CMP device, and an exposure apparatus.

16. The measurement system according to claim 4, wherein
the control system outputs the process control data which is utilized on a processing device in a feedback manner.

17. The measurement system according to claim 16, wherein
the processing device includes at least one of a film deposition device including a CVD device, a CMP device, and an exposure apparatus.

18. The measurement system according to claim 16, wherein
the processing device is an exposure apparatus, and the process control data is fed-back to the exposure apparatus which formed the plurality of marks on the substrate.

19. A substrate processing system comprising:
the measurement system according to claim 4; and
an exposure apparatus that has a substrate stage on which the substrate that has completed measurement of position information of the plurality of marks by the measurement device of the measurement system is mounted, and to the substrate mounted on the substrate stage, performs alignment measurement in which position information of a part of marks selected from the plurality of marks on the substrate is acquired and exposure in which the substrate is exposed with an energy beam.

20. A substrate processing system comprising:
the measurement system according to claim 4; and
an exposure apparatus that has a substrate stage on which the substrate that has completed measurement of position information of the plurality of marks by the measurement device of the measurement system is mounted, and to the substrate mounted on the substrate stage, performs alignment measurement in which position information on a part of marks selected from the plurality of marks on the substrate is acquired and exposure in which the substrate is exposed with an energy beam, wherein
acquiring position information on the plurality of marks performed in the measurement device is performed on the substrate that has gone through at least one processing of: cleaning, oxidation/diffusion, film deposition, etching, ion implantation, and CMP and is before coating of a sensitive agent for a next exposure, and
the process control data is output from the control system that the measurement system is equipped with to at least one of processing devices which performed film deposition, CMP, and the previous exposure.

21. A device manufacturing method comprising:
exposing a substrate using an exposure apparatus that is a part of the substrate processing system according to claim 19, and
developing the substrate that has been exposed.

22. A device manufacturing method comprising:
exposing a substrate using an exposure apparatus that is a part of the substrate processing system according to claim 20, and
developing the substrate that has been exposed.

* * * * *